United States Patent [19]
Kaminaga et al.

[11] Patent Number: 5,614,848
[45] Date of Patent: Mar. 25, 1997

[54] HIGH-SPEED SEMICONDUCTOR INTEGRATED CIRCUIT DEVICE COMPOSED OF CMOS AND BIPOLAR TRANSISTORS

[75] Inventors: Yasuo Kaminaga; Yoji Nishio; Akihiro Tamba, all of Hitachi; Yutaka Kobayashi, Katsuta; Masataka Minami, Hachiohji, all of Japan

[73] Assignee: Hitachi, Ltd., Tokyo, Japan

[21] Appl. No.: 482,570

[22] Filed: Jun. 7, 1995

Related U.S. Application Data

[62] Division of Ser. No. 992,448, Dec. 17, 1992.

[30] Foreign Application Priority Data

| Dec. 19, 1991 | [JP] | Japan | 3-336924 |
| Jan. 30, 1992 | [JP] | Japan | 4-15011 |
| Mar. 18, 1992 | [JP] | Japan | 4-62602 |
| Mar. 19, 1992 | [JP] | Japan | 4-63591 |
| Mar. 19, 1992 | [JP] | Japan | 4-64251 |

[51] Int. Cl.⁶ ................... H03K 19/01
[52] U.S. Cl. ................... 326/110; 326/18
[58] Field of Search ................... 326/21, 18, 89, 326/110

[56] References Cited

U.S. PATENT DOCUMENTS

| 4,103,188 | 7/1978 | Morton | 326/84 X |
| 4,419,593 | 12/1983 | Butler et al. | 326/21 X |
| 4,477,741 | 10/1984 | Moser, Jr. | 307/437 |
| 4,626,709 | 12/1986 | Mazumder et al. | 307/246 X |
| 4,723,082 | 2/1988 | Asano et al. | 326/81 |
| 4,839,537 | 6/1989 | Ueno | 307/446 |
| 4,948,994 | 8/1990 | Akioka et al. | 307/246 X |
| 5,001,365 | 3/1991 | Murabayashi et al. | 307/446 |
| 5,059,821 | 10/1991 | Murabayashi et al. | 307/360 |
| 5,059,827 | 10/1991 | Phan et al. | 307/446 X |
| 5,089,724 | 2/1992 | Chuang et al. | 307/246 X |
| 5,101,120 | 3/1992 | Bonges, III et al. | 307/300 X |
| 5,103,121 | 4/1992 | Wendell et al. | 307/475 |
| 5,118,972 | 6/1992 | Wissel et al. | 307/300 X |
| 5,124,581 | 6/1992 | Umeki | 326/110 |
| 5,146,118 | 9/1992 | Nakamura et al. | 307/443 X |
| 5,198,704 | 3/1993 | Nitta et al. | 307/443 X |
| 5,206,546 | 4/1993 | Usami | 326/110 |
| 5,216,298 | 6/1993 | Ohba et al. | 307/446 X |

*Primary Examiner*—David R. Hudspeth
*Attorney, Agent, or Firm*—Antonelli, Terry, Stout & Kraus, LLP

[57] ABSTRACT

The semiconductor IC device has a circuit arrangement in which one or more of the circuits, such as on a single substrate, include a totem-pole series connection of bipolar transistors which are driven by arrangements of complementary MOS circuits in a manner such that high-speed logic/switching operation is effected. Arrangements of circuits can also be effected in which the totem-pole series connection is constituted by a PNP transistor, on the power source terminal side, and an NPN or NMOS transistor on the ground or pull-down side thereof. With such configurations, the output signal swing at low operating voltages can be maximized while achieving the same with reduced propagation delay time and low power consumption. The device can also be implemented by circuitry employing capacitance bootstrapping effect as well as IIL (I²L) design schemes.

2 Claims, 56 Drawing Sheets

HIGH-SPEED SEMICONDUCTOR INTEGRATED CIRCUIT DEVICE COMPOSED OF CMOS AND BIPOLAR TRANSISTORS

This is a divisional of application Ser. No. 07/992,448, filed Dec. 17, 1992.

BACKGROUND OF THE INVENTION

1. Field of the Invention

The present invention relates to a semiconductor integrated circuit device, and more specifically, to a semiconductor integrated circuit device composed of CMOS transistors and bipolar transistors.

2. Description of the Related Art (1) FIG. 45 shows an example of an integrated injection logic (IIL) circuit, such as, disclosed in the text "Integrated Circuit Engineering" (2), page 88, published by Corona Co., Ltd. in 1979. The IIL circuit is composed of a lateral PNP transistor Q3, and NPN transistors Q1 and Q2 each having an emitter and collector disposed at reverse positions in the structure thereof (hereinafter, referred to be reversely connected) as compared with those of a usual vertical type NPN transistor. The emitter of the PNP transistor Q3 is referred to as an injector, and when a positive voltage is applied to the injector, an injection current flows. When a terminal X1 is opened (turned OFF), the injection current serves as a base current of the reversely connected NPN transistor Q1 and thus the NPN transistor Q1 is turned ON. Therefore, a terminal Y1 is at a potential $V_{CE}$ (sat) and goes to a low level.

Conversely, when the terminal X1 is short circuited to a ground potential (turned ON), the injection current serves as the collector current of a transistor at a previous stage and the NPN transistor Q1 is turned OFF. The collector of the NPN transistor Q1 is connected to the base of a transistor at a next stage and the transistor at the next stage is turned ON, and thus the terminal Y1 goes to a potential $V_{be}$ or a high level. When the NPN transistor Q2 is turned ON, however, the terminal Y1 is at the potential $V_{CE}$ (sat) or at the low level.

On the other hand, when the injection current flows and a terminal X2 is opened (turned OFF), the injection current serves as the base current of the reversely connected NPN transistor Q2 and the NPN transistor Q2 is turned ON. Therefore, the terminals Y1 and Y2 goes to the potential $V_{CE}$ (sat) or the low level.

Conversely, when the terminal X2 is short circuited to the ground potential (turned ON), the injection current serves as the collector current of the transistor at the previous stage and the NPN transistor Q2 is turned OFF. The collector of the NPN transistor Q2 is connected to the base of the transistor at the next stage and the transistor at the next stage is turned ON, and thus the Terminals Y2 and Y1 go to a base to emitter potential $V_{be}$ or the high level. When the NPN transistor Q1 is turned ON, however, the terminal Y1 goes to the collector voltage $V_{CE}$ (sat) or the low level. That is, the potential at the terminal Y1 is obtained by ANDing the inverted potential at the terminal X1 and the inverted potential at the terminal X2, and the potential at the terminal Y2 is the inverted potential of the potential at the terminal X2.

Further, FIG. 46 shows an IIL circuit as a conventionally proposed logic circuit (e.g., inverter circuit) suitable for a low voltage. In FIG. 46, a power supply voltage (hereinafter, referred to as $V_{cc}$) is sufficient to be a built-in potential (hereinafter, referred to as $V_{BE}$) between the emitter and the base of a PNP bipolar transistor 1, i.e., about 0.8 V and thus this circuit is very suitable for a low voltage.

(2) FIG. 47 shows an example of the inverter circuit of a non-threshold logic (NTL) circuit, which is composed of an initial stage including resistors R1, R2, a capacitor C1 and NPN transistor Q1 and of an emitter follower stage including an NPN transistor Q2 and a resistor R3. A power supply terminal 282 has a potential of −2 V. When an input 280 is at a high level (−0.8 V), the NPN transistor Q1 is turned ON, a current flows from a ground potential to the power supply terminal through the resistor R2, NPN transistor Q1 and resistor R1. As a result, the collector potential of the NPN transistor Q1 drops. The values of the resistors R1 and R2 are usually set so that a potential drop is about 0.8 V. The potential dropped from the collector potential by the potential between the base and the emitter of the NPN transistor Q2 is the potential of an output 281. The potential of the output 281 is about −1.6 V which is at a low level. On the other hand, when the input 280 is at the low level (−1.6 V), the NPN transistor Q1 is turned OFF and the collector potential of the NPN transistor Q1 is risen substantially to the ground potential. The potential dropped from the collector potential by the voltage $V_{BE}$ between the base and the emitter of the NPN transistor Q2 is the potential of the output 281. The potential of the output 281 is about −0.8 V which is at the high level.

(3) FIG. 48 shows an example of the inverter circuit of an emitter-coupled logic (ECL) circuit. In the figure, the inverter circuit is composed of a differential amplifier including resistors R1 and R2, NPN transistors Q1 and Q2 and a constant current source 294 and of an emitter follower unit including an NPN transistor Q3 and a resistor R3. The potentials of power supply terminals 292 and 293 are −3 V and −2 V, respectively. A reference potential $V_{BB}$ which is an intermediate potential (−1.2 V) between a high level (−0.8 V) and a low level (−1.6 V) is applied to the base of the NPN transistor Q2. When an input 290 is at the high level (−0.8 V), the NPN transistor Q1 is turned ON and a current flows from a ground potential to the power supply terminal 292 through the resistor R1, NPN transistor Q1 and constant current source 294. As a result, the collector potential of the NPN transistor Q1 is dropped. The resistance value of the resistor R1 and the current value of the constant current source 294 are usually set so that a potential drop is about 0.8 V. The potential dropped from the collector potential by the voltage $V_{BE}$ between the base and the emitter of the NPN transistor Q3 is the potential of an output 291 (low level, −1.6 V).

On the other hand, when the input 290 is at the low level (−1.6 V), the NPN transistor Q1 is turned OFF and the collector potential of the NPN transistor Q1 is risen substantially to the ground potential. The potential dropped from the collector potential by the voltage $V_{be}$ between the base and the emitter of the NPN transistor Q3 is the potential of the output terminal 291. The potential of the output terminal 291 is about −0.8 V which is at the high level.

(4) FIG. 49 shows an inverter circuit as a conventional BiCMOS composite circuit (Japanese Patent Examined Publication Sho 50-40977). The inverter circuit is composed of an NPN transistor 300 and NMOS transistor 301 constituting an output stage, and a PMOS transistor 302 and NMOS transistor 303 controlling the NPN transistor 300 and taking an inverted logic. When the potential at an input terminal 305 is at a low level, the PMOS transistor 302 is turned ON, the NMOS transistor 303 is turned OFF, the NPN transistor 300 is turned ON, and the NMOS transistor 301 is turned OFF. Therefore, the potential of an output terminal 306 is goes to a high level. The potential level at this time is obtained by subtracting the voltage $V_{BE}$ between the base and emitter of the NPN transistor 300 from the power supply voltage $V_{cc}$ at a power supply terminal 304.

On the other hand, when the potential at the input terminal 305 is at the high level, the PMOS transistor 302 is turned OFF, the NMOS transistor 303 is turned ON, the NPN transistor 300 is turned OFF, and the NMOS transistor 301 is turned ON. Therefore, the potential of the output terminal 306 goes to the low level which is a ground potential.

(5) FIG. 50 shows an example of an inverter circuit as a conventional BiCMOS composite circuit (Japanese Patent Unexamined Publication Sho 62-281614). In the figure, the inverter circuit is composed of NPN transistors 310 and 311 constituting a totem-pole output stage; a PMOS transistor 312 and NMOS transistor 313 controlling the NPN transistor 310 and the like and taking an inverted logic; a PMOS transistor 314 having a source connected to a power supply terminal 318, a drain connected to the source of a PMOS transistor 315, and a gate connected to the base of the NPN transistor 310, respectively; the PMOS transistor 315 having a gate connected to the output terminal of a CMOS inverter 317 the input of which receiving a signal from an output terminal 320, and a drain connected to the base of the NPN transistor 311, respectively; and an NMOS transistor 316 having a drain connected to the base of the NPN transistor 311, a gate connected to the base of the NPN transistor 310, and a source connected to a ground potential.

In the above arrangement, when the potential of an input terminal 319 is at a low level, the PMOS transistor 312 is turned ON, the NMOS transistor 313 is turned OFF, the NPN transistor 310 is turned ON, the PMOS transistor 314 is turned OFF, the NMOS transistor 316 is turned ON, and the NPN transistor 311 is turned OFF. Therefore, the potential of the output terminal 320 goes to a high level. The potential of the output terminal 320 at this time is obtained by subtracting the voltage $V_{BE}$ between the base and the emitter of the NPN transistor 310 from the power supply voltage $V_{cc}$ level of the power supply terminal 318.

On the other hand, when the potential of the input terminal 319 goes to the high level, the PMOS transistor 312 is turned OFF, the NMOS transistor 313 is turned ON, and the NPN transistor 310 is turned OFF. Further, since the NMOS transistor 316 is turned OFF, the PMOS transistor 314 is turned ON, and the PMOS transistor 315 is turned ON, a base current is supplied to the NPN transistor 311 to thereby turn ON the NPN transistor 311. Therefore, the potential of the output terminal 320 goes to a low level. When the output goes to the low level, the PMOS transistor 315 is turned OFF, and thus the excessive saturation of the NPN transistor 311 can be prevented without flowing an excessive current to the base of thereof. The low level at this time is substantially equal to a ground potential.

(6) Although a BiCMOS logic gate is mixed with a CMOS logic gate in a conventional BiCMOS composite LSI, when an NTL logic gate is tried to be mixed therewith, a level conversion circuit is necessary between the NTL logic gate and the BiCMOS logic gate or between the NTL logic gate and the CMOS logic gate., (7) An ECL circuit composed of bipolar transistors, a BiCMOS circuit composed by combining PMOS transistors and NMOS transistors and bipolar transistors and a CMOS circuit composed of PMOS transistors and NMOS transistors are conventionally used as a logic gate circuit. Respective circuit systems are applied to these logic gate circuits in correspondence with the performances such as high speed property, low power consumption property, high integration property and the like.

On the other hand, recently, as semiconductor devices are miniaturized, a requirement for lowering a power supply voltage supplied to an integrated circuit, on which the miniaturized semiconductor devices are mounted, is rapidly increased. When this low power supply voltage is taken into consideration, a CMOS circuit is superior to the circuit composed of bipolar transistors in a low power operating property.

FIG. 57 shows an inverter circuit using a CMOS circuit, wherein the CMOS inverter circuit is arranged such that a pair of a PMOS transistor 563 and NMOS transistor 564 are connected in series to perform a complementary operation.

(8) Recently, as semiconductor integrated devices are miniaturized, a requirement for lowering a power supply voltage supplied to the integrated circuits is increased. A BiMOS circuit composed of a bipolar transistor and MOS transistor in combination to increase an operation speed and lower a power consumption begins to cope with this requirement. When this low voltage operation is taken into consideration, it is important in the BiCMOS circuit that an output signal is fully swung between a ground level and a power supply voltage level in order to effectively apply a drive voltage to a next stage.

This is because when the transistor at the next stage is composed of a MOS transistor, it cannot be driven unless a voltage equal to or higher than a threshold voltage $V_{th}$ is applied between the gate and the source thereof, and when the transistor at the next stage is composed of a bipolar transistor, it cannot be driven unless a voltage equal to or higher than a voltage $V_{BE}$ between a base and an emitter is applied between the emitter and the base thereof, and an input voltage to the next stage, which is at a power supply potential—a low level (hereinafter, referred to as "L")—and at a high level (hereinafter, referred to as "H")—a fixed poten, must be secured in a value as large as possible.

FIG. 76 shows an example of an integrated circuit device in which the low power operation is partially taken into consideration (Japanese Patent Unexamined Publication Sho 62-281614). FIG. 76 shows the arrangement of an inverter circuit. The operation of the inverter circuit will be simply described. When an input 811 is at an "H" level, an NMOS transistor 815 is turned ON, the drain of the NMOS 815 goes to an "L" level, and a PMOS transistor 841 is turned ON. At this time, an "H" level signal before the potential of an output terminal 813 shifts to the "L" level is inverted by a CMOS inverter 844 composed of a PMOS transistor 821 and NMOS transistor 822, and thus a PMOS transistor 842 is turned ON. As a result, the potential of a power supply terminal 810 is applied to the base of an NPN transistor 824 through the PMOS transistors 841 and 842, and thus the potential of the output terminal 813 shifts to the "L" level.

The potential of the output terminal 813 completely drops to the same potential as that of a fixed potential terminal (ground terminal) because the NPN transistor 824 has a base potential higher than a collector potential and is saturated in a forward bias and thus a voltage $V_{BE}$ between a base and emitter is extinguished. In this case, as the NPN transistor 824 is more deeply saturated, a longer time is required for the potential of the output terminal 813 to be shifted and thus a high speed operation is disturbed thereby. To prevent this phenomenon, the gate of the PMOS transistor 842 is turned OFF in such a manner that a signal which is at the "L" level at the output terminal 813 is inverted by the CMOS inverter 844 composed of the PMOS transistor 821 and NMOS transistor 822 to thereby turn OFF the gate of the PMOS ttt 842, whereby a power supply terminal voltage to the gate of the NPN transistor 824 is shut off.

On the other hand, when the potential of the input terminal 811 is at the "L" level, the PMOS transistor 814 is turned ON and the NMOS transistor 815 is turned OFF, and thus the drain of the PMOS transistor 814 goes to the "H" level to cause the NMOS transistor 843 to be turned ON and the NPN transistor 824 to be turned OFF as well as the NPN transistor 823 to be turned ON. As a result, the potential of the output terminal 813 goes to the "H" level. The potential of the output terminal 813 at this time is lower than the power supply voltage by the voltage $V_{BE}$ between the base and the emitter of the NPN transistor 823, because the NPN transistor 823 has the same base potential as that of the power supply terminal 810 since the PMOS transistor 814 is turned ON.

As described above, the circuit shown in FIG. 76 is arranged such that when the output terminal 813 is at the "L" level, the output terminal 813 can be lowered to the fixed terminal potential (ground level) and thus the circuit can be said to aim at operation at a lower voltage.

(9) Conventionally, there is known a BiCMOS circuit composed by the combination of a bipolar transistor and MOS transistor as the inverter circuit of a logic circuit. According to this circuit, a speed can be increased by the bipolar transistor and a power consumption can be reduced by the MOS transistor. Japanese Patent Unexamined Publication No. Sho 57-212827, for example, discloses this kind of an inverter circuit.

On the other hand, as a semiconductor integrated circuit device is miniaturized, it is recently required to drop a power supply voltage to be supplied to an integrated circuit. For the operation of a circuit at a lower power supply voltage, it is important in the BiCMOS circuit that an output signal is fully swung to effectively apply a drive voltage to a logic circuit of a next stage, i.e. to swing a signal in a full power supply range. This is because that when a signal is output to the logic circuit of the next stage, if the logic circuit of the next stage is composed of a MOS transistor, the logic circuit cannot be operated unless a voltage equal to or higher that a voltage between a gate and a source is applied, and if it is composed of a bipolar transistor, the logic circuit cannot be operated unless a voltage equal to or higher that a voltage between a base and an emitter is applied. Thus, even if the bipolar transistor is simply turned ON and OFF, an output voltage is dropped by the voltage between the base and the emitter and a fully swung signal cannot be output. As a result, the transistor must be operated to be temporarily saturated to fully swing the signal.

(1) First, the above prior art has a problem that a gate circuit has a slow speed, because transistors Q1 and, in FIG. 45, are each composed of an NPN transistor having a collector and emitter formed reversely as compared with a usual vertical type transistor and thus a gate circuit has a slow speed. Next, the prior art has a problem that an injection current value is not effectively used at all times. That is, when the reverse type NPN transistor is turned ON to drop a collector potential and even after the collector potential has been dropped, the injection potential flows as a collector potential. At this timing, the injection potential is not necessary. Therefore, a power consumption and gate propagation delay time are increased. Further, when a base current is risen, the injection current flows as a base current even after the base current has been risen. Therefore, the reversely connected NPN transistor is deeply saturated, and thus the gate propagation delay time and power consumption are increased.

Further, the illustrated prior art IIL circuit (FIG. 46 shows an IIL inverter of two stages) has the following problem in operation. When an input is at a high level potential, an output from a first stage has a low level potential and an output from a second stage, i.e. the circuit output, has a high level potential. At this time, the pull-up PNP bipolar transistor Q11 of the first stage is in an active state and an injection current (hereinafter, referred to as Ij) mainly flows from a PNP bipolar transistor Q11 (Q12) to an NPN bipolar transistor Q13 (Q14), as shown by the arrow of a dot-dash line in FIG. 46. On the other hand, the PNP bipolar transistor Q12 of the second stage is saturated because the output voltage or the collector voltage thereof goes to the high level voltage, and thus Ij flows from the emitter to the base thereof, as shown by the arrow of a dot-dash line in FIG. 46. As described above, a problem arises in that even if the output of the IIL circuit is at any potential of the high level potential and low level potential, a steady state current Ij exists and a large power consumption is required. The reduction of Ij for solving or mitigating the problem means the delay of the rising-up of an output and thus the delay time of a circuit is increased. Further, the reduction of Ij causes the NPN bipolar transistor Q13 (Q14) to be saturated and thus the rising time is further delayed. As described above, at present, a low power consumption is incompatible with a high speed in the IIL circuit.

(2) In the prior art NTL circuit shown in FIG. 47, the charge and discharge speed of each node may be determined by the time constant of a resistor and parasitic capacitor. Thus, the reduction of a resistance value for increasing a speed results in an increase of a power consumption. That is, either the speed or low power consumption must be selected.

(3) In the prior art ECL circuit shown in FIG. 48, the discharge speed of the output from the emitter follower unit is determined by the time constant of a resistor and parasitic capacitor. Thus, the reduction of a resistance value for increasing a speed results in an increase of a power consumption. That is, either the speed or low power consumption must be selected.

(4) In the prior art BiCMOS composite circuit shown in FIG. 49, the following formula is established.

$$V_{IH}\min = V_{th} = V_{cc}\min - V_{BE}$$

That is, the input voltage $V_{IH}\min$ which can be recognized as a minimum operable logic "1" is equal to the threshold voltage $V_{th}$ of the NMOS transistor 301 as well as equal to the value obtained by subtracting the voltage between the base and the emitter $V_{BE}$ of the NPN transistor 300 from a minimum operable power supply voltage $V_{cc}\min$. Therefore, the minimum operable power supply voltage $V_{cc}\min$ is represented by the following formula.

$$\begin{aligned} V_{cc}\min &= V_{BE} + V_{th} \\ &= 0.9 + 0.6 \\ &= 1.5 \text{ (V)} \end{aligned}$$

That is, although this prior art BiCMOS circuit can be operated by a low power supply voltage of 2 V to 1.5 V, a problem arises in that when the potential of an output terminal 306 is at a high level, since it does not fully swing to a power supply voltage $V_{cc}$, a problem arises in that a DC current flows at a next stage and the speed of the gate circuit of the next stage is lowered.

(5) In the case of the prior art BiCMOS composite circuit shown in FIG. 50, the following formula is established.

$$V_{IH}\min = V_{th} = V_{cc}\min - V_{BE}$$

That is, the input voltage $V_{IH}\min$ which can be recognized as a minimum operable logic "1" is equal to the threshold voltage $V_{th}$ of the NPN transistor 313 as well as equal to the value obtained by subtracting the voltage between the base and the emitter $V_{BE}$ of the NPN transistor 310 from a minimum operable power supply voltage $V_{cc}\min$. Further, the relationship $V_{cc}\min > V_{BE}$ must be satisfied in order to that the NPN transistor 311 of the output stage operates. Therefore, the minimum operable power supply voltage $V_{cc}\min$ is represented by the following formula.

$$\begin{aligned} V_{cc}\min &= V_{BE} + V_{th} \\ &= 0.9 + 0.6 \\ &= 1.5 \text{ (V)} \end{aligned}$$

As described above, operation can be performed to a considerable low power supply voltage in spite of that the output stage is composed of the totem-pole connected gate. However, when the potential of an input terminal 319 is at a high level and the potential of an output terminal 320 is at a low level and then a noise is added to the potential of the output terminal 320 and the magnitude of the noise exceeds the logic threshold voltage of a CMOS inverter 317, a base current is supplied to the NPN transistor 311 to try to keep the low level. When, however, the magnitude of the noise is less than the logic threshold voltage, no action is taken to extinguish the noise, and thus this BiCMOS composite circuit has a defect that it is weak to noise.

Further, there is also a defect described by using FIGS. 51 and 52. That is, as shown in FIG. 51, there exists a connection capacitor 321 for the sources or drains of a PMOS transistor 314 and PMOS transistor 315 located therebtween.

Further, there exists a parasitic capacitor 322 such as a base capacitor, the connection capacitor of a MOS transistor 315 and the like around the base of an NPN transistor 311. FIG. 52 shows an operation timing and the ON/OFF states of respective MOS transistors, wherein a time axis is divided into five regions I–V. A region I represents the state that the potential of an input terminal 319 is set to a low level and the potential of an output terminal 320 is set to a high level. At this time, since the PMOS transistor 314 is turned OFF, the PMOS transistor 315 is turned OFF and an NMOS transistor 316 is turned ON at this time, the potential of an A point is set to the absolute value of the threshold voltage of the PMOS transistor 315 and the base potential of the NPN transistor 311 is set to a ground potential.

A region II represents the state that the potential of the input terminal 319 begins to rise up and the potential of the output terminal 320 begins to fall down. At this time, the PMOS transistors 314 and 315 are turned ON, the NMOS transistor 316 is turned OFF, and the potential of the point A rises according to the time constant determined by the ON resistances of the PMOS transistors 314 and 315 and the like. Further, the base potential of the NPN transistor 311 rises and the NPN transistor 311 is turned ON.

A region III represents the state that the potential of the input terminal 319 is at the high level and the potential of the output terminal 320 is at the low level. At this time, the PMOS transistor 314 is turned ON and the PMOS transistor 315 and NMOS transistor 316 are turned OFF. The potential of the point A is set to the power supply voltage $V_{cc}$ of a power supply terminal 318 and the base potential of the NPN transistor 311 is kept to the same potential as the power supply voltage $V_{cc}$, but this potential is gradually dropped.

A region IV represents the state that the potential of the input terminal 319 begins to fall down and the potential of the output terminal 320 begins to rise up. At this time, the PMOS transistors 314 and 315 are turned OFF, the NMOS transistor 316 is turned ON, the potential of the point A is kept to the state of the region III, and the base potential of the NPN transistor 311 quickly drops.

A region V represents the state that the input terminal 319 is at the low level and the output terminal 320 is at the high level. At this time, the PMOS transistor 314 is turned OFF, the PMOS transistor 315 is turned ON, and the NMOS transistor 316 is turned ON. Although the potential of the point A reduces towards the absolute value of the threshold voltage of the PMOS transistor 315, the base potential of the NPN transistor 311 increases once and then reduces towards a ground potential. This is caused by the distribution of the charge stored in the parasitic capacitor 321 to a parasitic capacitor 322 by the turning ON of the PMOS transistor 315. As a result, the NPN transistor 311 is turned ON for a period at the timing when it is to be turned OFF. Thus, a passing-through current flows from the $V_{cc}$ power supply terminal 318 to a ground potential terminal. This passing-through current causes a power consumption to be increased and a charging current supplied to a load by an NPN transistor 310 also to escape to the NPN transistor 311, and thus a high speed operation is obstructed.

(6) The aforesaid prior art is difficult to utilize the feature of a high speed NTL logic gate due to the delay arisen in a level conversion circuit.

(7) The logic gate circuit using the aforesaid conventional CMOS circuit is excellent in a low power supply voltage property and low power consumption property, whereas it has an increased load dependency of a gate propagating delay time because a PMOS transistor and NMOS transistor are inferior to a bipolar transistor in a current drive capability, and thus a problem remains in the speed of the gate propagation delay time.

(8) In the aforesaid prior art BiCMOS circuit (e.g., FIG. 76), the signal level of the output terminal 813 is dropped to the fixed terminal potential (ground level) only when it is at an "L" level. When, however, the signal level of the output terminal 813 is at the "H" level, the signal does not go to the power supply voltage level of the power supply terminal 810 and goes to the level lower than this level by the voltage $V_{BE}$ between the base and the emitter of a bipolar transistor 823 and the signal is not fully swung. The signal level of the output terminal 813 must be fully swung in order to realize operation performed at a low voltage.

The base potential of the NPN transistor 823 which is turned ON when the potential of the output terminal 813 is at an "H" level must be higher than the potential of the power supply terminal 810 or the collector potential of the NPN transistor 823 so that the NPN transistor 823 is saturated in the same way as the NPN transistor 824 which is turned ON when the potential of the output terminal 813 is at the "L" level in order that operation is performed with the fully swung signal level of the output terminal 813. For this purpose, the circuit must be arranged to introduce a potential higher Than the potential of the power supply terminal 810. Although it may possible to arrange a circuit by using a PNP transistor in place of the NPN transistor 823 going to the H level side, this circuit must be arranged by using the NPN transistor at any risk.

Further, when the NPN transistor 824 going to the "L" level side is turned ON, the base potential thereof is shut off by the PMOS transistor 842, but it is in a saturated region and a recovery time is needed in transition and a problem arises in that high speed operation is obstructed.

In the aforesaid prior art, although a speed is increased and a power consumption is reduced by using an inverter circuit composed of a bipolar transistor and MOS transistor in combination, since the bipolar transistor is not operated in a transitionally saturated state, the feature of the bipolar transistor cannot be sufficiently utilized and thus a sufficient high-speed cannot be achieved. Moreover, a PMOS transistor must be connected in series to the bipolar transistor in order to fully swing a signal, which makes a circuit arrangement complex.

SUMMARY OF THE INVENTION (1) It is an object of the present invention to provide an IIL type circuit operating at a high speed with a low power consumption.

To achieve the above object, a semiconductor integrated circuit device according to the present invention comprises an IIL type circuit including two NPN transistors each having an emitter connected to a ground, one of the NPN transistors having a collector connected to the base of the other NPN transistor, and the IIL type circuit further comprises a MOS transistor connected between a power supply terminal and the collector of the one NPN transistor; and an injection current control circuit for supplying an injection current to the two emitter-grounded NPN transistors.

Further, a semiconductor integrated circuit device according to the present invention comprises a PNP bipolar transistor and an NPN bipolar transistor having commonly connected collectors; a power supply circuit terminal connected to the emitter of each of the transistors; an input terminal connected to the base of the NPN bipolar transistor; and an output terminal connected to the commonly connected collectors, and the semiconductor integrated circuit device further comprises a function circuit for producing a potential which goes to a low level in response to the falling down of a signal input to the input terminal and goes to a high level in response to the rising up of a signal output from the output terminal so that the base potential of the PNP bipolar transistor is controlled by an output from the function circuit.

With this arrangement, since the injection current is increased only at the timing when the base potential is risen, the IIL type circuit operating at a high speed with a low power consumption can be provided.

(2) Further, it is an object of the present invention to provide an NTL type circuit operating at a high speed with a low power consumption.

To achieve the above object, a semiconductor integrated circuit device according to the present invention comprises an initial stage having a PMOS transistor, a first NPN transistor and a first NMOS transistor each connected between a first power supply potential terminal and a second power supply potential terminal with the gate or base thereof connected to an input terminal, a diode connected in series between the source and the drain of the PMOS transistor, and a capacitor connected in series between the drain and the source of the NMOS transistor; and an emitter follower output stage having a second NPN transistor and a second NMOS transistor totem-pole connected between the first power supply potential terminal and the second power supply potential terminal, the second NPN transistor having a base connected to the collector of the first NPN transistor, and the second NMOS transistor having a gate connected to the input terminal and serving as an emitter resistance.

With this arrangement, since the resistor of the MOS transistor is changed to thereby reduce the time constant for charging and discharging the initial stage and emitter follower stage, the NTL type circuit operating at a high speed with a low power consumption can be provided.

(3) Further, it is an object of the present invention to provide an ECL type circuit operating at a high speed with a low power consumption.

To achieve the above object, a semiconductor integrated circuit device according to the present invention comprises an ECL circuit having an input stage including a plurality of NPN transistors each having a collector connected to a first power supply terminal having a ground potential through a resistor and a commonly connected emitter connected to a second power supply terminal through a constant current source, and the ECL circuit further comprises an NMOS transistor or an NPN transistor and a same phase amplifier for amplifying an input signal for driving any one of the transistors in the same phase which constitutes a circuit element serving as the emitter resistance of the emitter follower forming an output stage.

With this arrangement, since the resistor of the MOS transistor is changed to thereby reduce the time constant for charging and discharging the emitter follower stage, the ECL type circuit operating at a high speed with a low power consumption can be provided.

(4) Further, it is an object of the present invention to provide a high speed BiCMOS logic circuit operating at a low power supply voltage from 1.5 V to 2.0 V with an output level swung to the full power supply voltage.

To achieve the above object, a semiconductor integrated circuit device according to the present invention comprises a BiNMOS type logic circuit having a totem-pole arranged output stage, composed of an NPN transistor and an NMOS transistor, connected between a first power supply terminal and a second power supply terminal, in which a collector of the NPN transistor and a source of the NMOS transistor are connected to the first and second power supply terminals, respectively, the second power supply terminal having a ground potential, an emitter of the NPN transistor connected to a drain of the NMOS transistor; and the BiNMOS type logic circuit further comprises an NMOS transistor having a drain connected to the collector of the NPN transistor, a source connected to the base of the NPN transistor for driving the NPN transistor; a CMOS logic gate for driving the NMOS transistor; and a capacitor connected between the base and the emitter of the NPN transistor.

With this arrangement, since an output level is pulled up by making use of a bootstrap effect and further using the PMOS transistor, the high speed BiCMOS logic circuit operating at a low power supply voltage from 1.5 V to 2.0 V with an output level swung to the full power supply voltage can be provided.

(5) Further, it is an object of the present invention to provide a noise resistant BiCMOS logic circuit operating at a high speed with a low power consumption at a power supply voltage of about 1.5 V or lower.

To achieve the above object, a semiconductor integrated circuit device according to the present invention comprises a BiCMOS logic circuit having an output stage composed of two totem-pole-connected NPN transistors; and the BiCMOS logic circuit further comprises a CMOS logic gate for driving the upper NPN transistor of the two totem-pole-connected NPN transistors; two or more PMOS transistors each connected in series between a first power supply terminal and the base of the lower NPN transistor of the two totem-pole-connected NPN transistors for driving the lower NPN transistor; an NMOS transistor having a drain connected to an output terminal and a source connected to a second power supply terminal having a ground potential for pulling down the output signal of the logic circuit; and a signal obtained by inverting a signal output from the logic circuit is input to the gate of the PMOS transistor on the first power supply terminal side of the two or more PMOS transistors and a signal output from the CMOS logic gate is input to the gate of the PMOS transistor on the base side of the lower NPN transistor.

With this arrangement of the totem-pole type BiCMOS logic circuit, since a base current is supplied to the NPN transistor of the lower side of the output stage through the PMOS transistor connected to the power supply voltage terminal and then shut off after an output level has fallen down and further the output level is pulled down by the NMOS transistor, the noise resistant BiCMOS logic circuit operating at a high speed with a low power consumption at a power supply voltage of about 1.5 V or lower can be provided.

(6) Further, it is an object of the present invention to provide a BiCMOS composite LSI operating at a high speed with a low power consumption.

To achieve the above object, a semiconductor integrated circuit device according to the present invention is disclosed, wherein a power supply potential is set to a ground potential and about 12 VI, a CMOS logic circuit and a BiNMOS type logic circuit have a logic threshold voltage set equal to or lower than the output level of an NTL type logic circuit, the high level output of the BiNMOS type logic circuit is set to a high level power supply potential $V_{BE}$, and the CMOS logic circuit, the BiNMOS type logic circuit and the NTL type logic circuit are directly connected to each other without using a level conversion circuit therebetween.

With this arrangement, the super high speed NTL circuit, CMOS circuit with a low power consumption, high speed BiNMOS circuit with a low power consumption can be used with a right device in a right place without using a level conversion circuit, the high speed LSI with a low power consumption can be provided.

Further, according to this invention, since the high speed and low power consumption logic circuit and LSI can be provided, an LSI system of high performance such as a processor and the like can be realized.

(7) Further, it is an object of the present invention to provide a logic gate circuit with a gate propagation delay time less depending upon an output load power consumption while securing a low power supply property.

To achieve the above object, a semiconductor integrated circuit device according to the present invention comprises a first CMOS logic gate; a second CMOS logic gate having an input terminal connected to the input terminal of the first CMOS logic gate for performing the same logic operation as that of the first CMOS logic gate; and a differentiator circuit having an input terminal connected to the output terminal of the second CMOS logic gate and an output terminal connected to the output terminal of the first CMOS logic gate.

With this arrangement, a semiconductor integrated circuit device can be realized in which the dependency of a gate propagation delay time upon an output load is lowered while securing a low power supply. Further, according to this invention, the dependency of a signal transmission delay time upon a load can be lowered, an operating speed can be increased, a logic circuit performing the same logic operation as that of a main logic circuit can be omitted, the scale of a circuit can be reduced, and a high integration and low power consumption can be achieved.

(8) Further, it is an object of the present invention to provide a semiconductor integrated circuit device capable of operating at a low power supply voltage while securing a high speed and low power consumption.

To achieve the above object, a semiconductor integrated circuit device according to the present invention has, on a semiconductor substrate a plurality of internal circuits each composed of circuit elements for performing a predetermined circuit operation, a plurality of input circuits for receiving external input signals and outputting the same to the internal circuits, and a plurality of output circuits for receiving signals outputted from the internal circuits and externally outputting the same in which at least one of the circuits has a first NPN bipolar transistor having a collector connected to a power supply terminal and an emitter connected to the output terminal of the circuit, respectively; a second NPN bipolar transistor having a collector connected to the output terminal and an emitter connected to a fixed potential terminal; a first differentiator circuit composed of a capacitor and a resistor and serving as a means for supplying a base current to the first NPN bipolar transistor; a first PMOS transistor having a source connected to the power supply terminal and a gate driven by the inverted signal of the output terminal and serving as a means for supplying a base current to the second NPN bipolar transistor; and a second PMOS transistor connected in series to the drain of the first FMOS transistor and having a gate to which the inverted signal of a signal input from the input terminal of the circuit is input.

With this arrangement, an output can be fully swung which is indispensable to operation at a low voltage and thus the low voltage operation can be performed. Further, since the bipolar transistor constituting an output stage is recovered from a saturated region in a short time after the operation of the bipolar transistor has shifted once to the saturated region, the signal transmission delay time can be reduced and a low power consumption property can be secured.

(9) Further, it is an object of the present invention to provide a semiconductor integrated circuit device capable of outputting a signal fully swung to a power supply voltage by operating the transistor of an output stage so that it is temporarily in a saturated state.

To achieve the above object, a semiconductor integrated circuit device according to the present invention comprises a PNP bipolar transistor, an NMOS transistor, and a current supply means, wherein the PNP bipolar transistor has an emitter connected to a power supply terminal, a collector connected to an output terminal and a base connected to an input terminal through a current supply means; the NMOS transistor has a drain connected to the output terminal and a source connected to a fixed power supply terminal having a potential lower than that of the power supply terminal; and the current supply means has a circuit element for supplying a base current to the base of the PNP bipolar transistor in response to a signal by which the input terminal is made to a low level so that the region between the base and the emitter thereof goes to a forward bias state, continues the supply of the base current until the region between the base and the collector of the PNP bipolar transistor changes from a reverse bias state to the forward bias state, and thereafter stops the supply of the base current.

With this arrangement, since the bipolar transistor is used as the main element of a logic circuit and the bipolar transistor is transiently saturated, the semiconductor integrated circuit device including the logic circuit capable of operating at a low power supply voltage can be arranged.

BRIEF DESCRIPTION OF THE DRAWINGS

These and other objects and advantages of this invention will become more apparent and more readily appreciated from the following detailed description of the presently preferred exemplary embodiments of the invention taken in conjunction with the accompanying drawings of which.

DETAILED DESCRIPTION OF THE PREFERRED EMBODIMENTS

The embodiments of this invention will be described with reference to the drawings.

First Embodiment (FIGS. 1–30)

Figure 1:
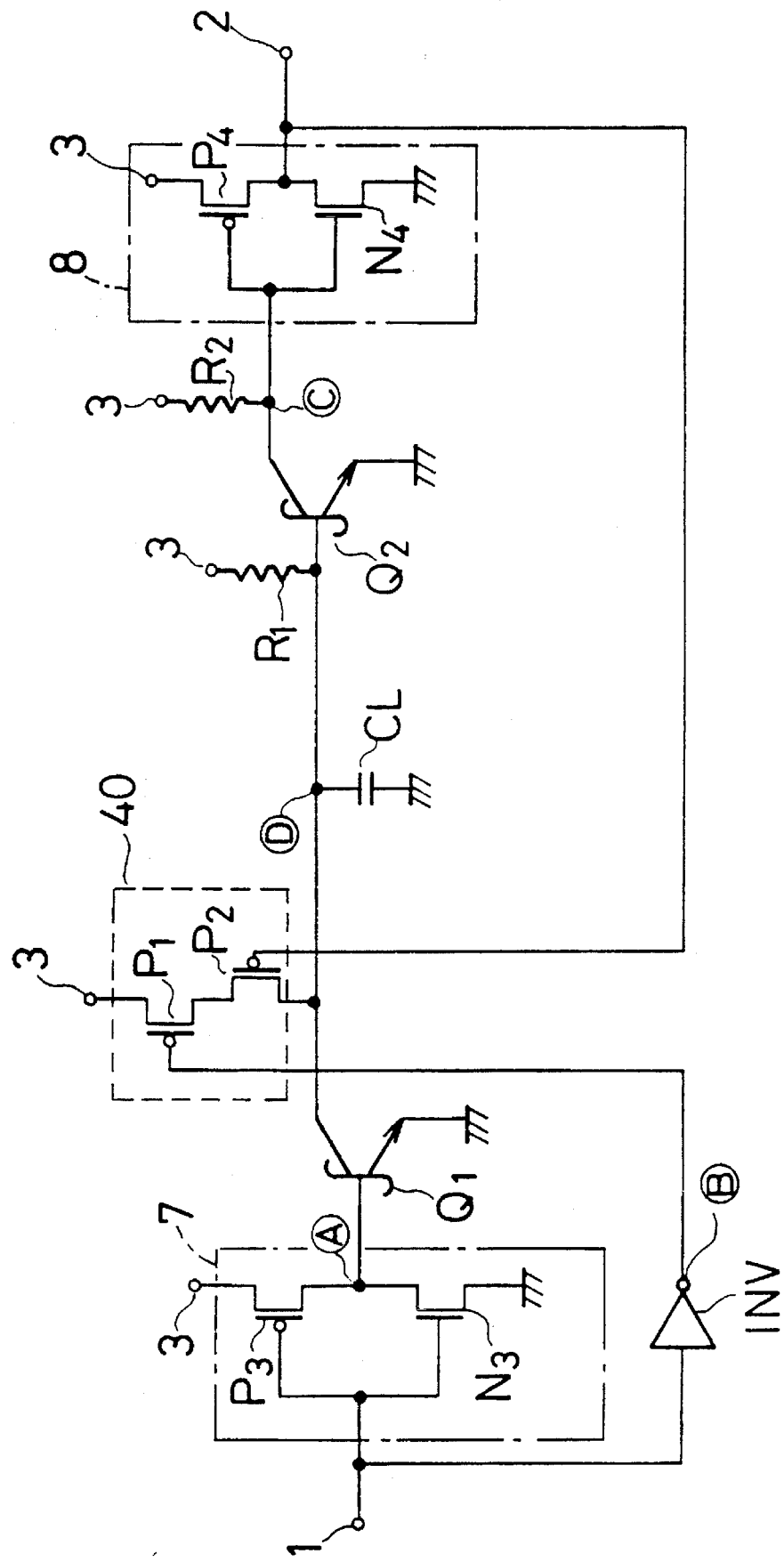
FIG. 1 is a circuit diagram showing the arrangement of an embodiment of an IIL type buffer circuit according to this invention.

(1) FIG. 1 shows the arrangement of an embodiment of an IIL type buffer circuit. An object of this buffer circuit is to reduce a signal transmission time between two positions in the circuit where two heavy loads are provided. The collector of an NPN transistor Q1 with a Schottky Barrier diode (SBD) is connected to base of an NPN transistor Q2 with an SBD and a heavy capacitive load CL is connected to the node thereof. The NPN transistor Q1 is driven by a CMOS inverter 7 composed of a PMOS transistor P3 and NMOS transistor N3. The collector of the NPN transistor Q2 is connected to the input terminal of a CMOS inverter 8 composed of a PMOS transistor P4 and NMOS transistor N4, and further a pull-up resistor R2 is connected to the input terminal. A numeral 1 is an input terminal and a numeral 2 is an output terminal. PMOS transistors P1 and P2 are connected in series between a power supply terminal 3 and the collector of the NPN transistor Q1, the output terminal of a CMOS inverter INV having an input terminal connected to the input terminal 1 is connected to the gate of the PMOS transistor P1, and the gate of the PMOS transistor P2 is connected to the output terminal 2. A resistor R1 is connected between the base of the NPN transistor Q2 and the power supply terminal 3 to supply a minimum current to the base of the NPN transistor Q2 so that when the NPN transistor Q1 is turned OFF, the NPN transistor Q2 is kept in ON state. An injection current control circuit 40 is composed of the PMOS transistors P1 and P2.

Figure 2:
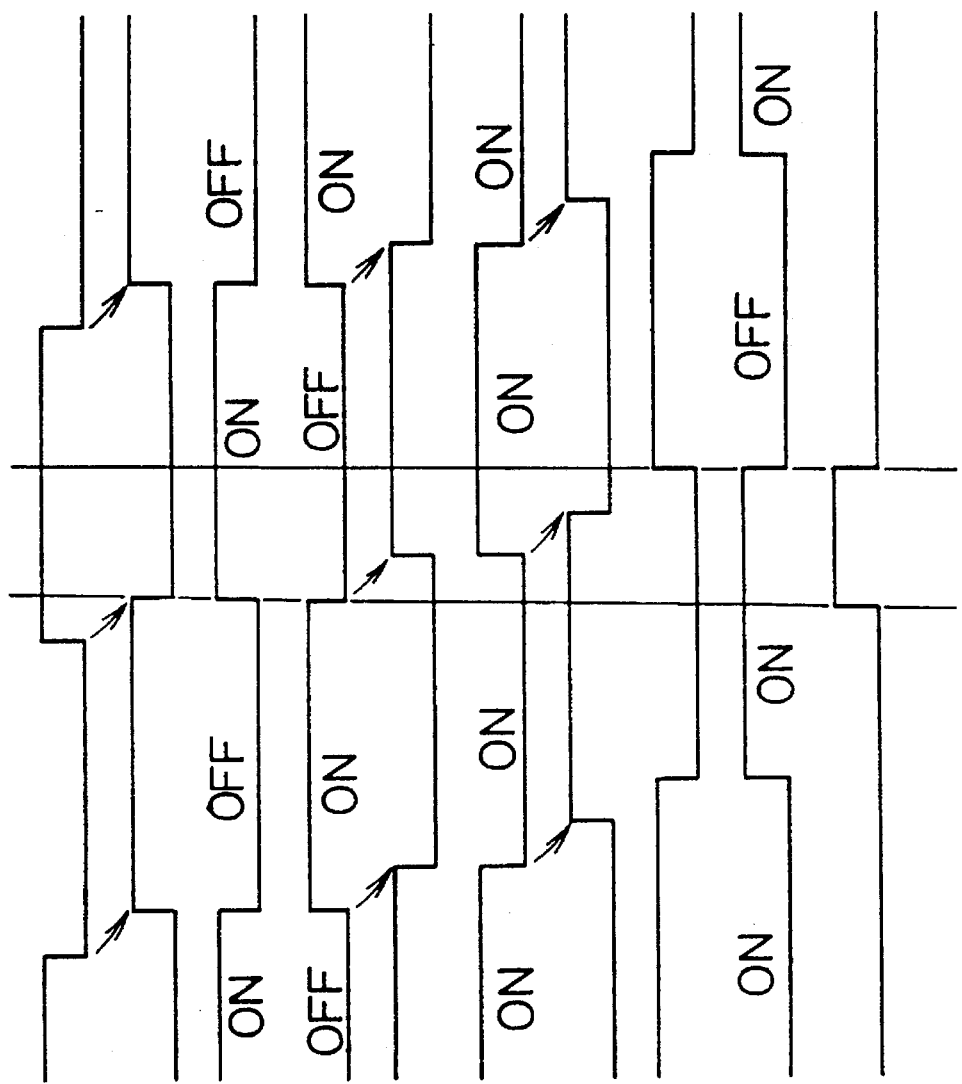
FIG. 2 is a timing chart showing the operating state of the buffer circuit shown in FIG. 1.

FIG. 2 is a timing chart showing the operating conditions of the buffer circuit shown in FIG. 1. When the potential of the input terminal 1 changes to a high level and low level in the above arrangement, the potentials of the points A and B which are the outputs of the CMOS inverters 7 and INV are inverted to the high level and low level a little later. When the potential of the point B is at the low level, the PMOS transistor P1 is turned ON, and when the potential of the point B is at the high level, the PMOS transistor P1 is turned OFF, Further, when the potential at the point A is at the low level, the NPN transistor Q1 is turned OFF, and when the potential at the point A is at the high level, the NPN transistor Q1 is turned ON. When the NPN transistor Q1 is turned ON, the collector potential of the NPN transistor Q1 (point D) drops and thus the NPN transistor Q2 is turned OFF.

On the other hand, when the NPN transistor Q1 is turned OFF, a base current flows to the NPN transistor Q2 through the resistor R1, the base potential of the NPN transistor Q2 (point D) goes to a voltage $V_{be}$ between a base and an emitter, and the NPN transistor Q2 is turned ON. When the NPN transistor Q2 is turned OFF, the potential of the point C rises through the resistor R2 and potential of the output terminal 2 goes to the low level.

On the other hand, when the NPN transistor Q2 is turned ON, the collector potential of the NPN transistor Q2 (point C) drops and the potential of the output terminal P2 goes to the high level. When the potential of the output terminal 2 is at the low level, the PMOS transistor P2 is turned ON. As apparent from FIG. 2, both PMOS transistors P1 and P2 are turned ON only at the time when the point D, i.e., the point where the heavy load is connected is charged. Therefore, when the capacitive load CL at the point D is charged, a large charge current flows through the PMOS transistors P1 and P2 to thereby quickly charge the capacitive load CL and the NPN transistor Q2 is quickly turned ON. Since the NPN transistor Q2 is turned ON and then the PMOS transistor P2 is turned OFF a little later, an excessive base current does not flow to the NPN transistor Q2 and thus the saturation of the NPN transistor Q2 can be shallowed. Further, when the NPN transistor Q1 is turned ON and the capacitive load CL is discharged it is sufficient to only discharge the capacitive load CL because the PMOS transistor P1 is turned OFF, and thus the level of the point D quickly drops. As described above, a buffer circuit capable of being operated at a high speed with a low power consumption can be obtained by controlling the infection current by the PMOS transistors P1 and P2. Note, the potential of the power supply terminal 3 can be lowered near to $V_{be}$.

Figure 3:
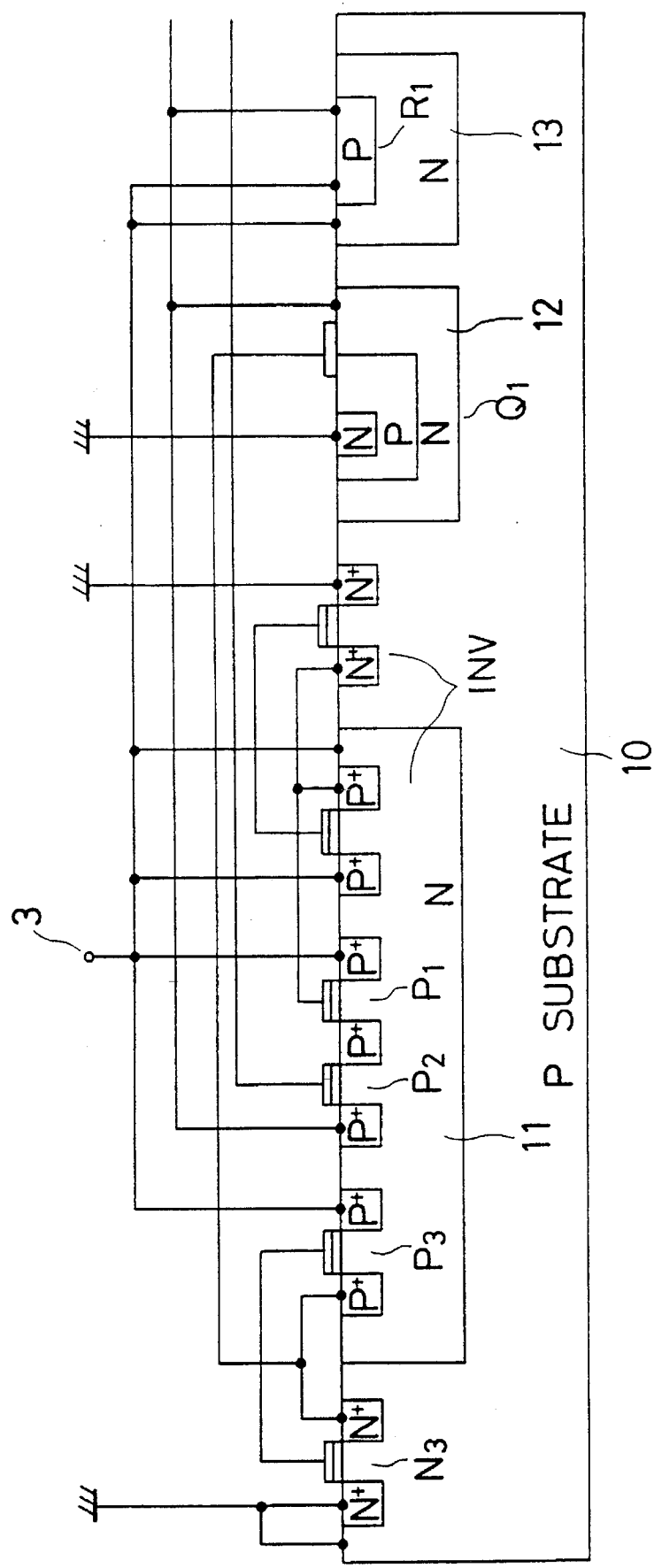
FIG. 3 is a cross sectional view showing a device structure when the buffer circuit shown in FIG. 1 is mounted to a semiconductor substrate.

FIG. 3 shows the device structure of the left half of the buffer circuit shown in FIG. 1 mounted on a semiconductor substrate. In FIG. 3, the NMOS transistor N3, and the NPN transistor of the CMOS inverter INV are formed on a P type substrate 10. Further, the PMOS transistors P1, P2, P3 and the PMOS transistor of the CMOS inverter INV are formed in a N type well 11.

The vertical NPN transistor Q1 is formed in another N type well 12. Further, the P type resistor R1 is formed in a further N type well 13.

As described above, since a usual longitudinal NPN transistor can be used in place of the inverted NPN transistor used in a prior art IIL circuit, the switching speed of the transistor can be improved and thus the operating speed of the circuit can be increase.

Figure 4:
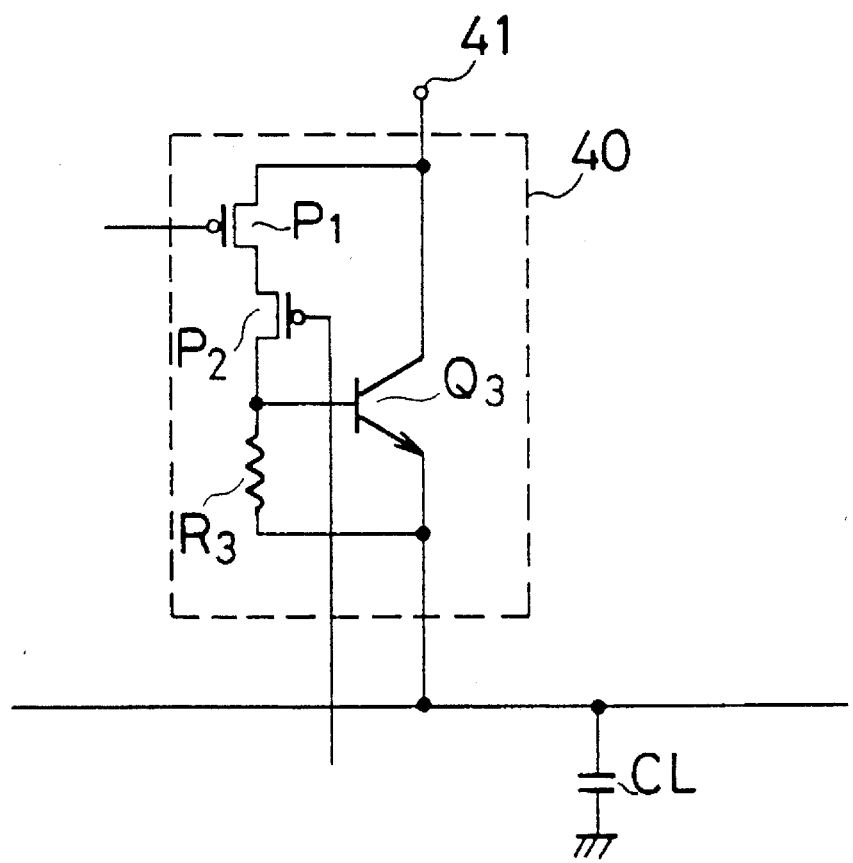
FIG. 4 is a circuit diagram showing another example of an injection current control circuit in the buffer circuit shown in FIG. 1.

FIG. 4 shows another example of an injection current control circuit 40 compose of the PMOS transistors P1 and P2 shown in FIG. 1. The injection current control circuit 40 also includes the NPN transistor Q3 for quickly charging the capacitive load CL by receiving a base current through the PMOS transistors P1 and P2 and the resistor R3 connected between the base and the emitter of the NPN transistor Q3 to extract the base charge of the NPN transistor Q3, in addition to the PMOS transistors P1 and P2. According to this example, since the capacitive load CL is charged by the NPN transistor, an operating speed can be further improved. Note, in this case, the potential of the power supply terminal 41 of the injection current control circuit 40 must be increased by the voltage $V_{BE}$ between the base and the emitter of the NPN transistor Q3 as compared with the case of the injection current control circuit shown in FIG. 1.

According to this embodiment, a signal amplitude at the point where a heavy load is connected can be lowered to about 0.6 V in the same way as the IIL circuit, and further since the injection current is controlled to be increased when necessary and to be decreased when not necessary, a buffer circuit operating at a high speed with a low power consumption can be obtained.

Figure 5:
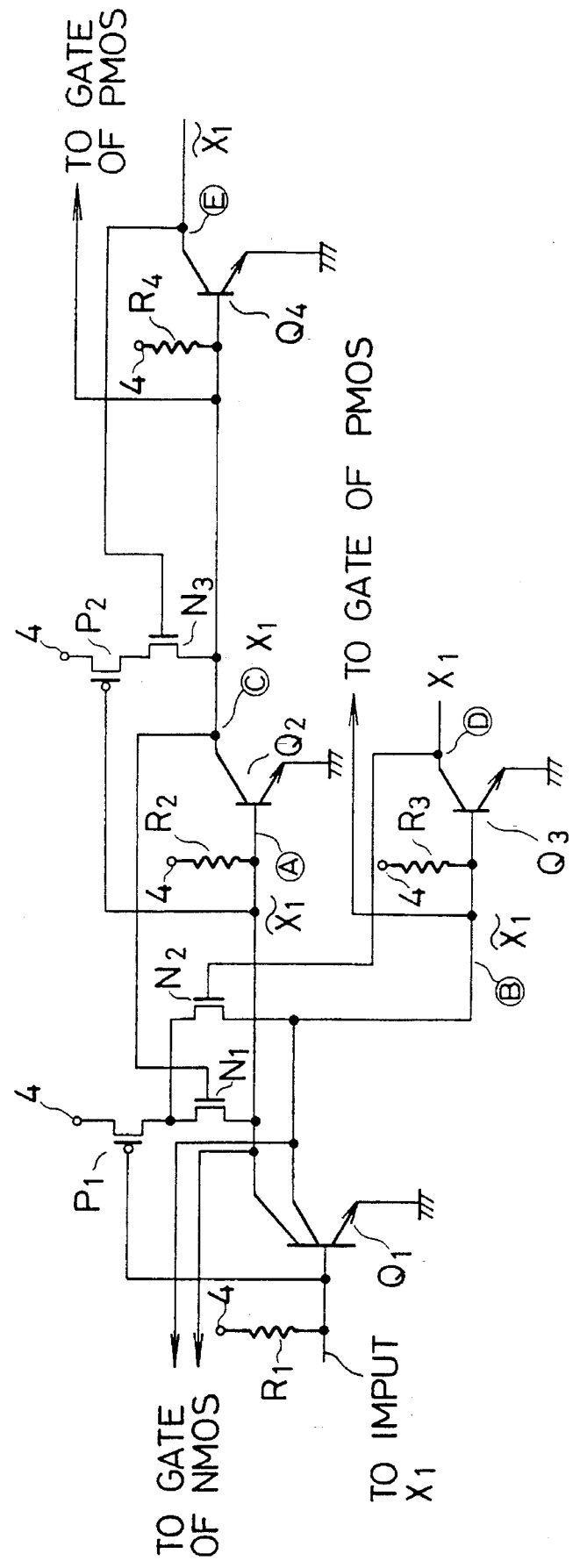
FIG. 5 is a circuit diagram showing the arrangement of a group of IIL type logic circuits according to this invention.
Figure 6:
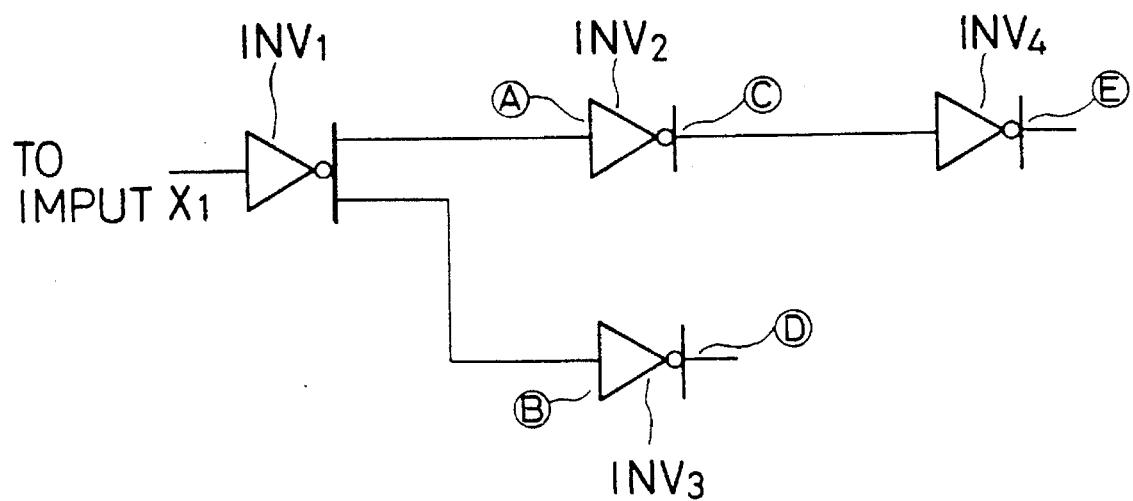
FIG. 6 is a circuit diagram showing the group of the logic circuits shown in FIG. 5 by using logic circuit symbols.

FIG. 5 shows an example of a group of logic circuits arranged by the same idea as that of the buffer circuit shown in FIG. 1, i.e., by the idea of properly controlling an injection current. FIG. 6 is a symbol diagram of the group of the logic circuits.

A numeral INV1 shows a two-output inverter and corresponds to the NPN transistor Q1 and an injection current supply device connected to the base and collector of the NPN transistor Q1, e,g., the resistors R1, R2 and R3 and the PMOS transistors P1 and the NMOS transistors N1, N2 and the like.

A numeral INV2 shows a single-output inverter and corresponds to the NPN transistor Q2 and an injection current supply device connected to the base and collector of the NPN transistor Q2, e.g., the resistors R2, R4 and the PMOS transistors P1, P2 and the NMOS transistors N1, N3.

A numeral INV3 shows a single-output inverter and corresponds to the NPN transistor Q3 and an injection current supply device connected to the base and collector of the NPN transistor Q3, e.g., the resistor R3 and the PMOS transistor P1 and the NMOS transistor N2 and the like.

A numeral INV4 designates a single-output inverter and corresponds to the NPN transistor Q4, an injection current supply device connected to the base and collector of the NPN transistor Q4, e.g., the resistor R4, the PMOS transistor P2, the NMOS transistor N3 and the like. The resistor R1 connected between a power supply terminal 4 and the base of the NPN transistor Q1 is set such that a minimum current is supplied to keep the NPN transistor Q1 in the ON state. The other resistors R2, R3 and R4 are set in the same way. The PMOS transistor P1, NMOS transistor N1 and the like serve as an injection current control device. Although the source of the PMOS transistor P1 is connected to the power supply terminal 4, it may be connected to a power supply terminal having a higher potential, if necessary. This can be applied to the other injection current control devices. Note, although not shown, when the number of logics is increased, the NPN transistor and injection current supply device are connected to the base of the NPN transistor Q1 and the collectors of the NPN transistor Q3, Q4, in the same way.

Figure 7:
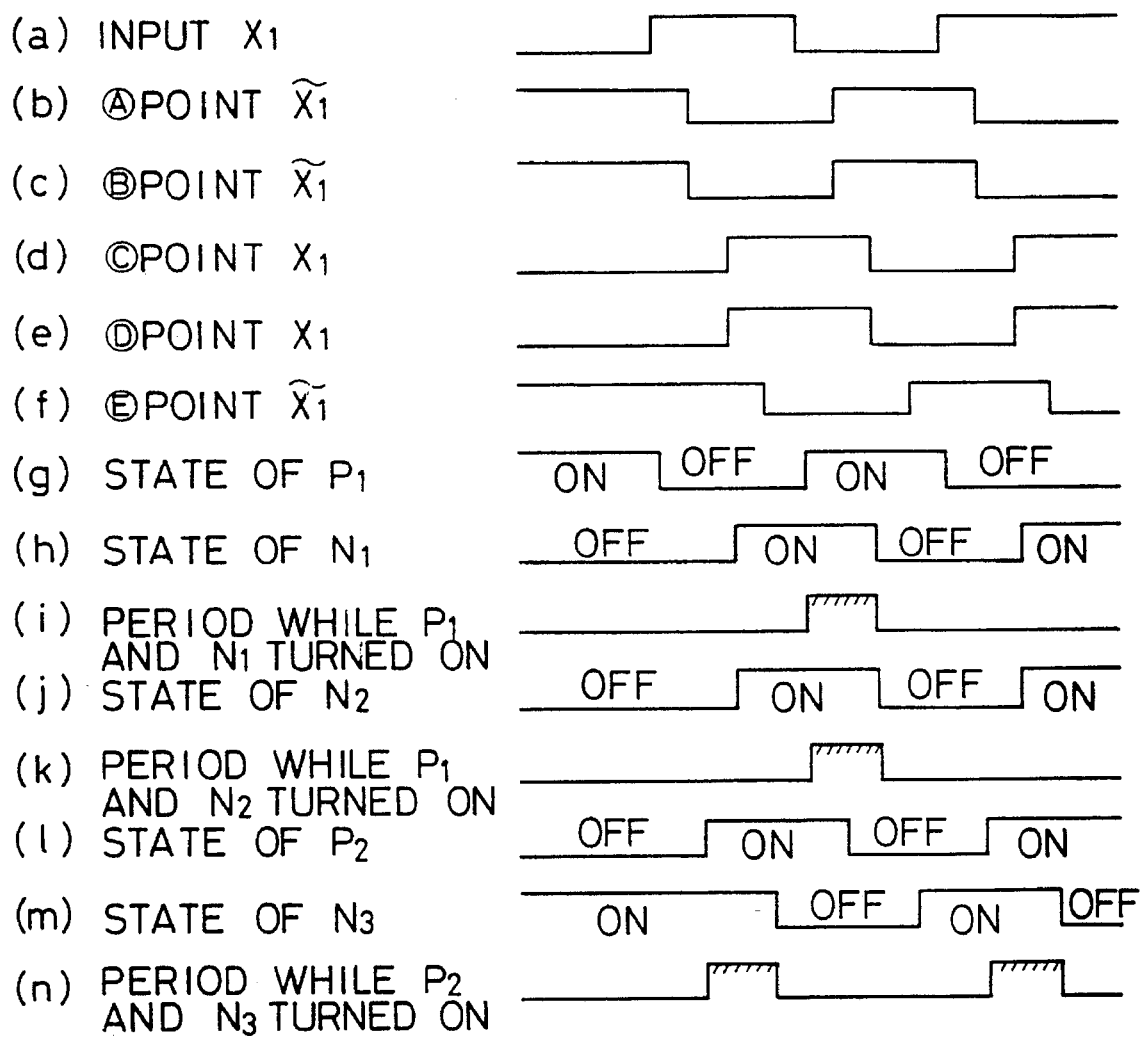
FIG. 7 is a timing chart showing the operating state of the group of the logic circuits shown in FIG. 6.

FIG. 7 is a timing chart showing the operating conditions of the group of the logic circuits shown in FIG. 5. In FIG.

7, when an input X1 goes to a high level, the NPN transistor Q1 is turned ON, the potentials of the points A and B serving as the collector thereof drop, and the NPN transistors Q2, Q3, are turned OFF. When the NPN transistors Q2, Q3 are turned OFF, an injection current is supplied at least by the resistor 4 and the like; the potentials of points C and D rise, the NPN transistor Q4 is turned ON and the potential of a point E drops.

On the other hand, when the input X1 goes to a low level and the NPN transistor Q1 is turned OFF, the injection current is supplied at least by the resistors R2, R3 the potentials of the points A, and B drop and the NPN transistors Q2, Q3 are turned ON. When the NPN transistors Q2, Q3 are turned ON, the potentials of the points C and D serving as the-collector thereof drop and the NPN transistor Q4 is turned OFF. Although not shown, when the NPN transistor Q4 is turned OFF, the injection current is supplied and the potential of the point E rises. The input X1 is connected to the gate of the PMOS transistor P1 and the point C is connected to the gate of the NMOS transistor N1. Therefore, when the input X1 goes to the low level, the PMOS transistor P1 is turned ON, and at this time since the point C is kept at the high level until a signal is transmitted thereto, the NMOS transistor Ni is also in the ON state. As a result, a large injection current is supplied through the PMOS transistor P1 and NMOS transistor N1 and thus the point A quickly goes to the high level. When the point A goes to the high level, the potential of the point C drops, and thus the NMOS transistor N1 is turned OFF so that an excessive injection current is prevented from being supplied to the NPN transistor Q2. That is, the NPN transistor Q2 is prevented from being deeply saturated.

Further, when the input X1 goes to the high level and the potential of the point A is dropped by the NPN transistor Q1, the PMOS transistor P1 is turned OFF and a large injection current is not supplied, and thus the potential of the point A can be quickly dropped. The other elements operate in the same way. That is, a control is performed such that the injection current supply device composed of the MOS transistor is turned ON only at the timing that the base potential of the NPN transistor must be risen.

According to this embodiment, since a signal amplitude can be reduced to about 0.6 V in the same way as the IIL circuit, and further the injection current is controlled such that it is increased when necessary and decreased when not necessary, an IIL type circuit operating at a high speed with a low power consumption can be obtained.

Figure 8:
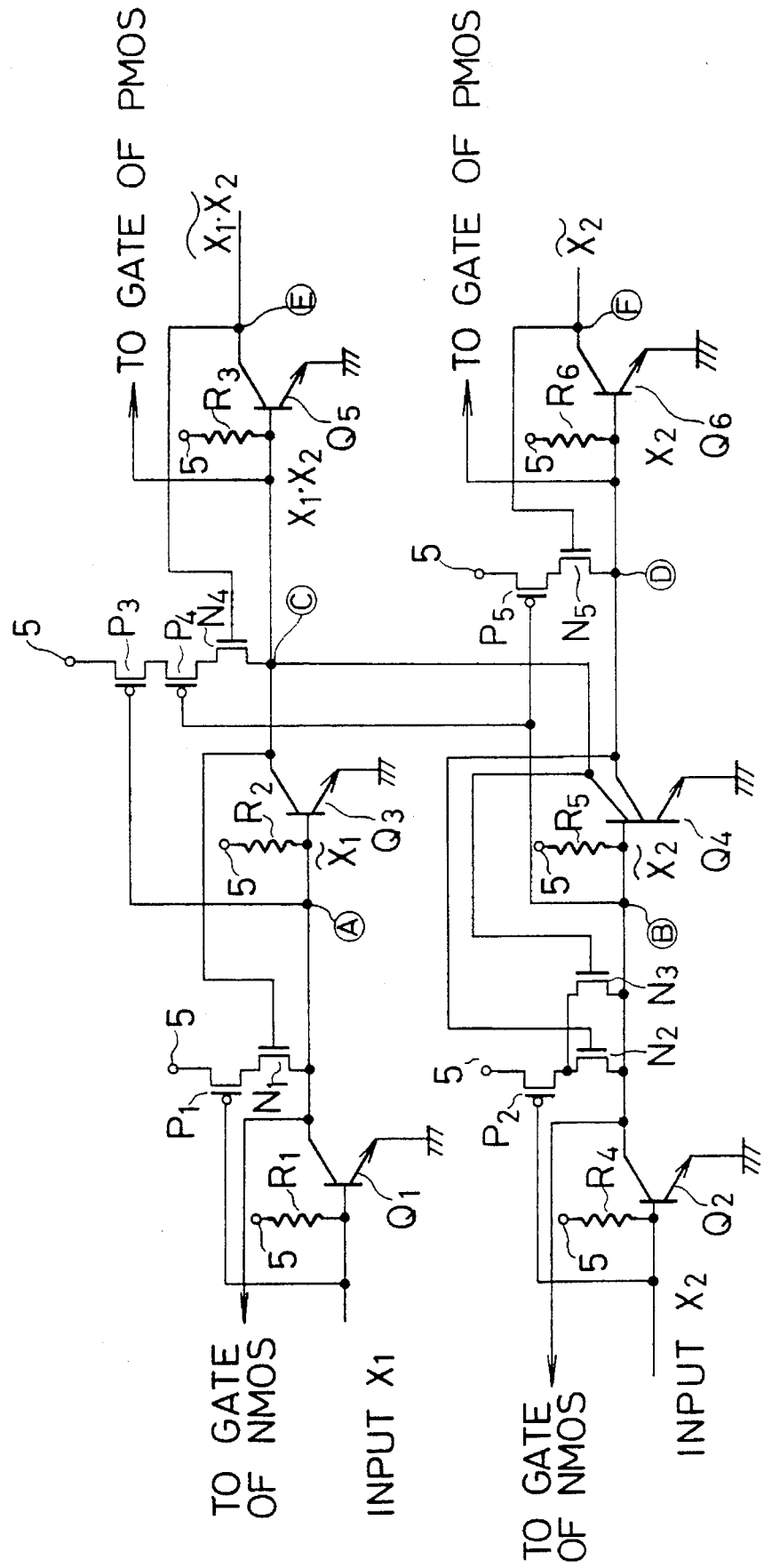
FIG. 8 is a circuit diagram showing another arrangement of the group of the IIL type logic circuits according to this invention.
Figure 9:
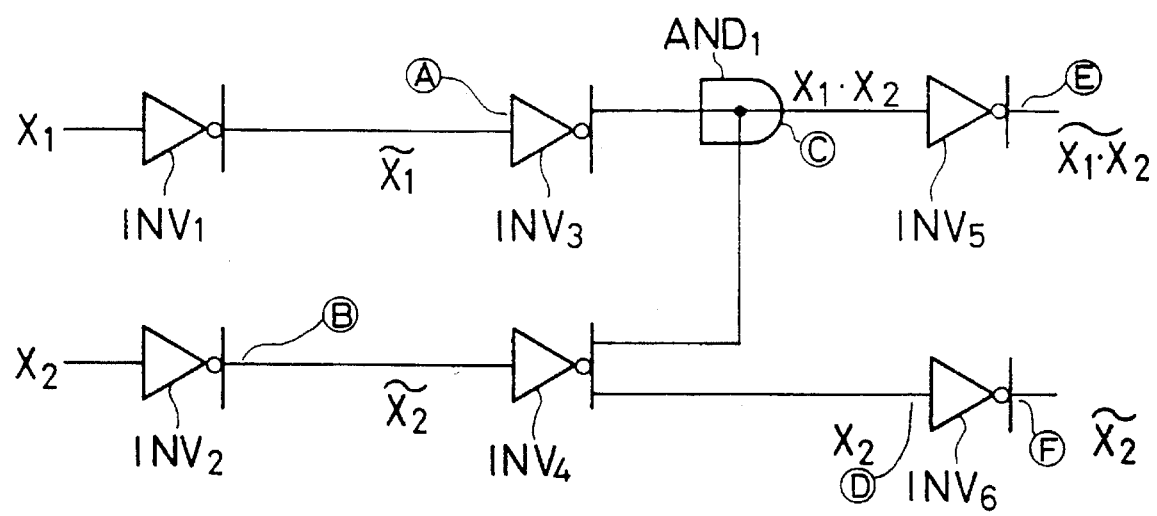
FIG. 9 is a circuit diagram showing the group of the logic circuits shown in FIG. 8 by using a logic circuit symbols.

FIG. 8 shows an example of a group of logic circuits arranged based on an idea similar to that of the circuit shown in FIGS. 1 and 5. FIG. 9 shows a symbol diagram thereof. In these figures, a numeral INV1 designates a single-output inverter and corresponds to the NPN transistor Q1, an injection current supply device connected to the base and collector of the NPN transistor Q1, e.g., the resistors R1, R2, the PMOS transistor P1, the NMOS transistor N1 and the like.

A numeral INV designates a single-output inverter and corresponds to the NPN transistor Q2 and an injection current supply device connected to the base and collector of the NPN transistor Q2, e.g., the resistors R4, R4 and the PMOS transistor P2, the NMOS transistors N2, N3 and the like.

Further, a two-input NOR gate composed of inverters INV3 and INV4 and an AND gate 1 corresponds to the NPN transistor Q3, Q4, an injection current supply device connected to the node where the collector of the NPN transistor Q3 is connected to the collector of the NPN transistor Q4 and to the node where the bases of the NPN transistors Q3, Q4 are connected to the collectors of the NPN transistors Q3, Q4, e.g., the resistors R2, R5, the resistor R3, the PMOS transistors P1, P2, P3 and P4 and the NMOS transistors N1, N3, and N4.

The inverter INV4 is a two-output inverter and the output thereof not connected to the NPN transistor Q3 corresponds to the NPN transistor Q4, an injection current supply device connected to the base and collector of the NPN transistor Q4, e.g., the resistors R5, R6, the PMOS transistors P2 and P5, and the NMOS transistors N2 and N5. Inverters INV5 and INV6 are arranged in the same way.

The resistor R1 connected between a power supply terminal 5 and the base of the NPN transistor Q1 is set such that a minimum current is supplied to keep the NPN transistor Q1 in the ON state. The other resistors R2, R3 and R4, R5 and R6 are set in the same way. The PMOS transistor P1, NMOS transistor N1 and the like serve as an injection current control device. Although the source of the PMOS transistor P1 is connected to the power supply terminal 5, it may be connected to a power supply terminal having a higher potential, if necessary. This can be applied to the other injection current control devices. Note, although not shown, when the number of logics is increased, the NPN transistor and injection current supply device are connected to the base of the NPN transistors Q1, Q2 and the collectors of NPN transistors Q5, Q6, in the same way.

Figure 10:
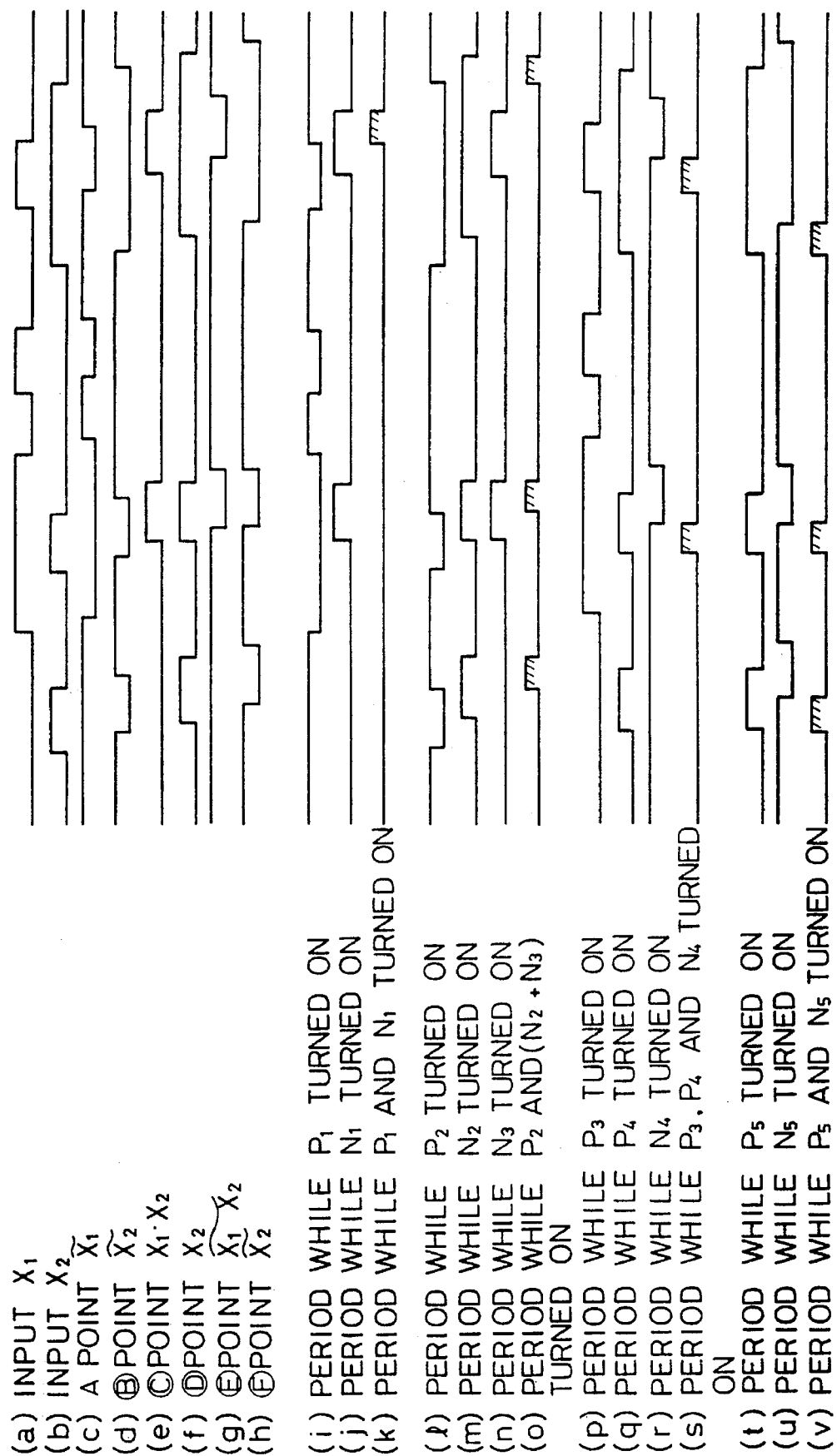
FIG. 10 is a timing chart showing the operating state of the group of the logic circuits shown in FIG. 8.

FIG. 10 is a timing chart showing the operating conditions of the group of the logic circuits shown in FIG. 8. In FIG. 10, when an input X2 goes to a high level, the NPN transistor Q2 is turned ON, the potential of the point B serving as the collector thereof drops, and the NPN transistor Q4 is turned OFF. When the NPN transistor Q4 is turned OFF, an injection current is supplied at least by the resistor 6 and the like, the potential of point D rises, the NPN transistor Q6 is turned ON and the potential of a point F drops.

Further, when the NPN transistor is turned OFF, the potential of the point C is determined by the state of the NPN transistor Q3. More specifically, when the NPN transistor Q3 is also turned OFF, the injection current is supplied at least by the resistor R3 and the potential of the point C is at the high level, and when the NPN transistor Q3 is turned ON, the potential of the point C is at the low level. The relationship between the output C and inputs A and B is represented by a two-input NOR logic.

On the other hand, when the input X2 goes to a low level and the NPN transistor Q2 is turned OFF, the injection current is supplied at least by the resistor R5, the potential of the point B drops, and the NPN transistor Q4 is turned ON. When the NPN transistor Q4 is turned ON, the potential of the point D as high as that of the point D drops and the NPN transistor Q6 is turned OFF. The potential of the point C goes to the low level regardless of the state of the NPN transistor Q3 and the NPN transistor Q5 is also turned OFF. Although not shown, when the NPN transistor Q5, Q6 are turned OFF, the injection current is supplied and the potentials of the points E, F rise.

When the other input X1 goes to the high level, the NPN transistor Q1 is turned ON, the potential of the point A as high as that of the collector of the NPN transistor Q1 drops, and the NPN transistor Q3 is turned OFF. When the NPN transistor Q3 is turned OFF, the potential of the point C is determined by the state of the NPN transistor Q4. More specifically, when the NPN transistor Q4 is also turned OFF, the injection current is supplied at least by the resistor R5, and thus the potential of the point C is at the high level, when the NPN transistor Q4 is turned ON, the potential of the point C is at the low level. When the point C is at the high level, the NPN transistor Q5 is turned ON and the point E goes to the low level.

Conversely, although not shown, when the point C is at the low level, the NPN transistor Q5 is turned OFF and the point E goes to the high level by being supplied with the injection current.

On the other hand, when the input X goes to the low level and the NPN transistor Q1 is turned OFF, the injection current is supplied at least by the resistor R2, the potential of the point A rises, and the NPN transistor Q3 is turned ON the potential of the point C goes to the low level regardless of the state of the NPN transistor Q4 and the NPN transistor Q5 is turned OFF. Although not shown, when the NPN transistor Q5 is turned OFF, the injection current is supplied and the potential of the point E rises.

The X1 is connected to the gate of the PMOS transistor P1 and the point C is connected to the gate of the NMOS transistor N1. Therefore, when the input X1 goes to the low level, the PMOS transistor P1 is turned ON. At this time, when the NPN transistor Q4 is in the OFF state (the potential of the point B is at the low level), the potential of the point C is at the high level until a signal is transmitted thereto, and thus the NMOS transistor N1 is also in the ON state. As a result, a large injection current is supplied through the PMOS transistor P1 and the NMOS transistor N1 and the potential of the point A quickly goes to the high level. When the potential of the point A goes to the high level, the potential of the point C drops, and thus the NMOS transistor N1 is turned ON so that an excessive injection current is prevented from being supplied to the NPN transistor Q3. That is, the NPN transistor Q3 is prevented from being deeply saturated. Further, a power consumption can be reduced.

Conversely, when the input X1 goes to the low level, the PMOS transistor P1 is turned ON, and then the NPN transistor Q4 is turned ON (the potential of the point B is at the high level), the potential of the point C is at the low level, and thus the NMOS transistor N1 is turned OFF. In this case, since the potential of the point C is already at the low level, the potential of the point A is not needed to be quickly risen.

Further, when the input X1 goes to the high level and the potential of the point A is dropped by the NPN transistor Q1, the PMOS transistor Q1 is turned OFF and a large injection current is not supplied, and thus the potential of the point A can be quickly dropped. Further, a power consumption can be reduced.

Next, the point A is connected to the gate of the PMOS transistor P3, the point B is connected to the gate of the PMOS transistor P4, and the point E is connected to the NMOS transistor N4. Therefore, when the points A and B go to the low level, the PMOS transistors P3 and P4 are turned ON. At this time, since the point E is at the high level until a signal is transmitted thereto, and thus the NMOS transistor N4 is also in the ON state. As a result, a large injection current is supplied through the PMOS transistors P3, P4 and the NMOS transistor N4 and the potential of the point C quickly goes to the high level. When the potential of the point C goes to the high level, the potential of the point E drops, and thus the NMOS transistor N4 is turned OFF so that an excessive injection current is prevented from being supplied to the NPN transistor Q5. That is, the NPN transistor Q5 is prevented from being deeply saturated. Further, a power consumption can be reduced. When the potential of the point A or B goes to the high level, the PMOS transistor P3 or P4 is turned OFF and a large injection current is not supplied, and thus the potential of the point C can be quickly dropped. Further, a power consumption can be reduced. The other elements operate in the same way. That is, a control is performed such that the injection current supply device composed of the MOS transistor is turned ON only at the timing that the base potential of the NPN transistor must be quickly risen so that the injection current is risen.

According to this embodiment, since a signal amplitude can be reduced to about 0.6 V in the same way as the IIL circuit, and further the injection current is controlled such that it is increased when necessary and decreased when not necessary, an IIL type circuit operating at a high speed with a low power consumption can be obtained.

Figure 11:
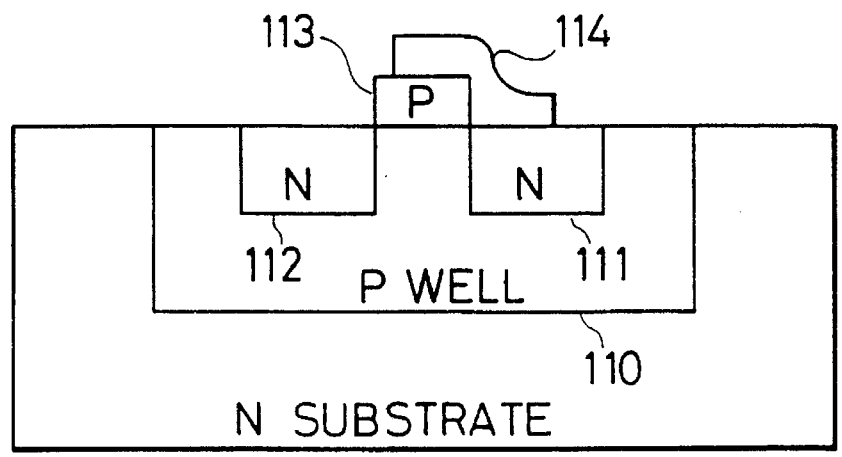
FIG. 11 is a diagram of the device structure of an NPN transistor having a multi-collector in FIGS. 5 and 8.
Figure 12:
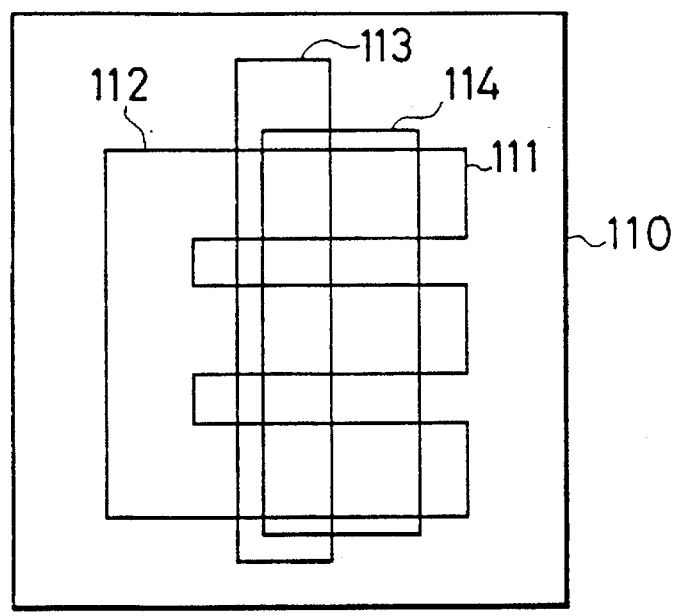
FIG. 12 is a plan view of the device shown in FIG. 11.

FIG. 11 shows a device arrangement diagram of an NPN transistor having a multi-collector of FIGS. 5 and 8. FIG. 12 is a plan view of the device. A lateral NPN transistor having a collector 111, emitter 112 and base 113 is formed in the P well 110 of an N type substrate. A numeral 114 is a metal forming a Schottky barrier diode at the boundary with the collector 111. In this example, there are provided three collectors.

According to this embodiment, since an IIL type logic circuit can be arranged by using the lateral NPN transistor of high performance without using an reversely connected NPN transistor used in a usual IIL circuit, a high speed IIL type circuit can be obtained.

Figure 13:
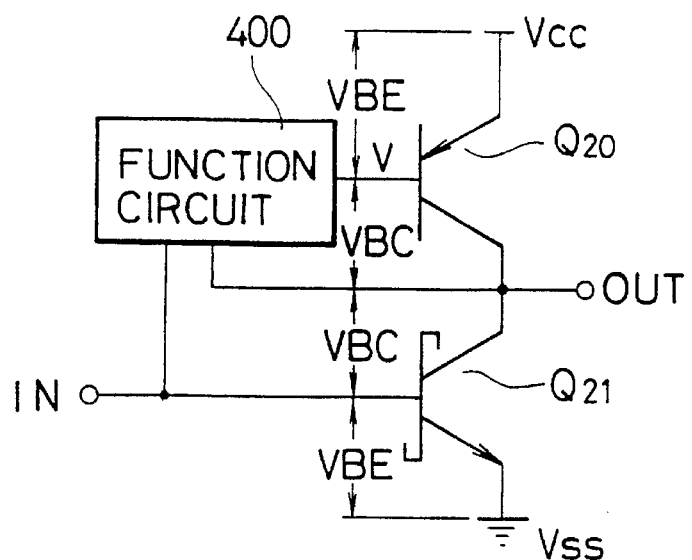
FIG. 13 is a circuit diagram showing the basic arrangement of an example of the IIL circuit according to this invention.
Figure 14:
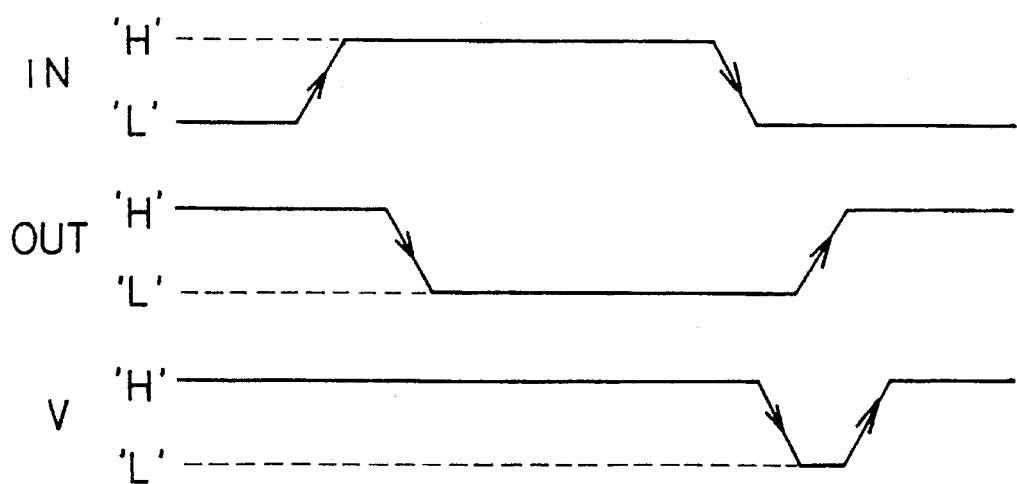
FIG. 14 is a timing chart showing the operating state of the IIL circuit shown in FIG. 13.

FIG. 13 shows the basic circuit of another embodiment of the IIL circuit according to the this invention. The reason why a steady-state current is produced in the IIL circuit is that the base potential of a PNP bipolar transistor Q20 is at a low level potential at all times, i.e., the bipolar transistor Q20 is turned ON at all times. Therefore, the collector current of the PNP bipolar transistor Q20 need only be risen only when an output terminal OUT changes from a low level potential to a high level potential in order to reduce the steady-state current. More specifically, an injection current variable type iiL circuit must be employed in which the collector current of the PNP bipolar transistor Q20 is changed depending upon the state of an input terminal IN and the output terminal OUT. FIG. 2 shows the aforesaid by using a base potential V. The base potential V of the PNP bipolar transistor Q20 goes to the low level potential when an input is dropped from the high level potential to the low level potential, and goes to the low level potential when the input is changed from the low level potential to the high level potential. The steady-state current is greatly reduced and thus a power consumption is reduced by the change of the potential. A numeral 40 in FIG. 13 shows a function circuit for realizing the base potential V shown in FIG. 14. More specifically, the input signal and output signal of a logic circuit serves as an input signal to the function circuit 400 and the output from the function circuit 400 realizes the base potential V shown in FIG. 14. Examples of an actual function circuit will be described in FIG. 15 and thereafter. Further, the amplitude of the base potential V may be smaller than that of an I/O signal, i.e., a logical amplitude. That is, it is sufficient to suitably drop the collector current of the PNP bipolar transistor. A substantial value thereof is represented by the following formula and a sufficient value is about an amplitude 0.4 V.

$$VCC-VBE-0.2<V<VCC-VBE+0.2$$

Although the aforesaid is a means for reducing a power consumption, it is necessary that a bipolar transistor constituting an output stage not be saturated to simultaneously realize the reduced power consumption and the operation at a high speed. For this purpose, an NPN bipolar transistor Q21 having a collector provided with a clamp Schottky diode is used as a bipolar transistor for pulling down the potential of the output terminal OUT. However, as shown in FIG. 11, when a steady-state current can be flown to the degree that the NPN bipolar transistor is not saturated even if the output terminal OUT is at the low level potential, the clamp Schotty diode is not necessary and a usual NPN bipolar transistor Q27 may be used.

An embodiment having an inverter circuit to which the IIL circuit according to this invention is applied will be described below.

Figure 15:
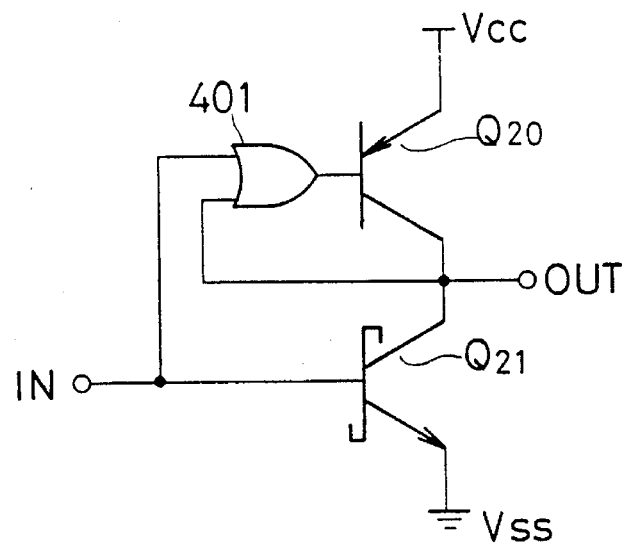
FIG. 15 is a circuit diagram expressing a specific example of the IIL circuit shown in FIG. 13 by using a logic symbol.

FIG. 15 shows an example using an OR circuit 401 as an example of the function circuit 400 in the basic circuit of the ILL circuit shown in FIG. 13. The OR circuit 401 causes the base potential V of the PNP bipolar transistor Q20 to be at the low level potential when both signals of the input terminal IN and output terminal OUT of the inverter circuit are at the low level potential and at the high level potential when any one of the signals is at the high level potential, and thus the base potential shown in FIG. 14 can be obtained.

Figure 16:
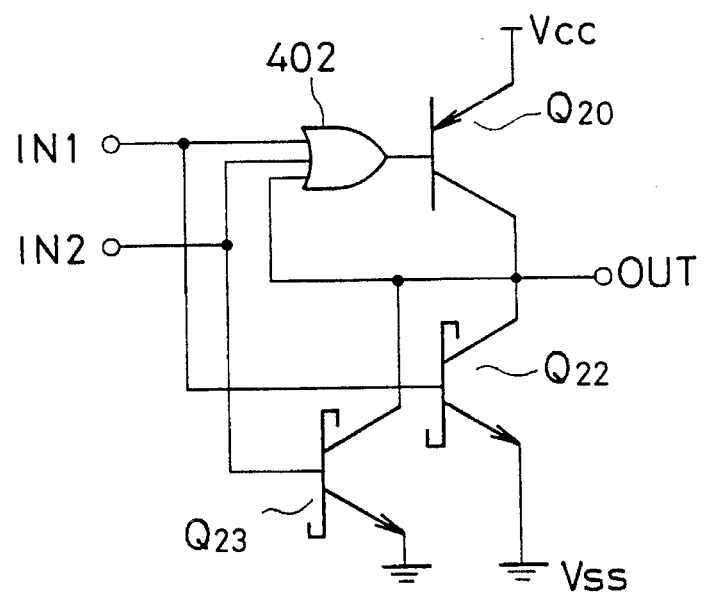
FIG. 16 is a circuit diagram showing an embodiment in which the circuit shown in FIG. 15 is applied to a NOR circuit.

FIG. 16 shows an example having a two-input NOR circuit to which the IIL circuit according to this invention is applied. In FIG. 16, a function circuit is composed of a three-input OR circuit 402. The three-input OR circuit 402 is at the low level potential when all of the input terminals IN1 and IN2 and output terminal OUT thereof are at the low level potential and at the high level potential when any one of them is at the high level potential. The potential of the output terminal OUT is dropped by connecting Schotty clamp NPN bipolar transistors Q22, Q23 in parallel.

Figure 17:
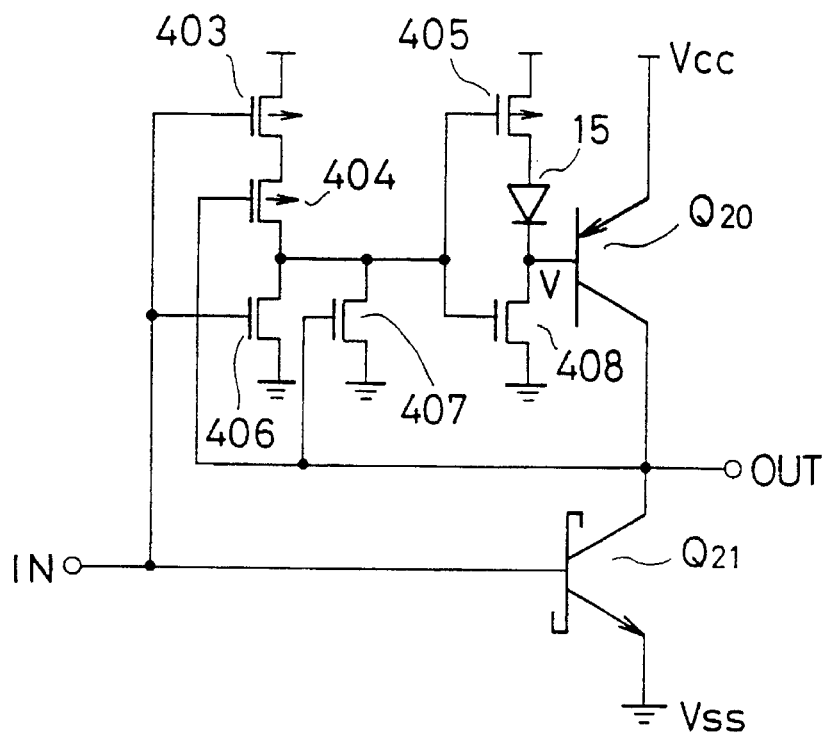
FIG. 17 is a circuit diagram showing a specific example in which the circuit shown in FIG. 15 is composed of bipolar transistors, MOSFETs and a diode.

FIG. 17 shows an example of an inverter circuit having the OR circuit 401 of FIG. 15 composed of a MOSFET. The OR circuit 401 is composed of a CMOS NOR gate and CMOS inverter. In this example, the logic threshold value voltage (hereinafter, referred to as VLT) of the NOR circuit is set higher than VCC/2 and the VLT of the inverter circuit is set lower than VCC/2 in order to increase the rising time of an output terminal OUT. Further, a diode 409 is inserted between the P channel MOSFET 405 of the inverter circuit and the base of the PNP bipolar transistor Q20. The diode 409 has a rising voltage of about 0.7 V. The diode 409 is inserted for the purpose that when the PNP bipolar transistor Q20 is turned OFF, it is not perfectly turned OFF (that is, a base potential is not made to VCC) and the base potential is kept to a value just before the PNP bipolar transistor Q20 is perfectly turned ON. More specifically, although a base potential for causing the PNP transistor Q20 to be turned ON is about (VCC−0.8) V, in this case it is kept at (VCC−0.7) V. Further, the built-in potential of the Schotty diode of the Schotty clamp NPN bipolar transistor Q21 is set to a value about 0.1 V lower than the built-in potential between the base and collector (hereinafter, referred to as VBC) of the NPN bipolar transistor Q21. In this example, it is about 0.5 V. When the VCC is 1.5 V, the I/O signal level (logic amplitude) of the inverter circuit is about 0.3 V at the low level potential and about 0.8 V at the high level potential, and the base potential V is also about 0.3 V at the low level potential and about 0.8 V at the high level potential, and thus the I/O signal level coincides with the base potential level. However, the amplitude of the base potential may be lower than the amplitude of the logic signal.

Figure 18:
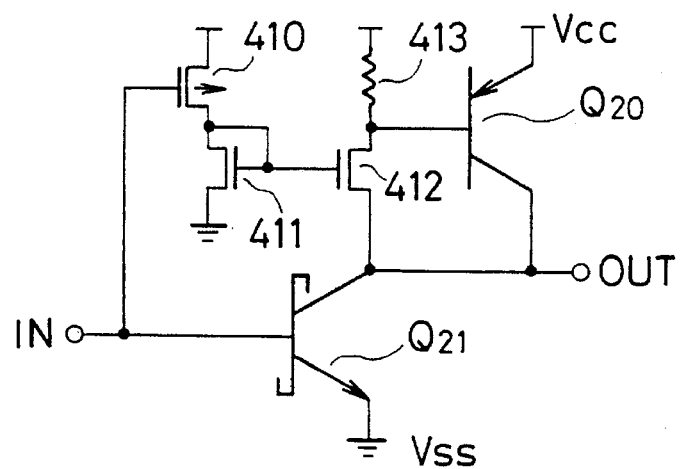
FIG. 18 is a circuit diagram showing another example of the IIL circuit shown in FIG. 13 using a current mirror circuit.

FIG. 18 is an example using a current mirror circuit to the function circuit. When the potential of an input terminal IN goes to the low level potential, the drain current of a P channel MOSFET 410 is risen and the drain currents of N channel MOSFETs 411, 412 are risen. That is, the base current of the PNP bipolar transistor Q20 is risen. On the other hand, the potential of an output terminal OUT goes to a high level, the N channel MOSFETs 411, 412 are turned OFF or the drain current is dropped.

Figure 19:
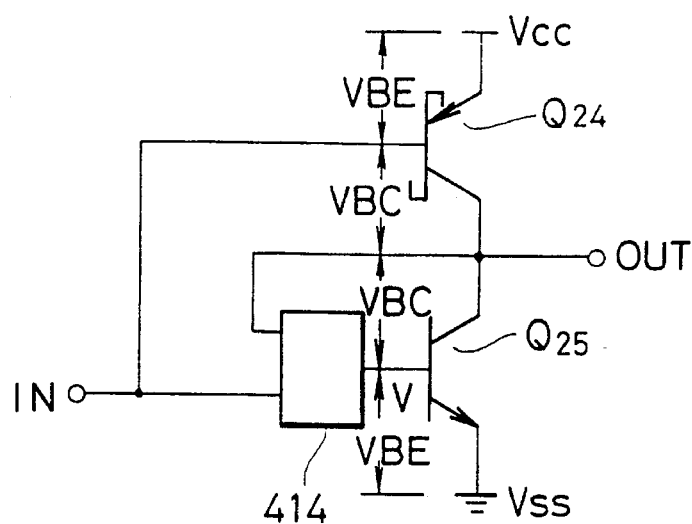
FIG. 19 is a circuit diagram showing the basic arrangement of another example of the IIL circuit according to this invention.
Figure 20:
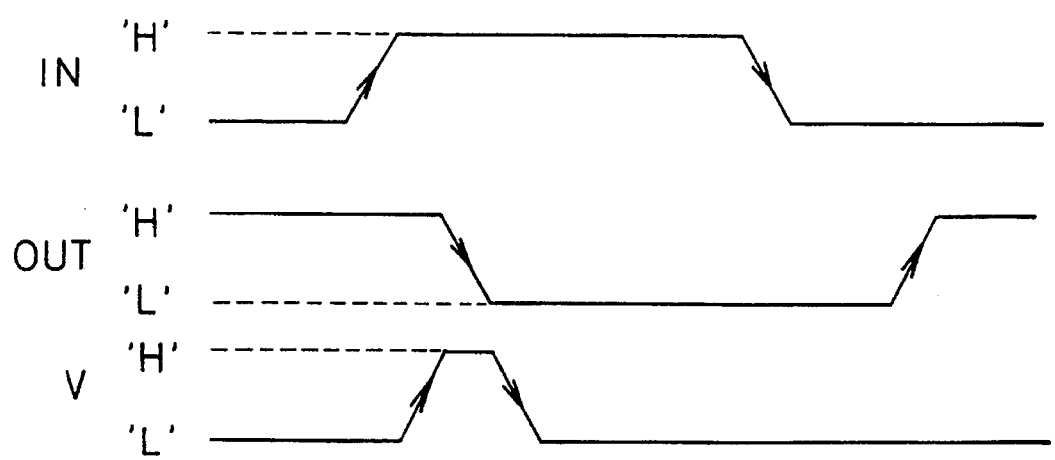
FIG. 20 is a timing chart showing the operating state of the IIL circuit shown in FIG. 19.

FIG. 19 shows a modified example of the basic circuit of FIG. 13. The function circuit 400 for controlling the base potential is used to the PNP bipolar transistor Q20 in FIG. 13, but, on the contrary, in this example, a function circuit 414 for controlling the base potential is used to an NPN bipolar transistor Q25 serving as a bipolar transistor for pulling-down an output terminal OUT. This example intends to change the output from the function circuit 414 to a high level potential only when the potential of an input terminal IN changes from a low level to a high level and the potential of the output terminal OUT changes from the high level to the low level in order to reduce a power consumption. FIG. 20 shows the timing chart of the NPN bipolar transistor Q25 together with the input signals at the input terminal IN and output terminal OUT with the base potential of the NPN bipolar transistor Q25 set to V. To simultaneously reduce a power consumption and increase an operating speed, a PNP bipolar transistor Q24 having a collector provided with a clamp Schotty diode is used to prevent a bipolar transistor constituting an output stage from being saturated, in the same way as the case of FIG. 13.

Figure 21:
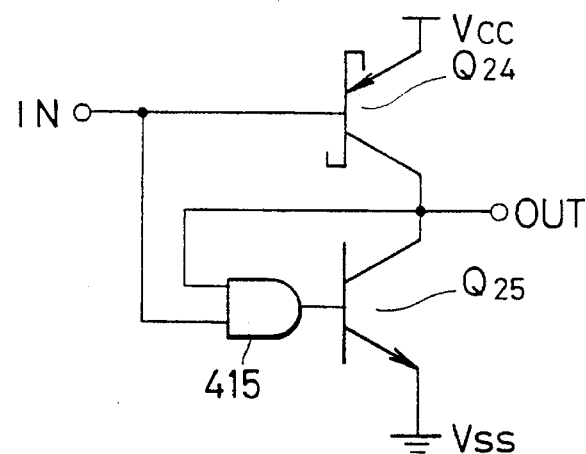
FIG. 21 is a circuit diagram realizing the IIL circuit shown in FIG. 19 by using logic symbols.

FIG. 21 shows an example using an AND circuit 415 as an example of the function circuit 414 in the basic circuit in shown in FIG. 19. The AND circuit 415 causes the base potential V of the NPN bipolar transistor Q25 to be at the high level potential when both signals of the input terminal IN and output terminal OUT of the inverter circuit are at the high level potential and at the low level potential when any one of the signals is at the low level potential, and thus the base potential V shown in the timing chart of FIG. 20 can be obtained.

Figure 22:
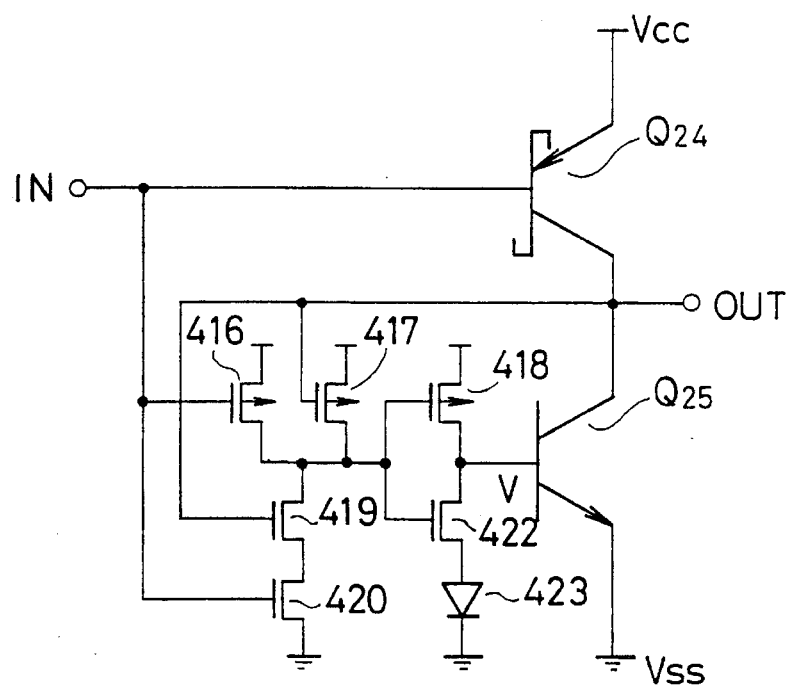
FIG. 22 is a circuit diagram showing a specific example in which the IIL circuit shown in FIG. 21 is composed of bipolar transistors, MOSFETs and a diode.

FIG. 22 shows an example of an inverter circuit having the AND circuit 415 of FIG. 21 composed of a MOSFET. The AND circuit 415 is composed of a CMOS NAND gate and CMOS inverter. The VLT of the NAND gate is set lower than VCC/2 and the VLT of the inverter is set higher than VCC/2 in order to increase the rising time of an output terminal OUT. A diode 423 is inserted between the N channel MOSFET 422 of the inverter constituting the AND circuit 415 and a ground potential (hereinafter, referred to as VSS) for the purpose similar to the case of FIG. 17. When the VCC is set to 1.5 V, the I/O signal level (logic amplitude) of the inverter circuit is about 0.3 V at the low level potential and about 0.8 V at the high level potential, and the base potential V is also about 0.3 V at the low level potential and about 0.8 V at the high level potential, and thus the I/O signal level coincides with the base potential level.

Figure 23:
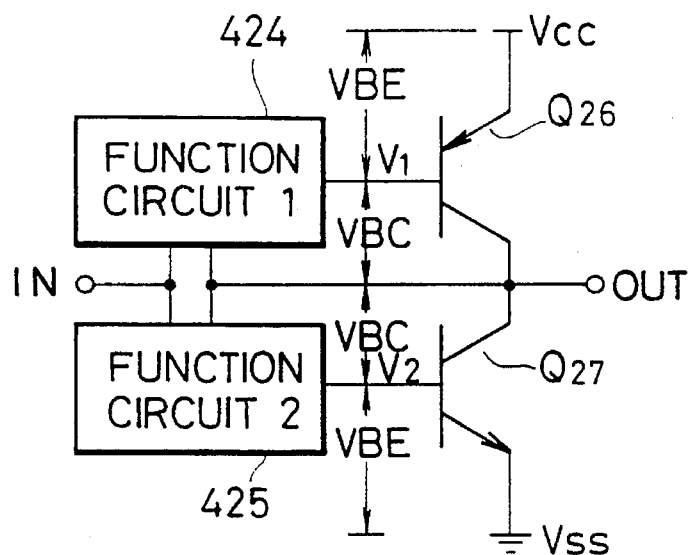
FIG. 23 is a circuit diagram showing the basic arrangement of a further embodiment of the IIL circuit according to this invention.
Figure 24:
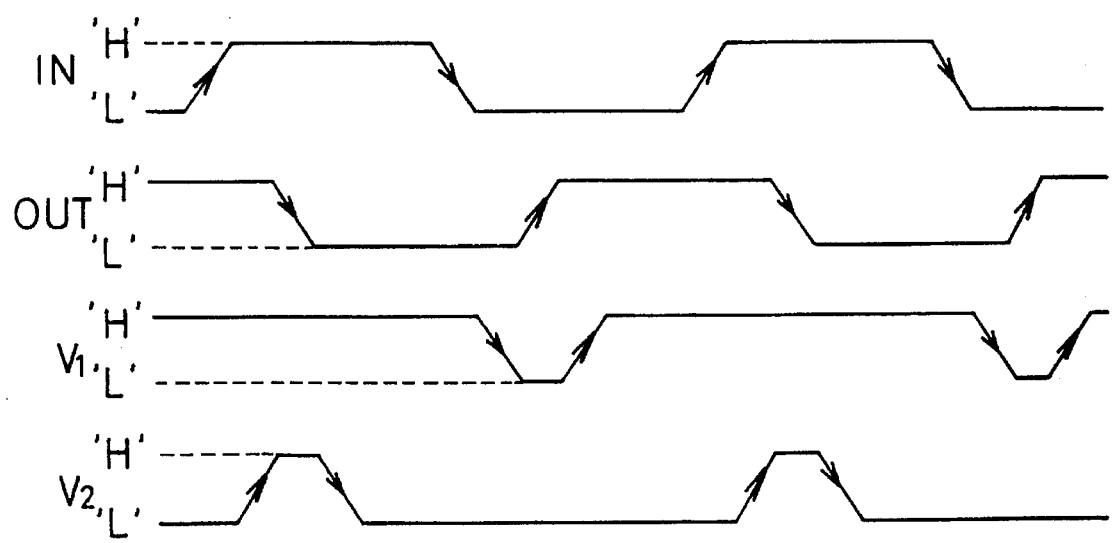
FIG. 24 is a timing chart showing the operating state of the IIL circuit shown in FIG. 23.

FIG. 23 shows a modified example of the basic circuit of FIG. 13. That is, the function circuit 400 for controlling the base potential is used only to the PNP bipolar transistor Q20 in FIG. 13, but, in this example, a function circuit 425 having a similar arrangement is also used to the NPN bipolar transistor Q27 serving as a pull-down bipolar transistor. FIG. 12 shows the timing chart of the PNP bipolar transistor Q26 and the NPN bipolar transistor Q27 together with the input signals at the input terminal IN and output terminal OUT with the base potentials of the PNP bipolar transistor Q26 and the NPN bipolar transistor Q27 set to V1, V2. The potential V1 is the same as the base potential V in FIG. 14 and the potential V2 is at the high level potential when both the I/O signals of the I/O terminals IN and OUT are at the high level potentials and at the low level potential when any one of them is at the low level potential.

Figure 25:
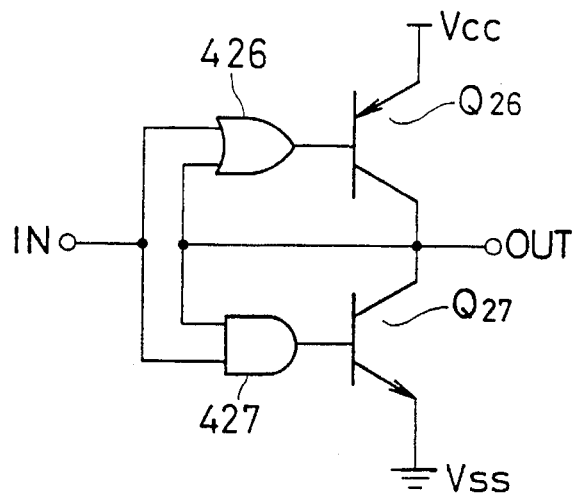
FIG. 25 is a circuit diagram expressing the IIL circuit shown in FIG. 23 by using logic symbols.

FIG. 25 shows an example of the function circuits 424, 425 of FIG. 23 composed of an OR circuit 426 and AND circuit 427 in the same way as FIG. 15. The voltage shown in FIG. 24 can be obtained by these circuits.

Figure 26:
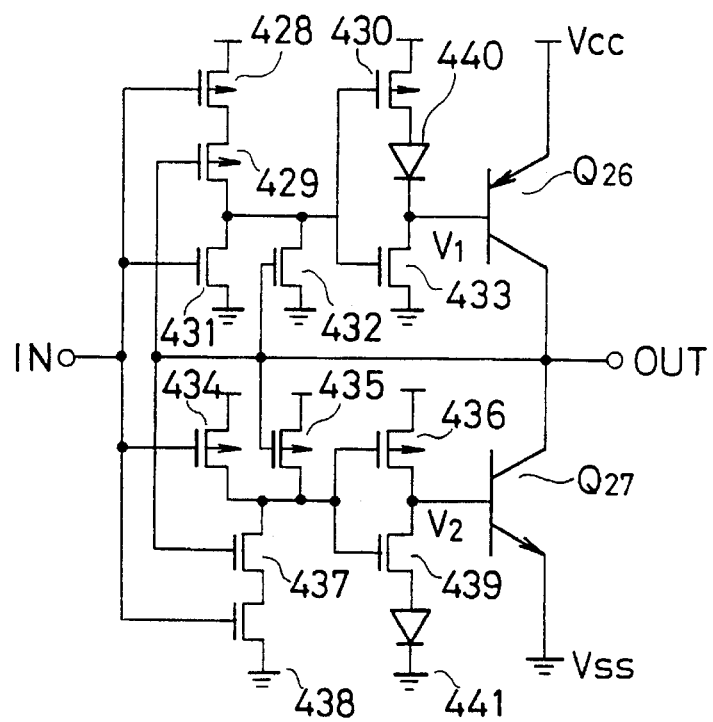
FIG. 26 is a circuit diagram showing a specific example in which the IIL circuit shown in FIG. 25 is composed of bipolar transistors, MOSFETs and a diode.

FIG. 26 shows an example of the OR 426 and the AND circuit of FIG. 25 composed of a CMOS NOR gate and CMOS inverter, and a CMOS NAND gate and CMOS inverter, respectively, in the same way as FIG. 17. The VLT of the CMOS NOR gate and the CMOS inverter constituting the OR circuit 426 is the same as the case of FIG. 17, and with respect to the CMOS NAND gate and CMOS inverter constituting the AND circuit 427, the VLT of the NAND gate is set lower than VCC/2 and the VLT of the inverter is set higher than VCC/2 to increase the falling speed of the potential of an output terminal OUT. A diode 441 is inserted between the N channel MOSFET 439 of the inverter constituting the AND circuit 427 and a ground potential VSS for the purpose similar to the case of FIG. 17. When the VCC is set to 1.5 V, the I/O level of the inverter of this example and V1 and V2 have the following values. The I/O level is 0 V (VSS) at the low level potential and 1.5 V (VCC) at the high level potential; V1 is 0.7 V at the low level potential and 1.2 V at the high level potential; and V2 is 0.3 V at the low level potential and 0.8 V at the high level potential.

Figure 27:
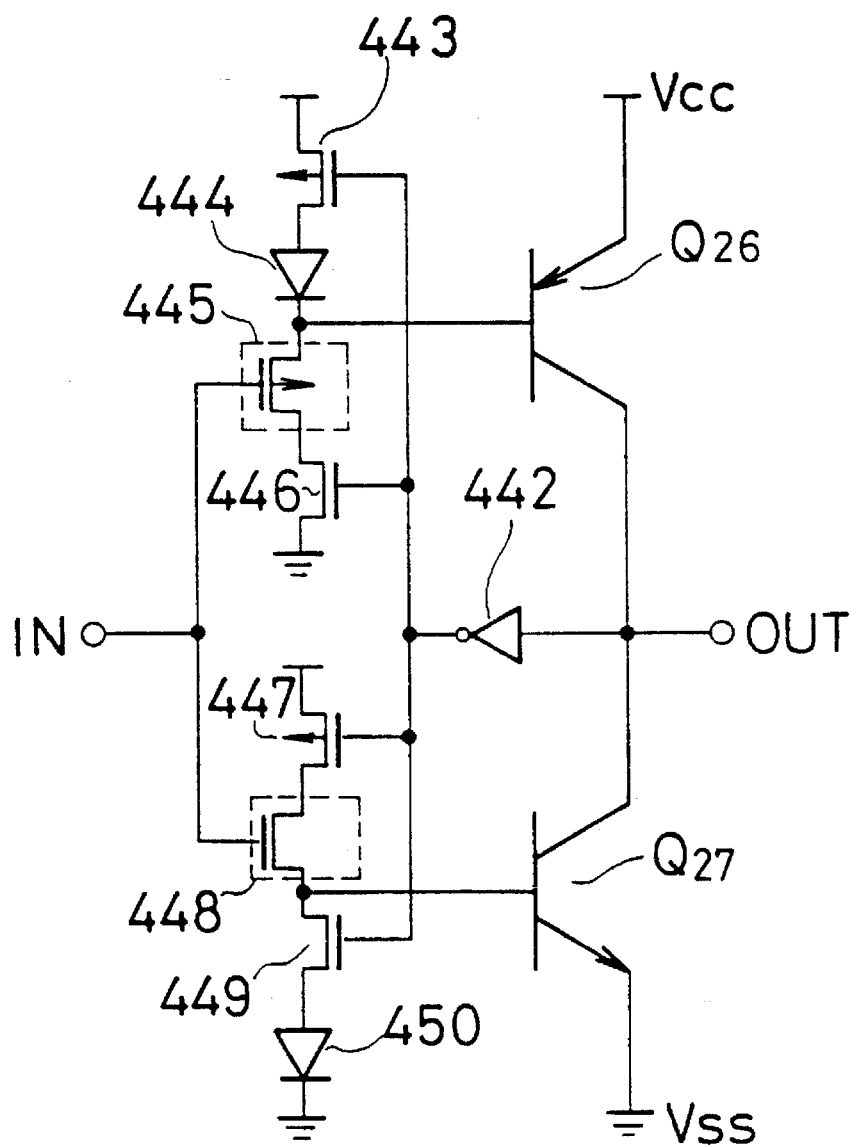
FIG. 27 is a circuit diagram showing a further example of the IIL circuit shown in FIG. 23.
Figure 28:
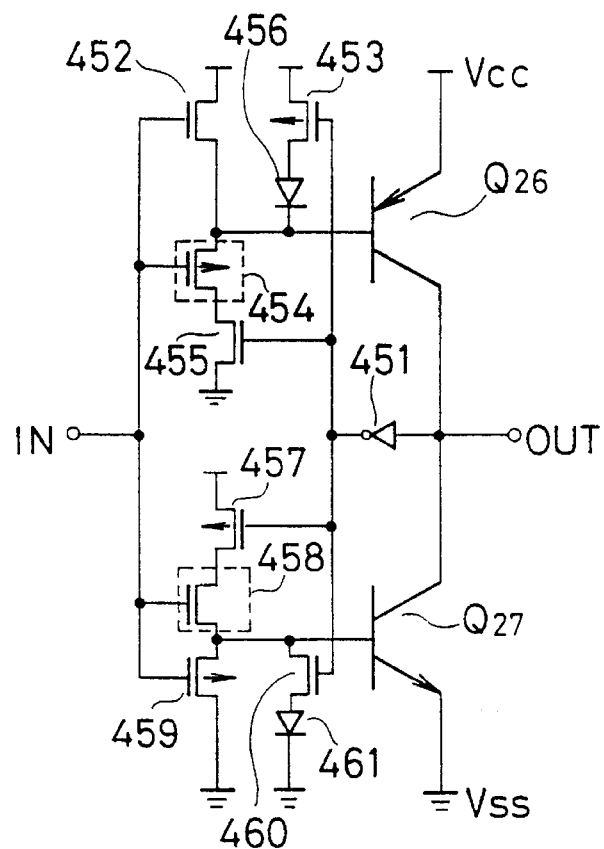
FIG. 28 is a circuit diagram showing a still example of the IIL circuit shown in FIG. 23.

The MOSFETs constituting the function circuits in FIGS. 17 and 26 are depletion type MOSFETs. In this case, two logic stages are necessary to constitute an OR circuit and AND circuit, and thus a single stage of the inverter is composed of three stages including the bipolar transistor, which is disadvantageous as to a high speed because the CMOS inverter is composed of a single stage. FIGS. 27 and 28 show examples of gate circuits which receive an input signal through depletion type P channel and N channel MOSFETs as a means for solving the above problem. In both FIGS. 27 and 28, a signal input to the input terminal IN of the inverter circuit of the two inputs of the function circuit is received by depletion type MOSFETs 445 (454) and 448 (458), and a signal output from an output terminal OUT is inverted by an inverter circuit 442 (451) and received by MOSFETs 443 (453), 447 (457), 446 (445), 449 (460). The function circuit in this circuit arrangement is composed of a single stage and thus a higher speed can be expected in spite of that this circuit is arranged in the same way as that of a conventional BiCMOS gate circuit. Note, the VLTs of the depletion type N channel and P channel MOSFETs must be smaller than the VBE of the NPN and PNP bipolar transistors, respectively. In this example, a N channel is set to −0.7 V or less; and a P channel is set to 0.7 V or less.

Figure 29:
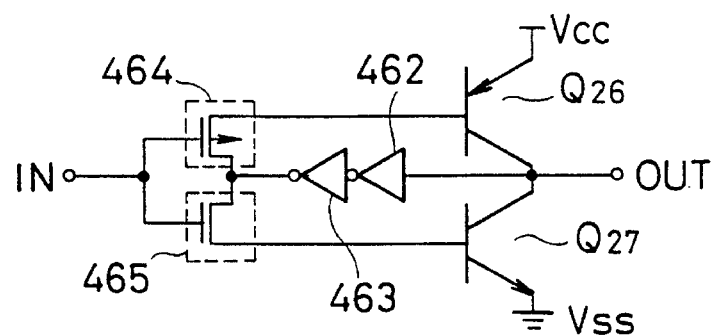
FIG. 29 is a circuit diagram showing a modified example of the IIL circuit shown in FIG. 23.

FIG. 29 shows an example in which an input signal is received by depletion type MOSFETs 464 and 465 in the same way as FIGS. 27 and 28, and a signal similar to that output from an output terminal OUT is fed back to depletion type MOSFETs 454 and 458. The operation of this circuit is the same as that shown in FIG. 28.

Figure 30:
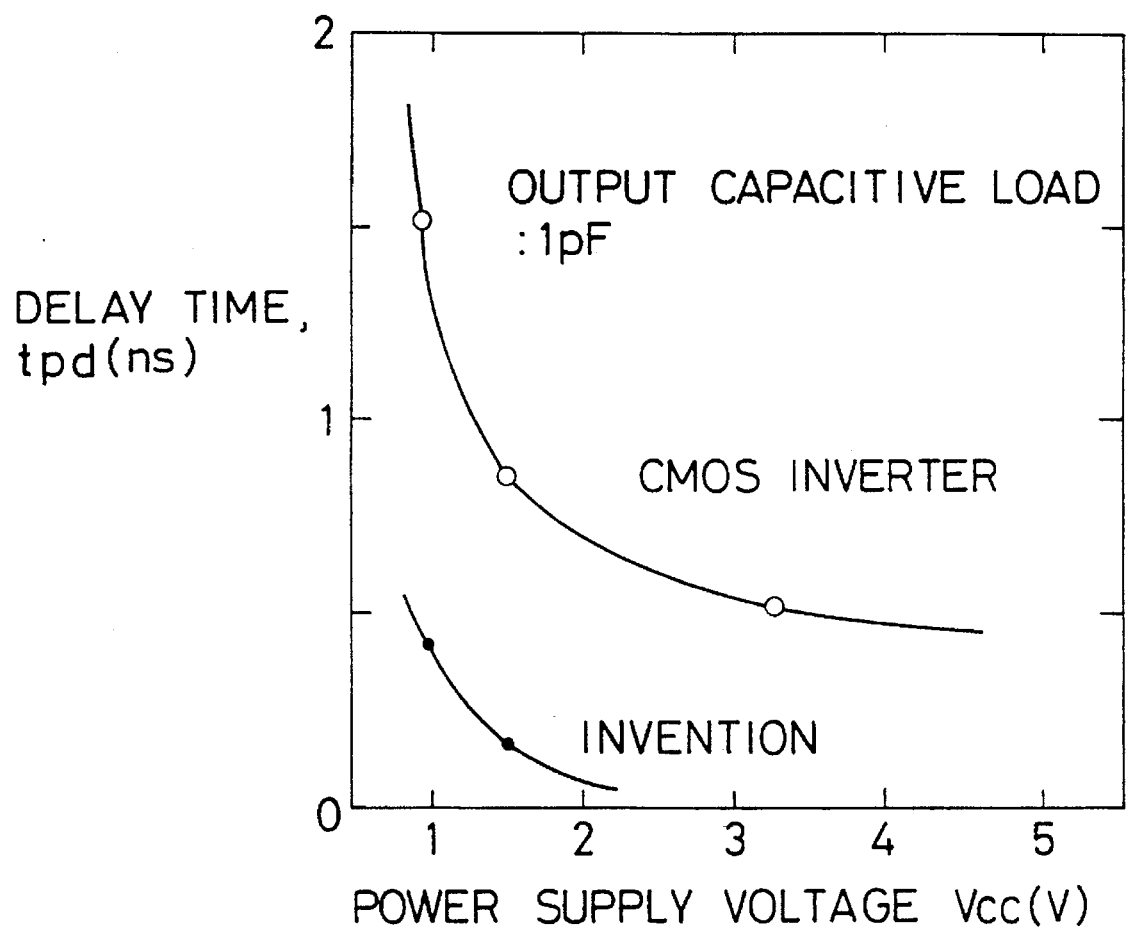
FIG. 30 is a diagram explaining the result of simulation of the relationship between a power supply voltage and a delay time in the example shown in FIG. 27.

In the examples shown above, a high speed gate circuit can be expected at a low power supply voltage of 1.5 V or lower, and FIG. 30 shows the result of the simulation actually effected to the example shown in FIG. 27. The result of this calculation shows the relationship between $V_{cc}$ and a delay time tpd with the result of the CMOS inverter for reference. A device design rule is the same as to the both devices, and it is apparent that the device of this invention operates at a speed about four times higher than that of the CMOS inverter at a low voltage of 1.5 V or lower. As described above, according to this embodiment, a high speed operation can be achieved at a low voltage.

Second Embodiment (FIG. 31–FIG. 34)

Figure 31:
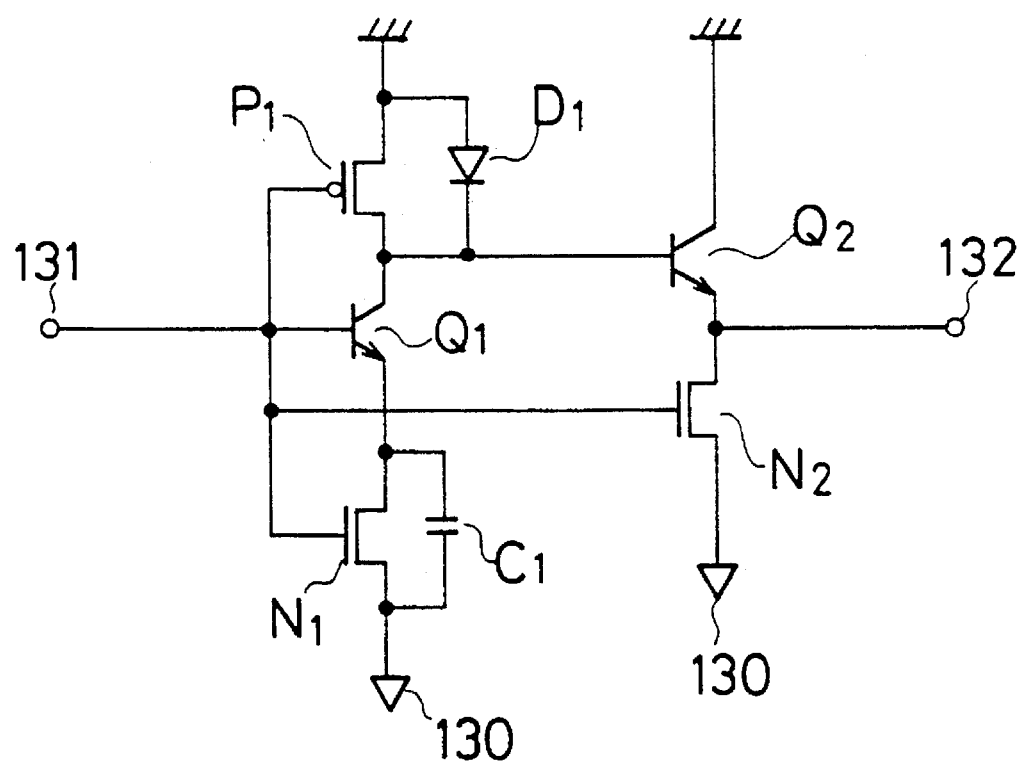
FIG. 31 is a circuit diagram showing the arrangement of an example of an NTL type inverter circuit according to this invention.

(2) FIG. 31 shows another embodiment of this invention or an NTL type inverter circuit. In FIG. 31, a PMOS transistor P1 having a gate connected to an input terminal 131, an NPN transistor Q1 having a base connected to the input terminal 131 and an NMOS transistor N1 having a gate connected to the input terminal 131 are disposed between a ground potential and a power supply terminal 130, a diode D1 is connected between the source and the drain of the PMOS transistor P1, and a capacitor C1 is connected between source and the drain of the NMOS transistor N1 as an initial stage. An NPN transistor Q2 having a base connected to the collector of the NPN transistor Q1 is disposed between the ground potential and an output terminal 130 and an NMOS transistor N2 having a gate connected to the input terminal 131 is disposed between the an output terminal 132 and the power supply terminal 130 as an emitter follower output stage. Note, the power supply terminal 130 is set to −2 V and it is assumed that a logic high level is −0.8 V and a logic low level is −1.6 V.

In the above arrangement, when the potential of the input terminal 131 goes to the high level, the NPN transistor Q1 and NMOS transistor N1 are turned ON and the PMOS transistor P1 is almost turned OFF. Therefore, since a current flows from the ground potential to the power supply terminal 130 through the diode D1, NPN transistor Q1 and NMOS transistor N1, the collector potential of the NPN transistor Q1 goes to −0.8 V. As a result, although the potential of the output terminal 132 goes to −1.6 V (the low level), at this time, it quickly goes to the low level because the NMOS transistor N2 is turned ON to thereby reduce a resistance.

On the other hand, when the input terminal 131 goes to the low level, the PMOS transistor P1 is turned ON, and the NPN transistor Q1 is turned OFF at once because the emitter potential thereof is suppressed by the capacitor C1. Therefore, the collector potential of the NPN transistor Q1 quickly goes to substantially 0 V. As a result, although the potential of the output terminal 132 goes to −0.8 V (high level), at this time it quickly goes to this level because the NMOS transistor N2 is turned OFF to have an increased resistance.

When the ON resistance of the PMOS transistor P1 is set smaller than the resistance value between the ground potential and the collector of a usual NTL circuit, the increasing speed of the base potential of the NPN transistor Q2 can be improved.

Further, when the ON resistance of the NMOS transistor N2 is set smaller than the resistance value of the emitter follower unit of a usual NTL circuit, the falling speed of the potential of the output terminal 132 can be improved.

Further, when the OFF resistance of the NMOS transistor N2 is set larger than the resistance value of the emitter follower unit of a usual NTL circuit, the rising speed of the potential of the output terminal 132 can be improved. Further, a power consumption can be reduced.

According to this example, since an NTL type circuit can be arranged without using a resistor in the manufacturing process of a BiCMOS, a mask for making the resistor can be omitted and thus the process can be simplified. In addition, the charging and discharging time constant of a parasitic capacitance and load capacitance can be reduced by changing the resistance value of a MOS transistor, the operating speed of the NTL type circuit can be increased.

Figure 32:
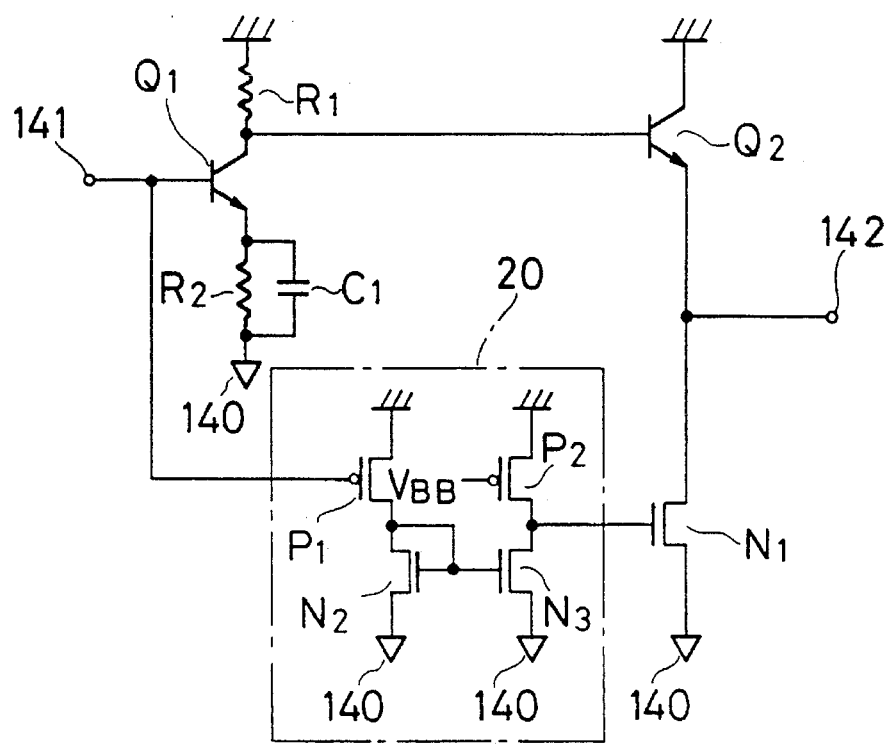
FIG. 32 is a circuit diagram showing the arrangement of another example of an NTL type inverter circuit according to this invention.

FIG. 32 shows another example of the NTL type inverter circuit according to this invention. In FIG. 32, a resistor R1, an NPN transistor Q1 having a base connected to an input terminal 141 and a resistor R2 are disposed between a ground potential and a power supply terminal 140, and a capacitor C1 is connected across the resistor R2, as an initial stage.

Further, an NPN transistor Q2 having a base connected to the collector of the NPN transistor Q1 is disposed between the ground potential and an output terminal 142 and an NMOS transistor N1 having a gate connected to a CMOS amplifier circuit 20 is disposed between the output terminal 142 and the power supply terminal 140, as an emitter follower output stage.

The CMOS amplifier circuit 20 is arranged such that a PMOS transistor P1 and NMOS transistor N2 are connected between the ground potential and the power supply terminal 140 and a PMOS transistor P2 and NMOS transistor N3 are connected therebetween. The gate of the PMOS transistor P1 is connected to an input terminal 141, the gate of the PMOS transistor P2 is connected to an intermediate level $V_{bb}$ between a logic high level and a logic low level, and the gate of the NMOS transistor N3 is connected to the gate of the NMOS transistor N2 and also to the drain thereof. The potential of the power supply terminal 140 is set to $-2$ V and it is assumed that the logic high level is $-0.8$ V and the logic low level is $-1.6$ V. When the potential of the input terminal 141 goes to the high level, the NPN transistor Q1 is turned ON and a current flows from the ground potential to the power supply terminal 140 through the resistor R1, NPN transistor Q1 and resistor R2. The resistance values of the resistors R1 and R2 are set so that the NPN transistor Q1 has a collector potential of $-0.8$ V. As a result, although the potential of the output terminal 142 goes to $-1.6$ V (the low level), at this time, it quickly goes to the low level because the output of the CMOS amplifier circuit 20 rises substantially to the ground potential and the NMOS transistor N is turned ON with the reduced resistance value of its internal resistor.

On the other hand, when the potential of the input terminal 141 goes to the low level, the NPN transistor Q1 is turned OFF at once because the emitter potential thereof is suppressed by the capacitor C1. Therefore, the collector potential of the NPN transistor Q1 quickly goes to substantially 0 V through the resistor R1. As a result, although the potential of the output terminal 142 goes to $-0.8$ V (high level), at this time it quickly goes to this level because the output of the CMOS amplifier circuit 20 is dropped substantially to a power supply potential or $-2$ V and the NMOS transistor N1 is turned OFF with the increased resistance value of its internal resistor.

When the ON resistance of the NMOS transistor N1 is set smaller than the resistance value of the emitter follower unit of a usual NTL circuit, the falling speed of the potential of the output terminal 142 can be improved.

Further, when the OFF resistance of the NMOS transistor N1 is set larger than the resistance value of the emitter follower unit of the usual NTL circuit, the rising speed of the potential of the output terminal 142 can be improved. In addition, a power consumption can be reduced.

Figure 33:
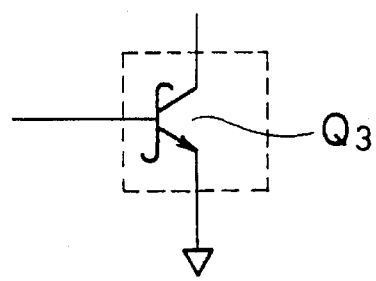
FIG. 33 is a circuit diagram showing an example in which the NMOS transistor of the emitter follower unit of the inverter circuit shown in FIG. 32 is replaced with an NPN transistor with a Schottky barrier diode.

FIG. 33 shows an example wherein the NMOS transistor N1 of the emitter follower unit of the inverter circuit shown in FIG. 32 is replaced with an NPN transistor Q3 with a Schottky barrier diode. The falling speed of the potential of the output terminal 142 can be further improved by the use of the bipolar transistor.

According to this example, since the charging and discharging time constants of a load capacitance can be reduced by increasing the amplitude of the gate voltage of a MOS transistor and changing the resistance value thereof or using a bipolar transistor, the operating speed of the NTL type circuit can be improved.

Figure 34:
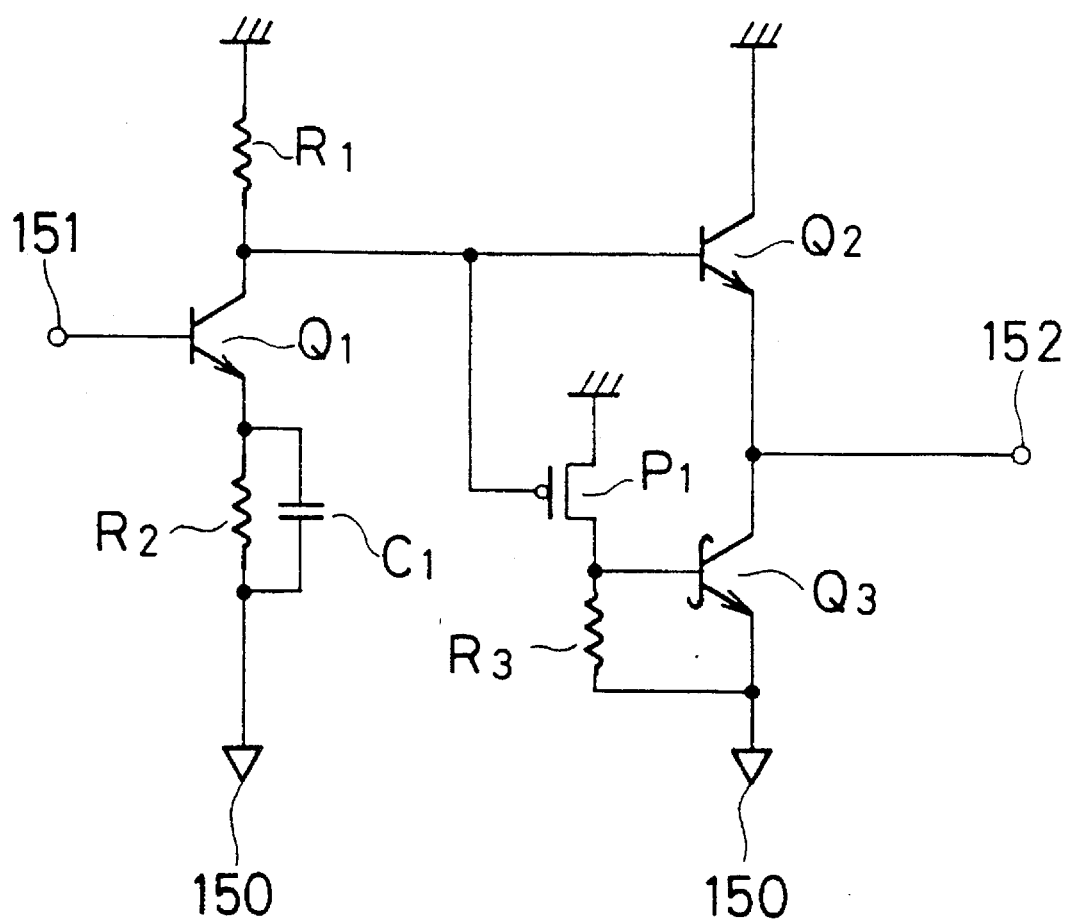
FIG. 34 is a circuit diagram showing the arrangement of a further example of an NTL type inverter circuit according to this invention.

FIG. 34 shows a further example of the NTL type inverter circuit according to this invention. In FIG. 34, a resistor R1, an NPN transistor Q1 having a base connected to an input terminal 151 and a resistor R2 are disposed between a first power supply terminal with a ground potential and a second power supply terminal 150, and a capacitor C1 is connected across the resistor R2, as an initial stage. An NPN transistor Q2 having a base connected to the collector of the NPN transistor Q1 is disposed between the first power supply terminal with the ground potential and an output terminal 152 and an NPN transistor Q3 having a Schottky barrier diode is disposed between the output terminal 152 an the second power supply terminal 150, as an emitter follower output stage.

Further, a PMOS transistor P1 having a gate connected to the collector of the NPN transistor Q1 is disposed between the first power supply terminal with the ground potential and the base of the NPN transistor Q3 and a resistor R3 is disposed between the base and emitter of the NPN transistor Q3. The potential of the second power supply terminal 150 is set to $-2$ V and it is assumed that a logic high level is $-0.8$ V and a logic low level is $-1.6$ V.

In the above arrangement, when the potential of the input terminal 151 goes to the high level, the NPN transistor Q1 is turned ON and a current flows from the first power supply terminal with the ground potential to the power supply terminal 150 through the resistor R1, NPN transistor Q1 and resistor R2. A resistance value is set so that NPN transistor Q1 has a collector potential of $-0.8$ V. Thus, the PMOS transistor P1 is turned ON and a base current is supplied to the NPN transistor Q3 to turn ON the same. As a result, the potential of the output terminal 152 quickly goes to $-1.6$ V (the low level).

On the other hand, when the potential of the input terminal 151 goes to the low level, the NPN transistor Q1 is turned OFF at once because the emitter potential thereof is suppressed by the capacitor C1. Therefore, the collector potential of the NPN transistor Q1 quickly goes to substantially 0 V through the resistor R1. Thus, the PMOS transistor P1 is turned OFF and the NPN transistor Q3 is also turned OFF. Although the potential of the output terminal 152 goes to $-0.8$ V (high level), at this time it quickly goes to this level because the NPN transistor Q3 is turned OFF with the increased resistance value of its internal resistor. Further, a power consumption can be reduced.

Figure 35:
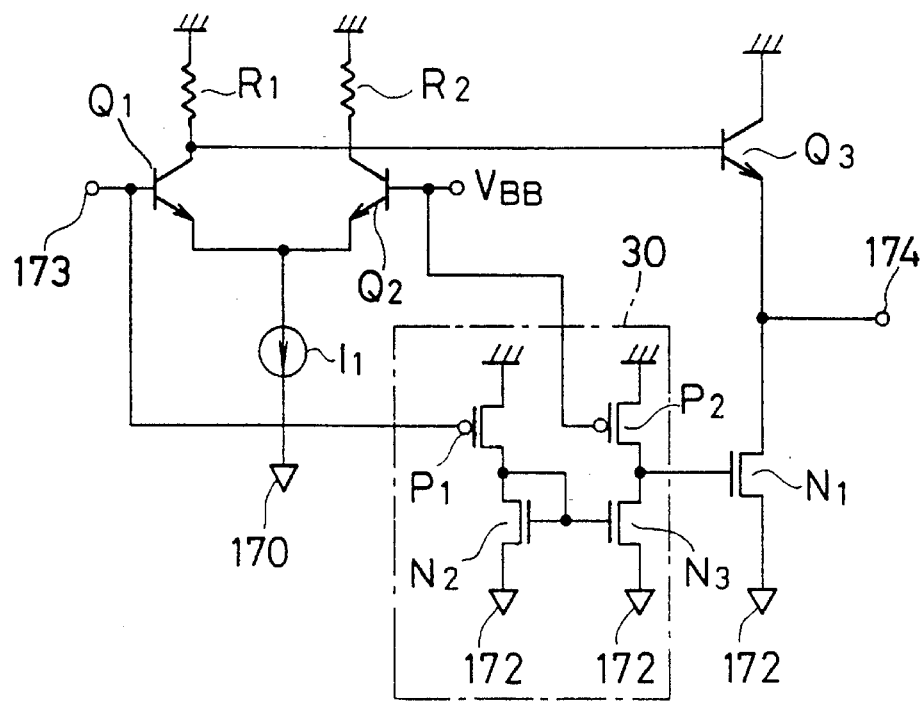
FIG. 35 is a circuit diagram showing the arrangement of an example of an ECL type inverter circuit according to this invention.
Figure 36:
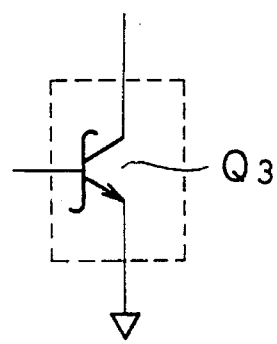
FIG. 36 is a circuit diagram showing an example in which the NMOS transistor of the emitter follower unit of the inverter circuit shown in FIG. 35 is replaced with an NPN transistor with a Schottky barrier diode.

Third Embodiment (FIG. 35–FIG. 36)

According to this embodiment, since the charging and discharging time constants of a load capacitance can be reduced by using a bipolar transistor, the operating speed of an NTL type circuit can be improved.

(3) Next, FIG. 35 shows an example of an ECL type inverter circuit according to this invention, which includes as a differential amplifier unit NPN transistors Q1 and Q2 having emitters connected to each other, resistors R1 and R2 connected between a first power supply terminal having a ground potential and the collectors of the NPN transistors Q1 and Q2, and a constant current source I1 disposed between the emitters of the NPN transistors Q1 and Q2 and a second power supply terminal 170.

Further, an NPN transistor Q3 having a base connected to the collector of the NPN transistor Q1 is disposed between the first power supply terminal with the ground potential and an output terminal 174 and an NMOS transistor N1 having a gate connected to the output of a CMOS amplifier circuit 30 is disposed between the output terminal 174 and a third power supply terminal 172, as an emitter follower output stage.

The CMOS amplifier circuit 30 is arranged such that a PMOS transistor P1 and NMOS transistor N2 are connected between the first power supply terminal with the ground potential and the third power supply terminal 172 and a PMOS transistor P2 and NMOS transistor N3 are connected therebetween. The gate of the PMOS transistor P1 is connected to an input terminal 173, the gate of the PMOS transistor P2 is connected to the base of the NPN transistor Q2 set to an intermediate level $V_{bb}$ between a logic high level and a logic low level, and the gate of the NMOS transistor N3 is connected to the gate of the NMOS transistor N2 and also to the drain thereof. Note, the potential of the second power supply terminal 170 is set to −3 V and the potential of the third power supply terminal 172 is set to −2 V and it is assumed that a logic high level is −0.8 V and a logic low level is −1.6 V.

In the above arrangement, when the potential of the input terminal 173 goes to the high level, the NPN transistor Q1 is turned ON and a current flows from the first power supply terminal with the ground potential to the power supply terminal 170 through the resistor R1, NPN transistor Q1 and constant current source I1. Note, the value of the constant current source I1 and the resistance value of the resistor R1 are set so that the NPN transistor Q1 has a collector potential of −0.8 V. Thus, although the potential of the output terminal 174 goes to −1.6 V (low level), at this time it quickly goes to this level because the output of the CMOS amplifier circuit 30 is risen substantially to the ground potential and the NMOS transistor N1 is turned ON with a reduced resistance value.

On the other hand, when the potential of the input terminal 173 goes to the low level, the NPN transistor Q1 is turned OFF. Therefore, the collector potential of the NPN transistor Q1 quickly goes to substantially 0 V through the resistor R1. Thus, although the potential of the output terminal 174 goes to −0.8 V (high level), at this time it quickly goes to this level because the output of the CMOS amplifier circuit 30 is dropped substantially to the power supply potential of the third power supply terminal 172 or −2 V and the NMOS transistor N1 is turned OFF with the increased resistance value of its internal resistor.

When the ON resistance of the NMOS transistor N1 is set smaller than the resistance value of the emitter resistor of the emitter follower unit of a usual ECL circuit, the falling speed of the potential of the output terminal 174 can be improved. Further, when the OFF resistance of the NMOS transistor N1 is set larger than the resistance value of the emitter follower unit of the usual ECL circuit, the rising speed of the output terminal 174 can be improved. In addition, a power consumption can be reduced.

FIG. 36 shows an example wherein the NMOS transistor N1 of the emitter follower unit of the inverter circuit shown in FIG. 35 is replaced with an NPN transistor Q3 with a Schottky barrier diode. The falling speed of the potential of the output terminal 174 can be further improved by the use of the bipolar transistor as described above.

According to this example, since the charging and discharging time constants of a load capacitance can be reduced by increasing the amplitude of the gate voltage of a MOS transistor and greatly changing the resistance value thereof or using a bipolar transistor, the operating speed of the ECL type circuit can be improved.

Fourth Embodiment (FIG. 37–FIG. 40)

Figure 37:
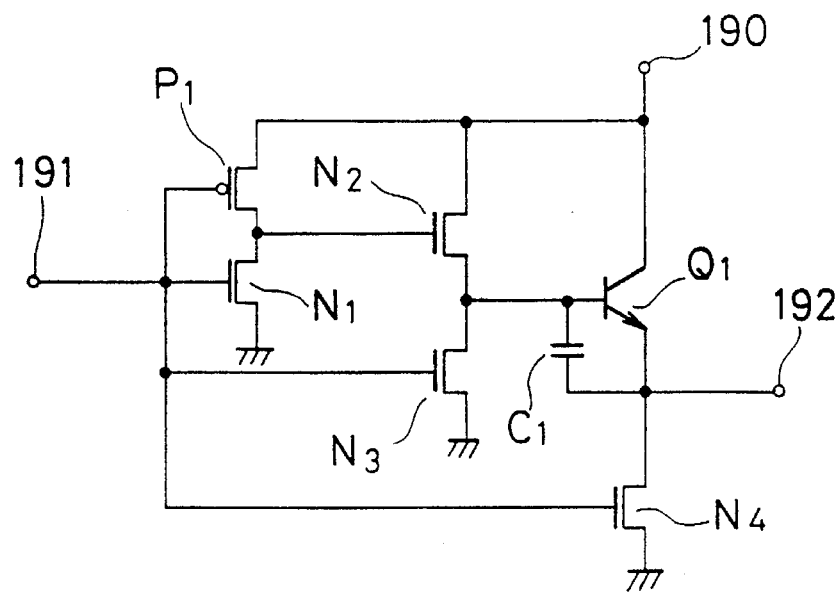
FIG. 37 is a circuit diagram showing the arrangement of an inverter circuit as an example of a BiNMOS logic circuit according to this invention.

(4) FIG. 37 shows the arrangement of an inverter circuit as an example of a BiMOS logic circuit according to this invention. An NPN transistor Q1 and NMOS transistor N4 are connected between a power supply $V_{cc}$ terminal 190 and a ground potential for the arrangement of an output stage. The NMOS transistor N4 also acts to use a logic of an output pull-down side. An NMOS transistor N2 is connected between the collector and base of the NPN transistor Q1 to supply a base current to the NPN transistor Q1. A base charge extracting NMOS transistor N3 having a gate connected to an input terminal 191 is connected between the base of the NPN transistor Q1 and the ground potential.

Further, a PMOS transistor P1 and NMOS transistor N1 having the respective gates thereof connected to the input terminal 191 are connected between the power supply terminal 190 and the ground terminal. The PMOS transistor P1 and NMOS transistors N1 and N3 also act to use a logic on an output pull-up side. Further, a capacitor C1 is connected between the base and emitter of the NPN transistor Q1 for a bootstrap effect.

In the above arrangement, when the potential of the input terminal 191 goes to a high level, the PMOS transistor P1 is turned OFF and thus the NMOS transistor N1 is turned ON, and the ground potential is applied to the gate of the NMOS transistor N2 to turn OFF the same.

Further, since the NMOS transistor N3 is turned ON, the NPN transistor Q1 is turned OFF. In addition, the NMOS transistor N4 is turned ON because the high level is applied to the gate thereof. Therefore, the potential of the output terminal 192 goes to a low level (ground potential).

On the other hand, when the potential of the input terminal 191 goes to the low level, the NMOS transistor N4 is turned OFF. Further, the PMOS transistor P1 is turned ON and thus the NMOS transistor N1 is turned OFF, and the power supply potential is applied to the gate of the NMOS transistor N2 to turn ON the same. Further, since the NMOS transistor N3 is turned OFF, a base current is supplied to the NPN transistor Q1 to turn ON the same. At this time, the base potential of the NPN transistor Q1 is first risen to the potential $V_{cc}-V_{th}$ and the NMOS transistor N2 is apparently turned OFF. The potential $V_{th}$ is the threshold voltage of the NMOS N2. At this time, although the emitter potential of the NPN transistor Q1 is $V_{cc}-V_{th}-V_{BE}$, thereafter the emitter potential of the NPN transistor Q1 continues to rise for a while. Thus, the base potential of the NPN transistor Q1 is pushed up through the capacitor C1, i.e. a so-called bootstrap effect arises. As a result, the emitter potential of the NPN transistor Q1 is pulled up and fully swung to the $V_{cc}$ power supply potential.

According to this example, since a BiNMOS logic circuit can be obtained in which an output is fully swung until the power supply voltage $V_{cc}$ drops to a low power supply voltage of about 2 V, a BiCMOS LSI operating at a high speed with a low power consumption can be realized.

Figure 38:
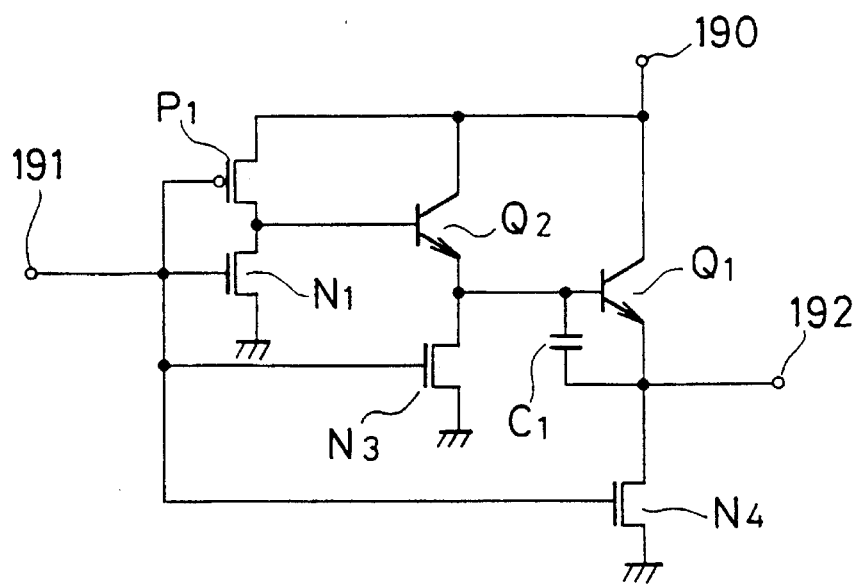
FIG. 38 is a circuit diagram showing the arrangement of an inverter circuit as another example of the BiNMOS logic circuit according to this invention.

FIG. 38 shows the arrangement of an inverter circuit as another example of the BiNMOS logic circuit according to this invention. The arrangement of this inverter circuit is different from that of the inverter circuit shown in FIG. 37 in that an NPN bipolar transistor Q2 is provided in place of the NMOS transistor N2 of FIG. 37. The operation of this inverter circuit is the same as that of the inverter circuit shown in FIG. 37. Since an NPN transistor Q1 is in Darlington connection with an NPN transistor Q2, the rising-up operation of an output terminal 192 can be further increased.

According to this example, since a BiNMOS logic circuit can be obtained in which an output is fully swung until the power supply voltage $V_{cc}$ drops to a low power supply voltage of about 2 V, a BiCMOS LSI operating at a high speed with a low power consumption can be realized.

Figure 39:
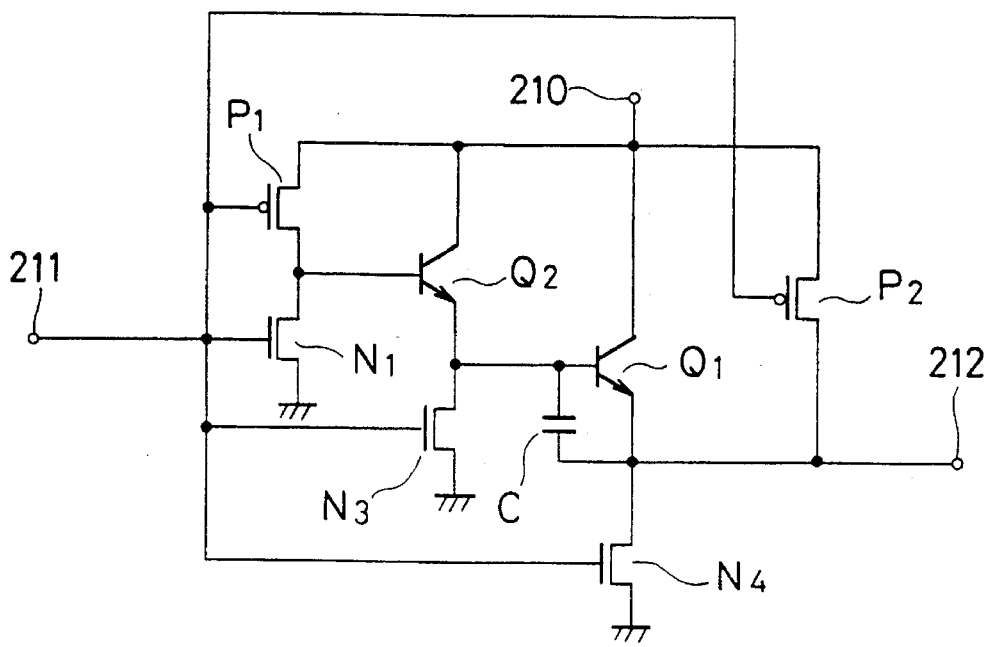
FIG. 39 is a circuit diagram showing the arrangement of an inverter circuit as a further example of the BiNMOS logic circuit according to this invention.

FIG. 39 shows the arrangement of an inverter circuit as a further example of the BiNMOS logic circuit according To this invention. The arrangement of this inverter circuit is different from that of the inverter circuit shown in FIG. 38 in that a PMOS transistor P2 having a gate connected to an input terminal 211 is added between a power supply terminal 210 and an output terminal 212. Since a CMOS inverter is composed of the PMOS transistor P2 and an NMOS transistor N4, the output of this circuit is operated to be fully swung to a low power supply voltage substantially equal to the threshold voltage of the MOS transistor. Further, in the low power supply voltage $V_{cc}$ of about 1.5 V, an output terminal 212 is quickly risen up by the multiplied effect of the pull-up of output effected by the PMOS transistor P2 and the pull-up of output effected by a bootstrap effect.

According to this example, since a high speed BiNMOS logic circuit can be obtained in which an output is fully swung until the power supply voltage $V_{cc}$ drops to a low power supply voltage of about 1.5 V, a BiCMOS LSI operating at a high speed with a low power consumption can be realized.

Figure 40:
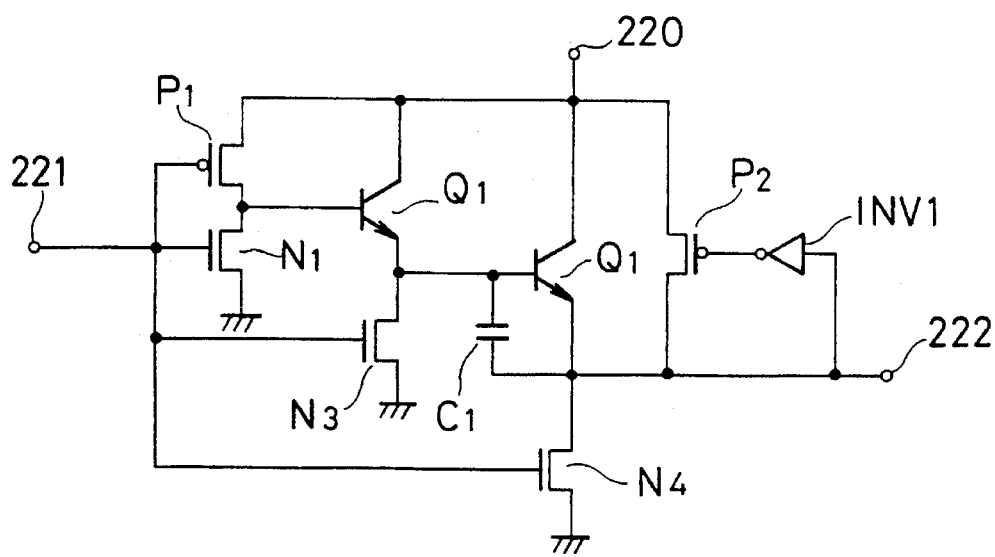
FIG. 40 is a circuit diagram showing the arrangement of an inverter circuit as a further example of the BiNMOS logic circuit according to this invention.

FIG. 40 shows the arrangement of an inverter circuit as a still further example of the BiNMOS logic circuit according to this invention. The arrangement of this inverter circuit is different from that of the inverter circuit shown in FIG. 38 in that a PMOS transistor P2 having a gate connected to the output of an inverter INV1 for inverting a signal from the output terminal 222 is added between a power supply terminal 220 and an output terminal 222.

With this inverter circuit, in the low power supply voltage $V_{cc}$ of about 1.5 V, an output terminal 212 is quickly risen up by the multiplied effect of the pull-up of output effected by a bootstrap effect and the pull-up of output effected by the PMOS transistor P2 turned ON by the inverter INV1 receiving the output.

According to this example, since a high speed BiNMOS logic circuit can be obtained in which an output is fully swung until the power supply voltage $V_{cc}$ drops to a low power supply voltage of about 1.5 V, a BiCMOS LSI operating at a high speed with a low power consumption can be realized.

Figure 41:
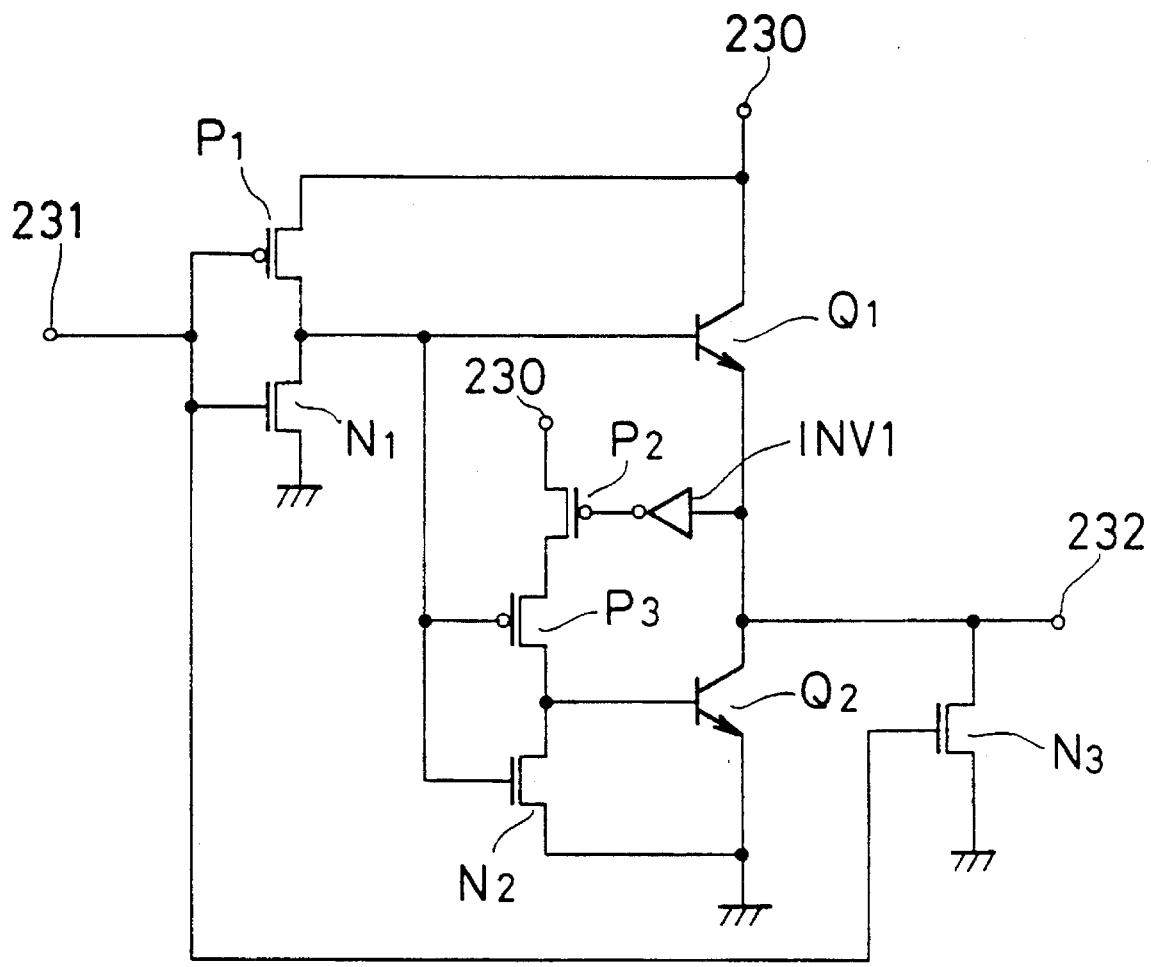
FIG. 41 is a circuit diagram showing the arrangement of an inverter circuit as an example of a BiCMOS logic circuit according to this invention.
Figure 42:
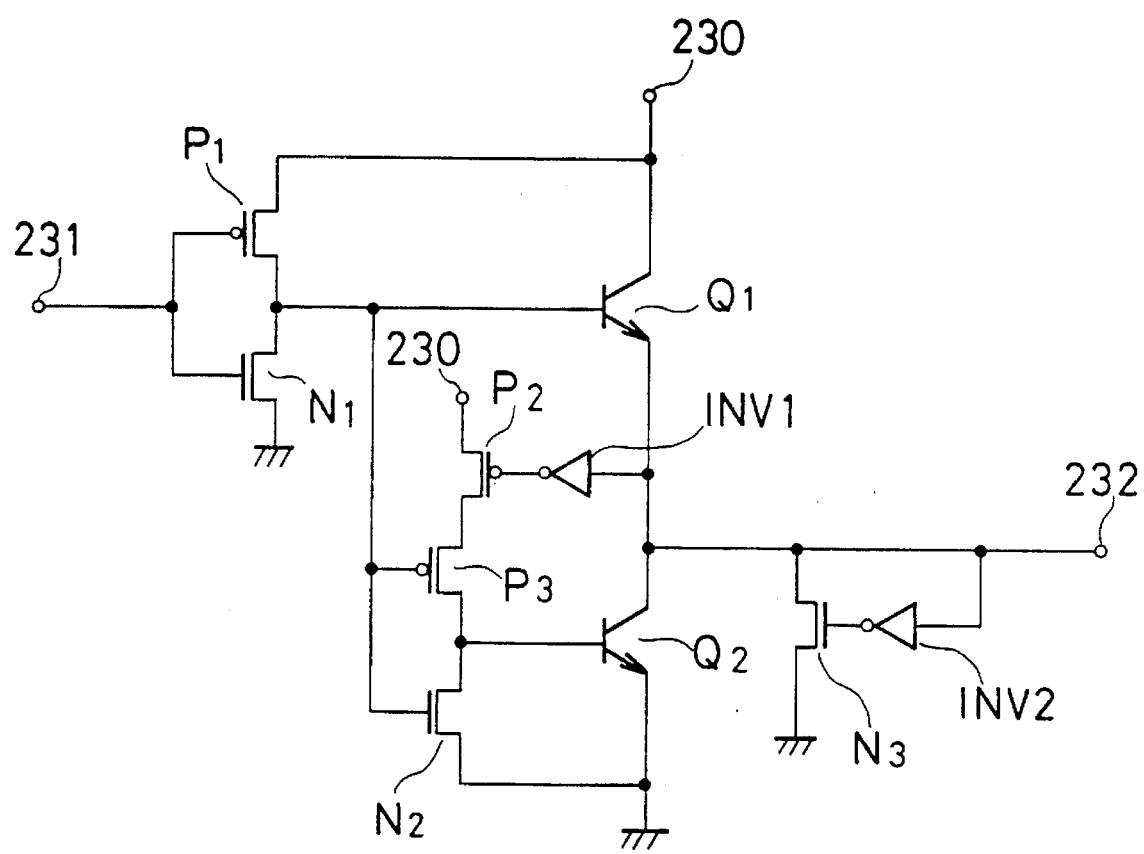
FIG. 42 is a circuit diagram showing the arrangement of an inverter circuit as another example of the BiCMOS logic circuit according to this invention.
Figure 43:
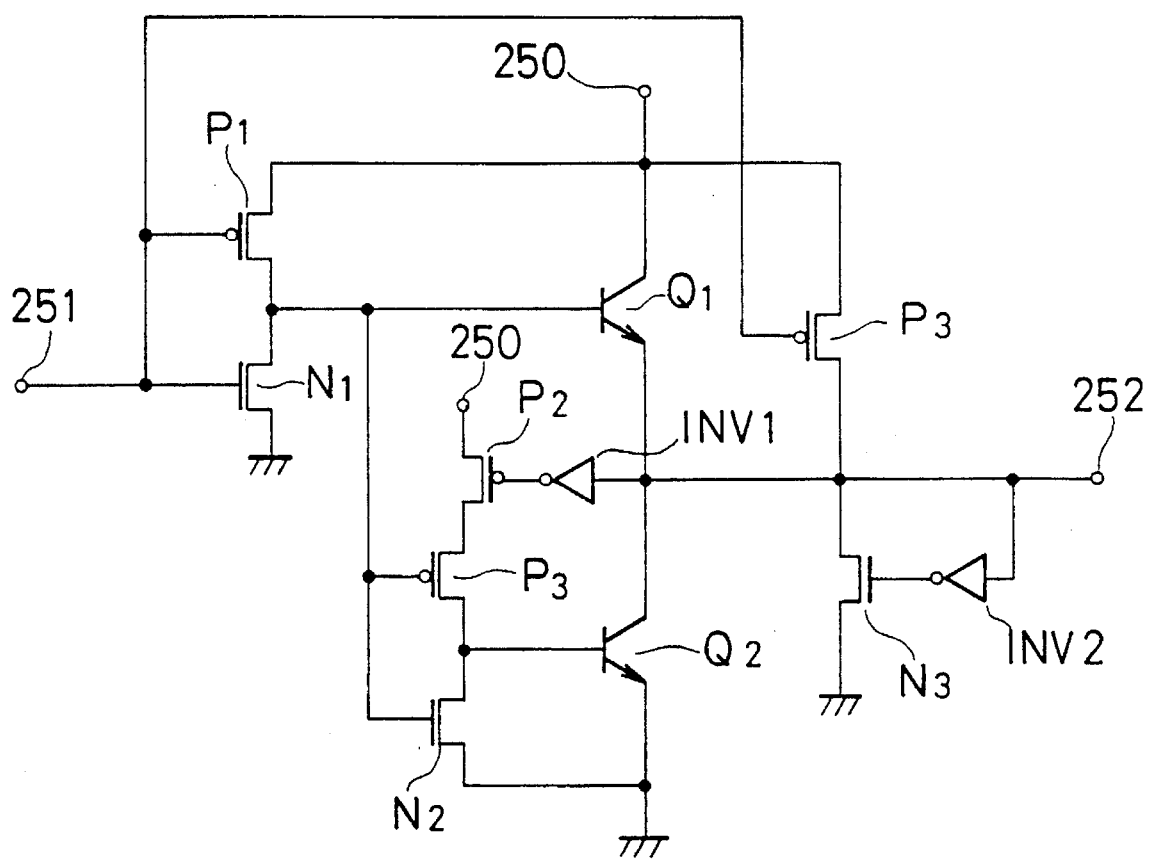
FIG. 43 is a circuit diagram showing the arrangement of an inverter circuit as a further example of the BiCMOS logic circuit according to this invention.

Fifth Example (FIG. 41–FIG. 43)

(5) FIG. 41 shows the arrangement of an inverter circuit as an example of a BiCMOS circuit according to this invention. NPN transistors and Q1 and Q2 and an NMOS transistor N3 are connected between a power supply $V_{cc}$ terminal 230 and a ground potential for the arrangement of an output stage. The NMOS transistor N3 also acts to use a logic of an output pull-down side.

Further, an PMOS transistor P1 is connected between the collector and base of the NPN transistor Q1 to supply a base current to the NPN transistor Q1. A base charge extracting NMOS transistor N1 having a gate connected to an input terminal 231 is connected between the base of the NPN transistor Q1 and the ground potential. The PMOS transistor P1 and NMOS transistor N1 also act to use an inverted logic.

Further, a PMOS transistor P2 having a gate connected to the output terminal of an inverter INV1 for inverting a signal from an output terminal 232 and a PMOS transistor P3 having a gate connected to the base of the NPN transistor Q1 are connected between the power supply terminal 230 and the base of the NPN transistor Q1. An NMOS transistor N2 having a gate connected to the base of the NPN transistor Q1 is connected between the base and the emitter of the NPN transistor Q2.

In the above arrangement, when the input terminal 231 goes to a high level, the PMOS transistor P1 is turned OFF and thus the NMOS transistor N1 is turned ON, and the NPN transistor Q1 is turned OFF. The NMOS transistor N3 is turned ON. The ground potential is applied to the gate of the NMOS transistor N2 to turn OFF the same. Further, since the PMOS transistor P3 is turned ON, and the PMOS transistor P2 is turned ON for a while until the output terminal 232 falls down, and thus a base current is supplied to the NPN transistor Q2 to turn ON the same. Therefore, the potential of the output terminal 232 goes to a low level (ground potential).

When the potential of the output terminal 232 goes to the low level, the output of the inverter INV1 goes to the high level and thus the PMOS transistor P2 is turned OFF. Therefore, since an excessive base current is not supplied to the NPN transistor Q2, a wasteful power is not consumed as well as the NPN transistor Q2 is prevented from being deeply saturated.

On the other hand, when the potential of the input terminal 231 goes to the low level, the NMOS transistor N3 is turned OFF. Further, the PMOS transistor P1 is turned ON and thus the NMOS transistor N1 is turned OFF, and a base current is applied to the NPN transistor Q1 to turn ON the same. Further, since the PMOS transistor P3 is turned OFF, the NPN transistor Q2 is turned OFF. Therefore, the potential of the output terminal 232 goes to the high level. When the potential of the output terminal 232 is at the low level, even if a noise is applied to the potential of the output terminal 232, the noise is attenuated at once because the NMOS transistor N3 is turned ON. Further, when the potential of the output terminal 232 is at the high level, even if a noise is applied to the potential of the output terminal 232, the noise is attenuated at once because a current is applied through the PMOS transistor P1 and NPN transistor Q1. More specifically, this arrangement has a strong resistance against noise.

According to this example, since a high speed and noise-resistant BiCMOS logic circuit can be obtained which can be operated at a low power supply voltage $V_{cc}$ of about 1.5 V, a BiCMOS LSI operating at a high speed with a low power consumption can be realized.

FIG. 42 shows the arrangement of an inverter circuit as another example of the BiCMOS circuit according to this invention. The arrangement of this inverter circuit is different from that of the inverter circuit shown in FIG. 41 in that the gate of an NMOS transistor N3 shown in FIG. 41 is connected to the output terminal of an inverter INV2 for inverting the signal of an output terminal 232. The operation of this inverter circuit is the same as that of the inverter circuit shown in FIG. 41. When the potential of the output terminal 232 is a t a low level, the output of the inverter INV2 is at a high level, and thus the NMOS transistor N3 is turned ON.

When the potential of the output terminal 232 is at the low level, even if a noise is applied to the potential of the output terminal 232, the noise is attenuated at once because the NMOS transistor N3 is turned ON. When a noise which is so large as to invert the output of the inverter INV2 is applied, the noise is attenuated because an inverter INV1 is inverted and a base current is applied from PMOS transistors P2 and P3 to an NPN transistor Q2.

According to this example, since a high speed and noise-resistant BiCMOS logic circuit can be obtained which can be operated at a low power supply voltage $V_{cc}$ of about 1.5 V, a BiCMOS LSI operating at a high speed with a low power consumption can be realized.

FIG. 43 shows the arrangement of an inverter circuit as a further example of the BiCMOS logic circuit according to this invention. The arrangement of this inverter circuit is different from that of the inverter circuit shown in FIG. 42 in that a PMOS transistor P3 having a gate connected to an input terminal 251 is added between a power supply terminal 250 and an output terminal 252. Since an output level is fully swung to a $V_{cc}$ potential by the PMOS transistor P3, this circuit operates with an fully swung output to a low power supply voltage substantially equal to a voltage $V_{BE}$ between the base and emitter of an NPN transistor.

According to this example, since a high speed BiCMOS logic circuit can be obtained in which an output is fully swung until a voltage $V_{cc}$ drops to a low power supply voltage substantially equal to the voltage $V_{BE}$, a BiCMOS LSI operating at a high speed with a low power consumption can be realized.

Figure 44:
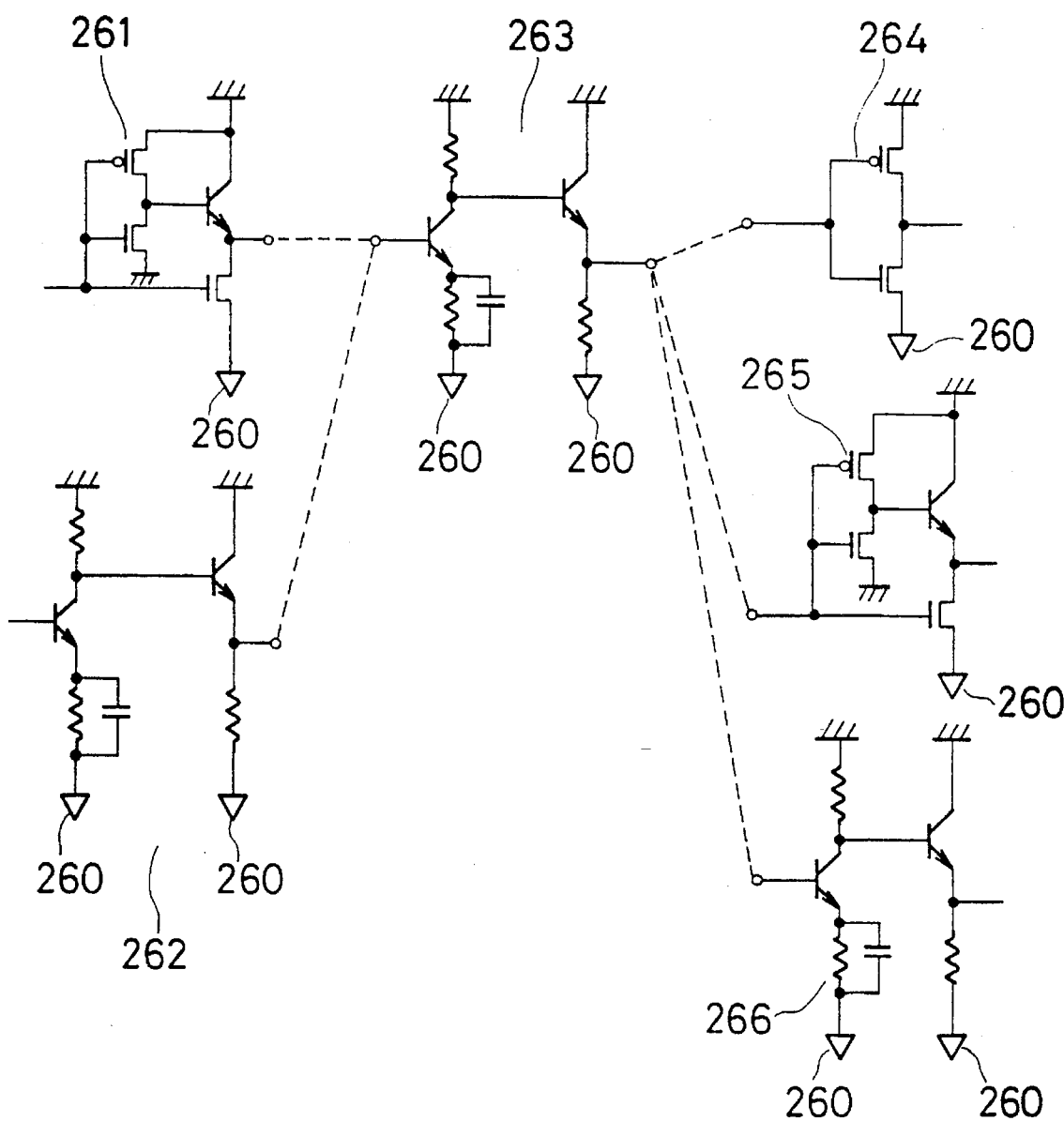
FIG. 44 is a circuit diagram showing the arrangement of an LSI in which various logic gates according to this invention are mixed.
Figure 45:
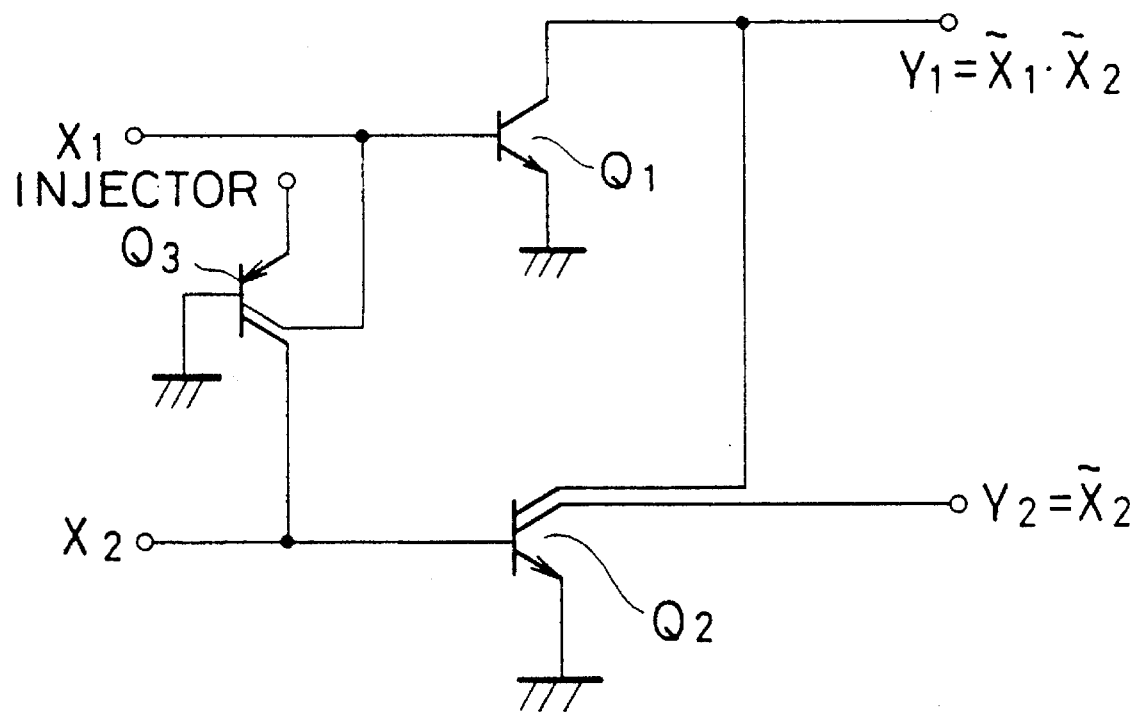
FIG. 45 is a circuit diagram showing the arrangement of a prior art IIL type circuit.
Figure 46:
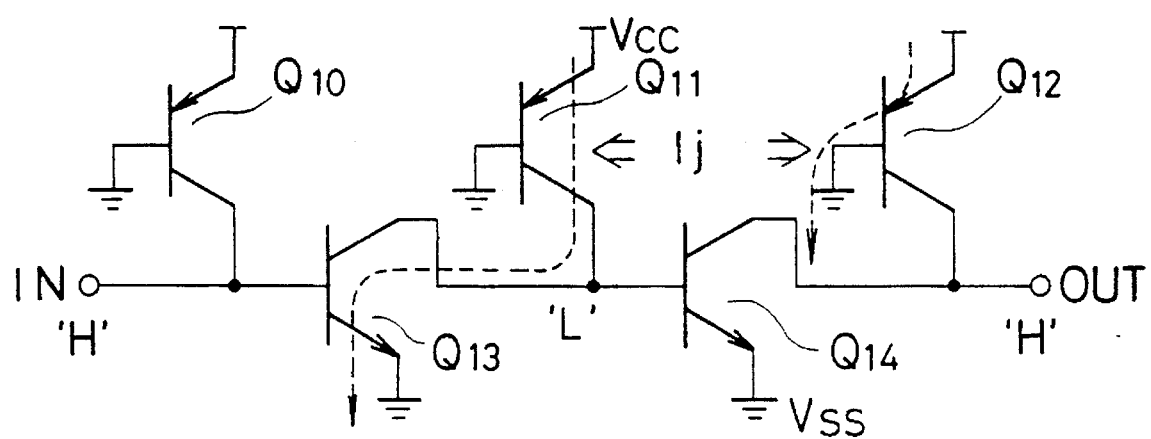
FIG. 46 is a diagram showing the arrangement of the injection current of a prior art IIL inverter.
Figure 47:
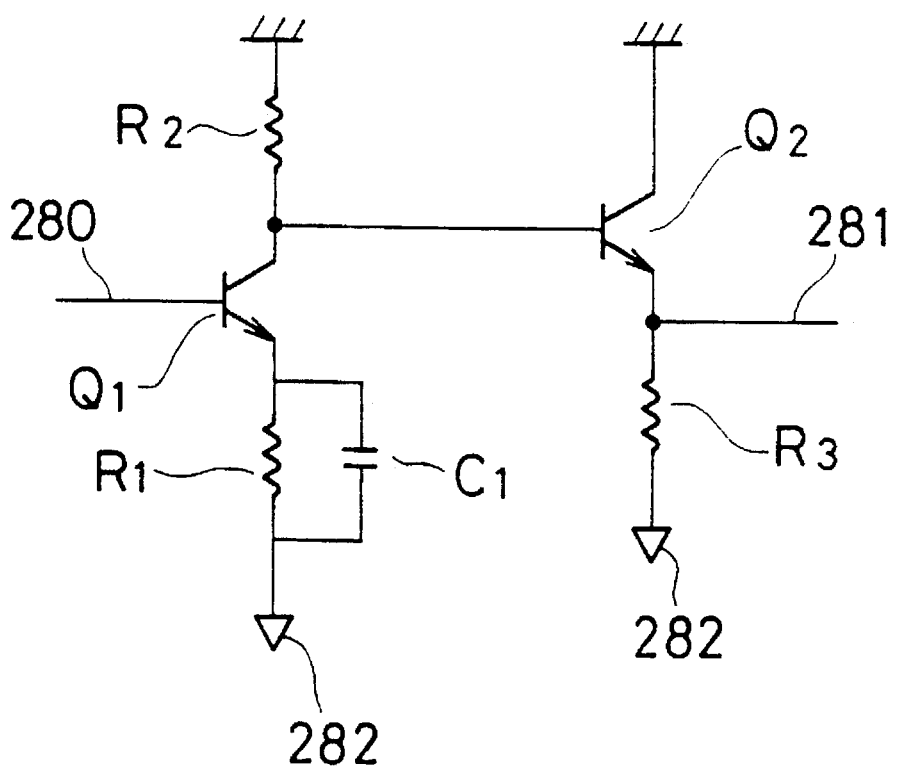
FIG. 47 is a circuit diagram showing the arrangement of a prior art NTL type inverter circuit.
Figure 48:
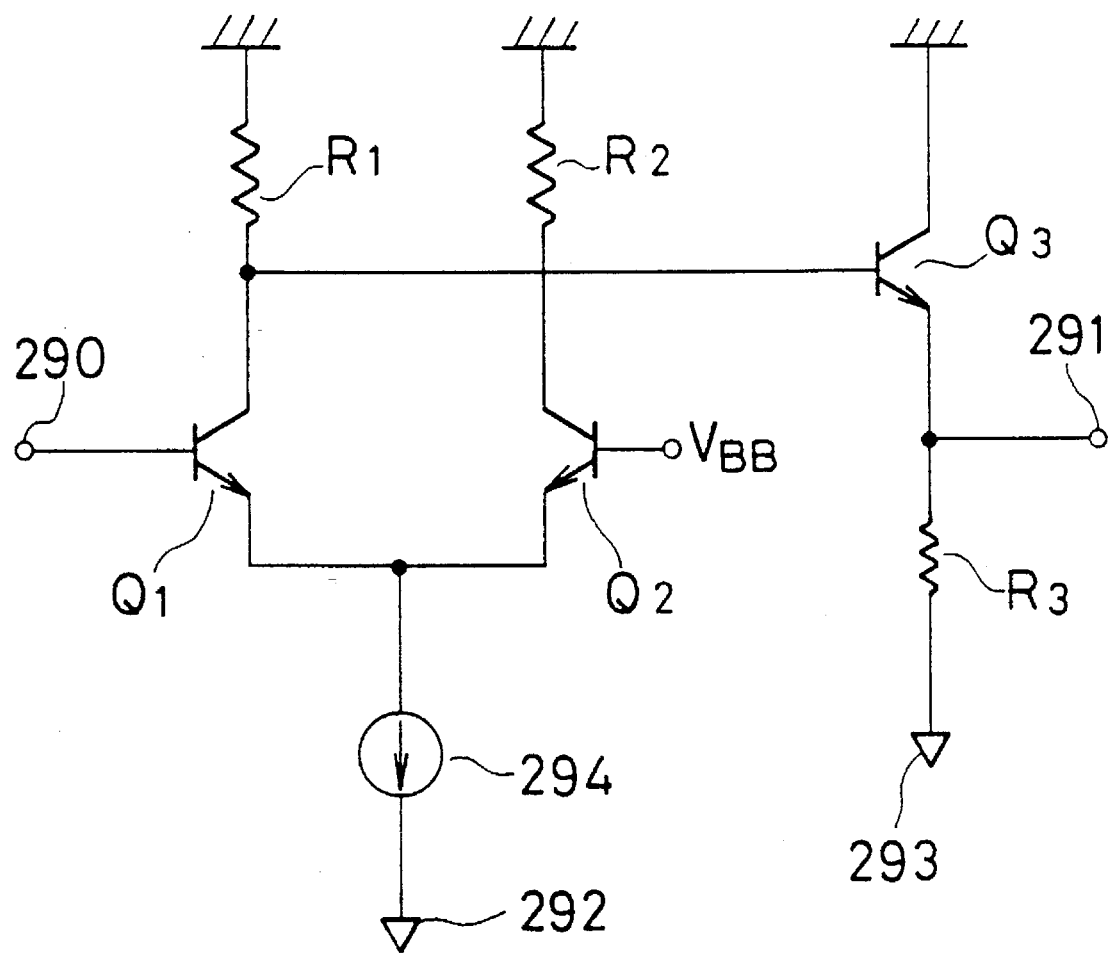
FIG. 48 is a circuit diagram showing the arrangement of a prior art ECL type inverter circuit.
Figure 49:
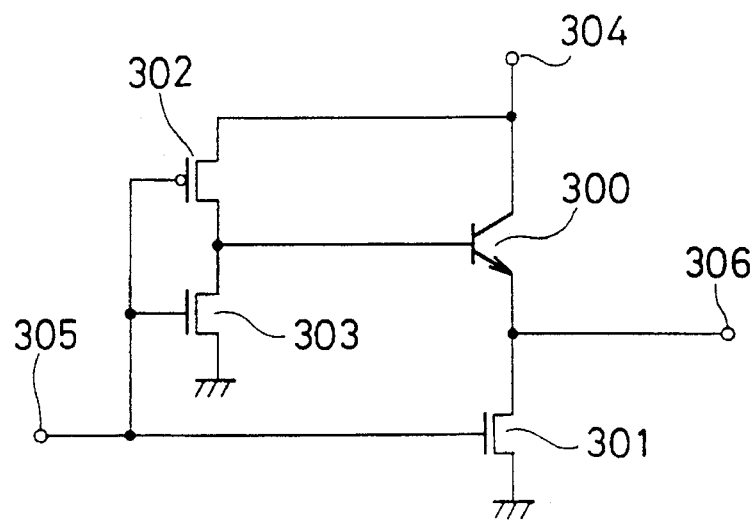
FIG. 49 is a circuit diagram showing the arrangement of an inverter circuit as a prior art BiNMOS logic circuit.
Figure 50:
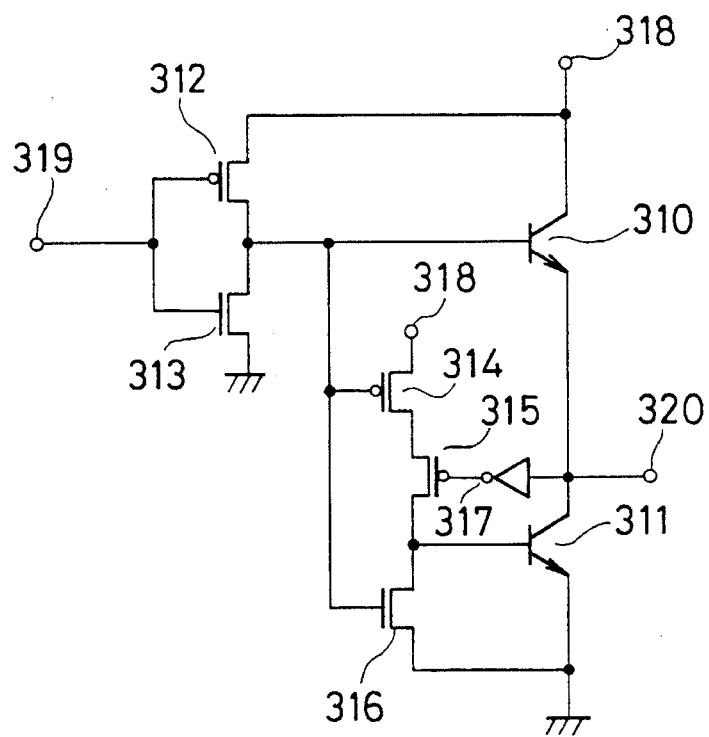
FIG. 50 is a circuit diagram showing the arrangement of a totem-pole type inverter circuit as a prior art BiCMOS logic circuit.
Figure 51:
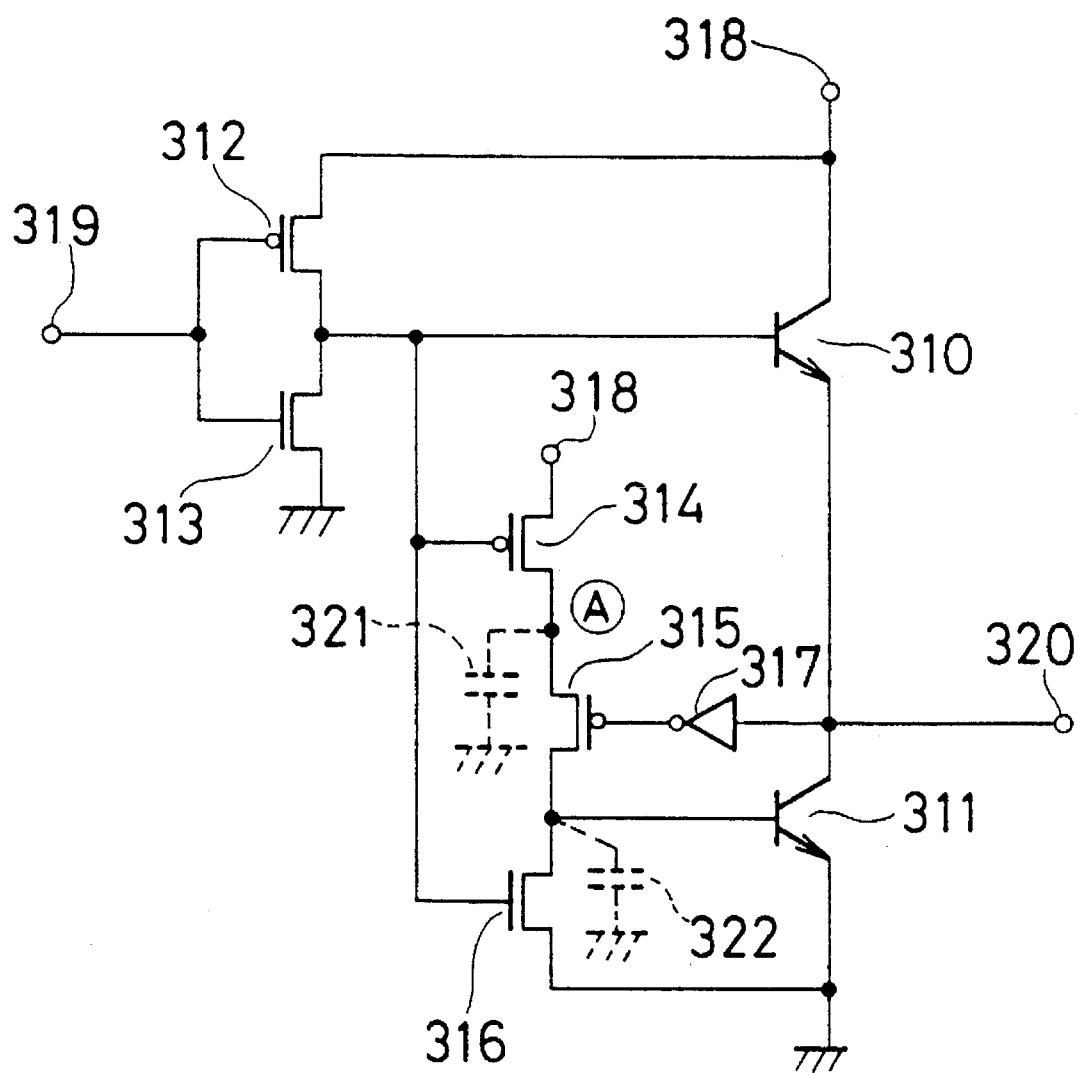
FIG. 51 is a diagram explaining the operating conditions of a totem-pole type inverter circuit as a prior art BiCMOS logic circuit.
Figure 52:
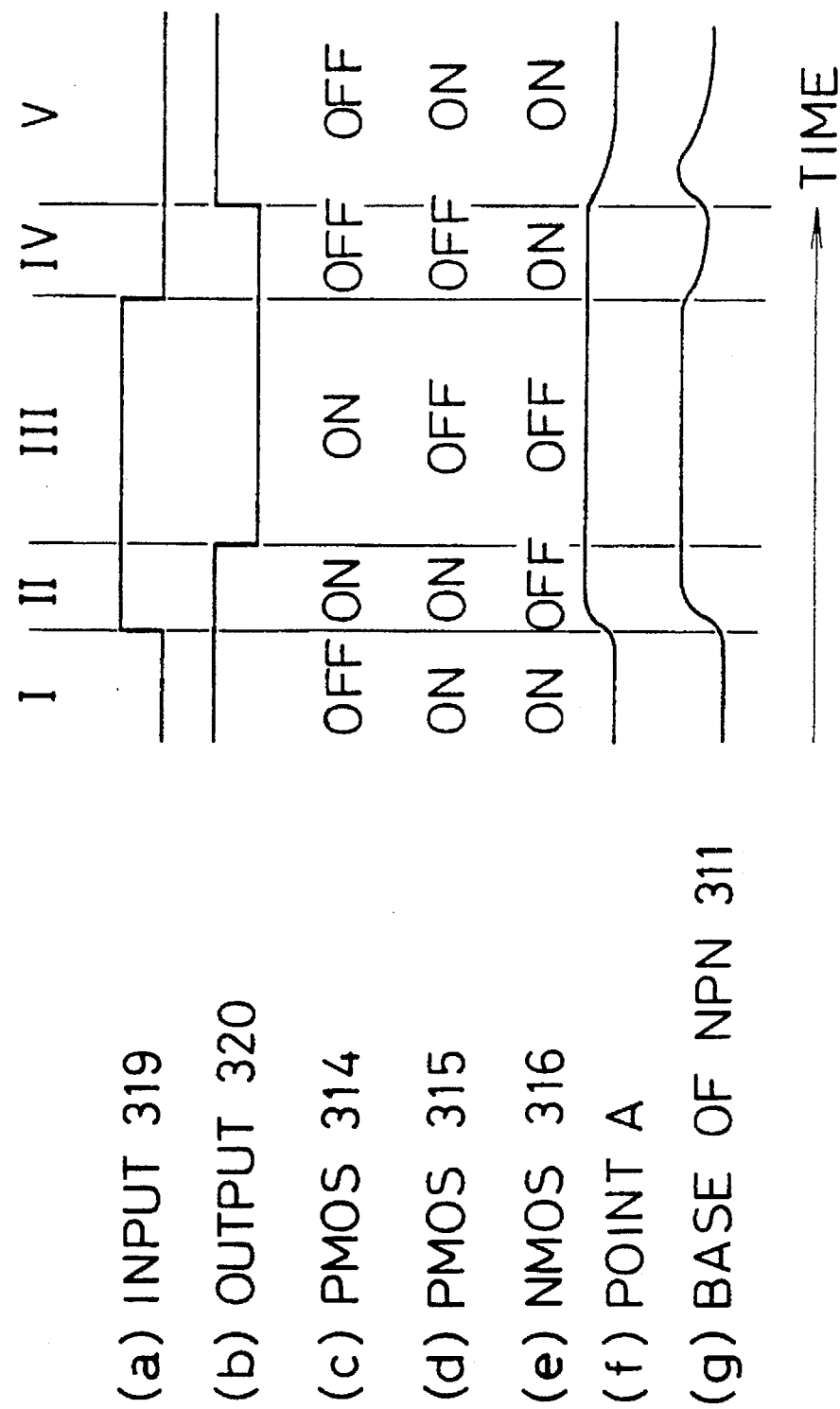
FIG. 52 is a timing chart showing the operating conditions of a totem-pole type inverter circuit as a prior art BiCMOS logic circuit.

Sixth Example (FIG. 44)

(6) FIG. 44 shows another embodiment of this invention, wherein a BiNMOS circuit 261, NTL circuit 262, NTL circuit 263, CMOS circuit 264, BiNMOS circuit 265 and NTL circuit 266 are shown between a ground potential and a power supply terminal 260 of about −2 V in a single LSI, respectively, to explain a connecting relationship.

It is assumed that the logic high level of the NTL circuits is −0.8 V and the logic low level thereof is −1.6 V. The logic threshold voltage of the CMOS circuit and BiNMOS circuit is set between −0.8 V and −1.6 V. With these settings, the outputs from the NTL circuits can be directly received by the CMOS circuit and BiNMOS circuit without passing through a level conversion circuit. The NTL circuits of course can be directly connected to each other. Further, an output pull-up means is not provided so that the output high level of the BiNMOS circuit goes to $-V_{BE}$ or −0.8 V. With this arrangement, the BiNMOS circuit can directly drives the NTL circuits. If the output high level is at the ground potential, the base of the NPN transistor included in the NTL circuit at an initial stage is at the ground potential and the collector thereof is at −0.8 V or lower and the NPN transistor is saturated, and thus the NTL circuits cannot be directly driven. The CMOS circuit can be directly connected to the BiNMOS circuit. Therefore, the direct connection is impossible only in the case that the NTL circuits are driven by the CMOS circuit. It is apparent that the NTL type circuits and BiCMOS circuits described above also can be used.

According to this embodiment, since the super high speed NTL circuit, CMOS circuit operating with a low power consumption and high speed BiNMOS circuit operating with a low power consumption can be used with a right device in a right place without using a level conversion circuit, a high speed LSI capable of operating with a low power consumption can be obtained.

Figure 67:
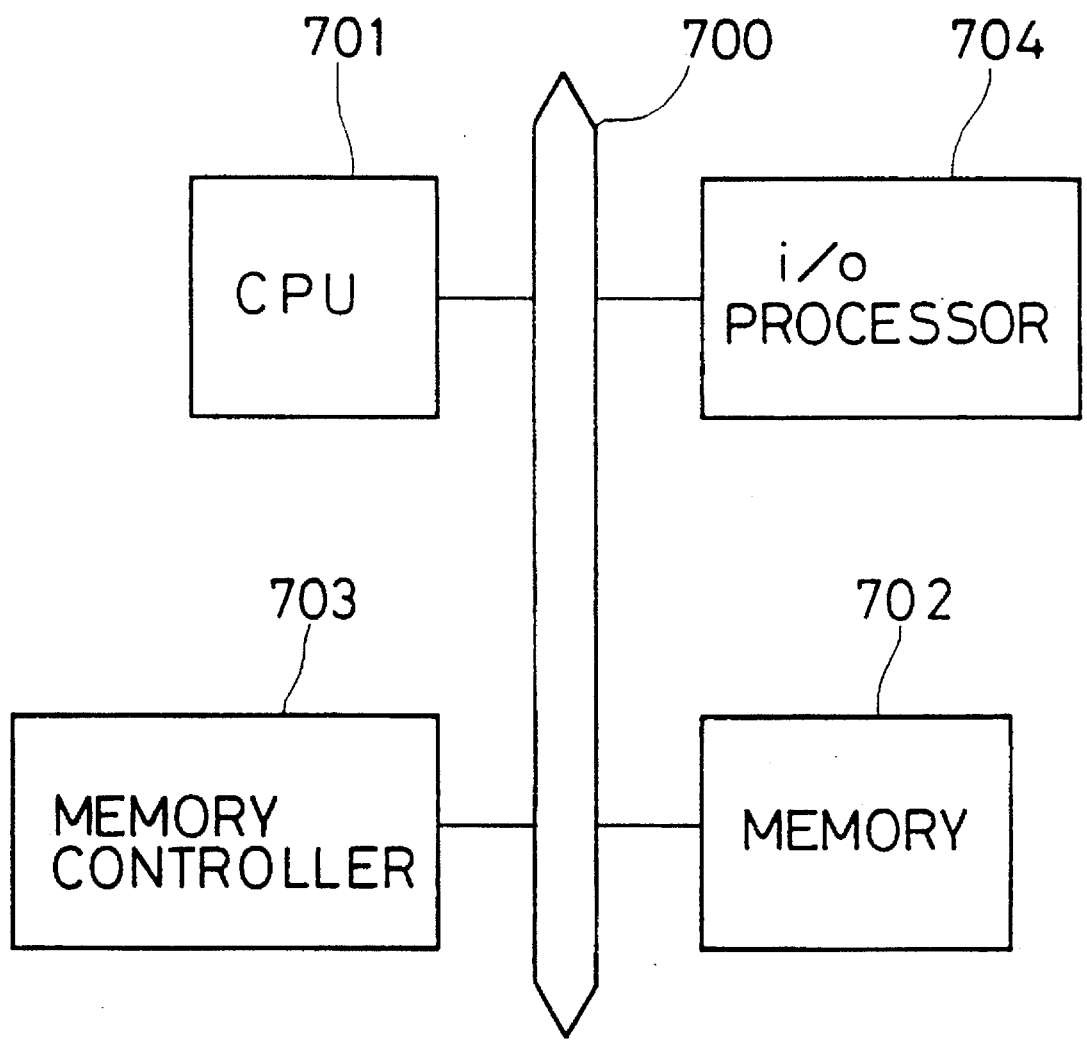
FIG. 67 is a block diagram showing the arrangement of a data processing apparatus to which a semiconductor integrated circuit device according to this invention is applied.

Seventh Embodiment (FIG. 67)

(7) FIG. 67 shows a further embodiment of this invention. FIG. 67 shows the general arrangement of a computer, wherein a central processing Unit (CPU) 701, memory 702 for storing data input to the CPU 701 or output therefrom, memory controller 703 and I/O processor 704 are interconnected through a bus 700.

In this system, the CPU 701 taken as an example requires a high speed for performing calculation at a high speed. Further, when the CPU 701 is divided to several LSI chips, a time for transmitting a signal between the LSI chips is greatly delayed and thus the performance of the system cannot be improved. When, however, the scale of the LSI is increased, a power consumption is increased, and thus a low power consumption is also required. Therefore, when the LSI according to this invention described with reference to FIG. 44 and the various logic circuits according to this invention are applied to a data processing apparatus such as a processor and the like, a system of high performance can be build.

According to this embodiment, a data processing unit such as a processor and the like having a performance about twice that of a CMOS transistor can be achieved.

Eighth Embodiment (FIG. 53–FIG. 56, FIG. 58–FIG. 69)

Figure 53:
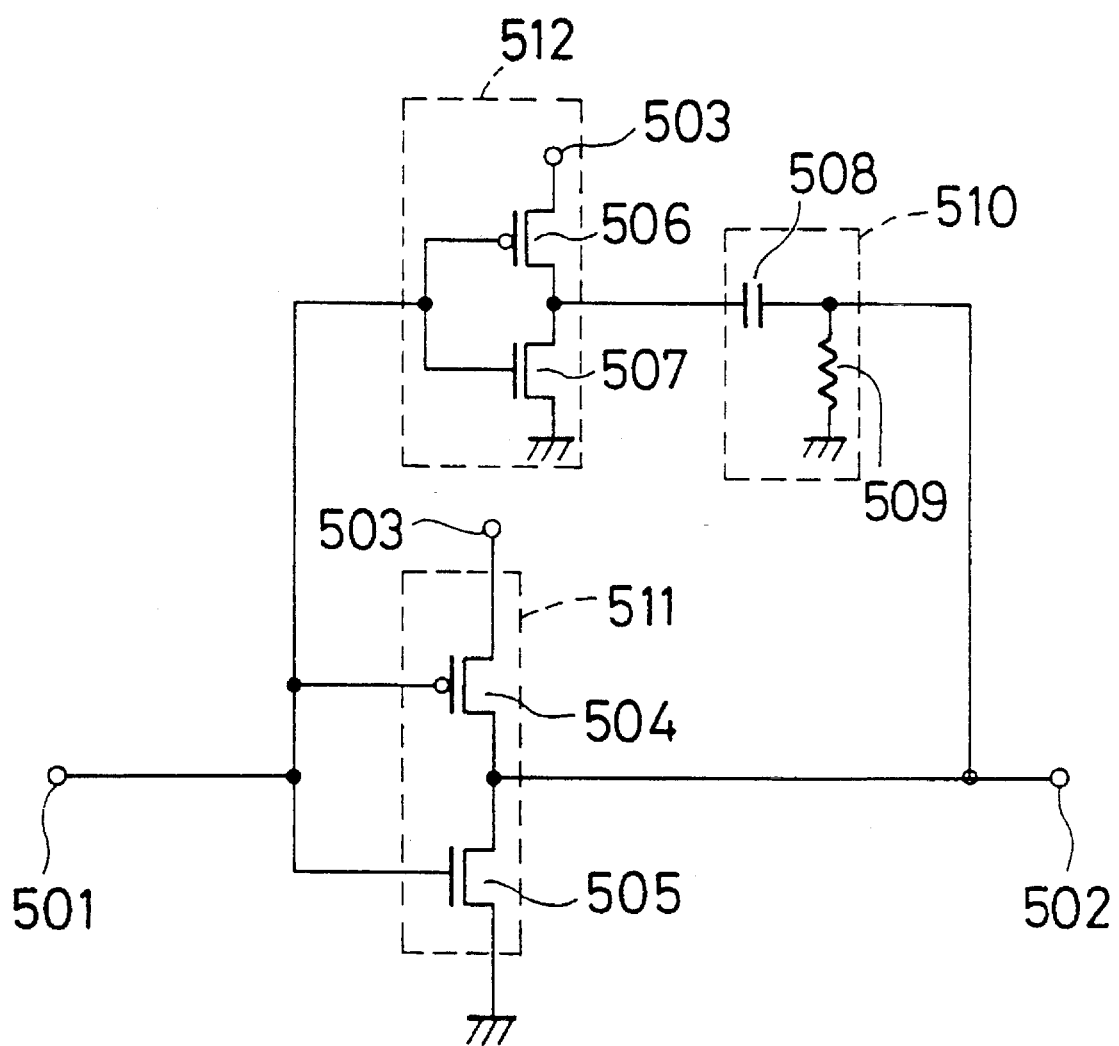
FIG. 53 is a circuit diagram showing an example of an inverter circuit to which this invention is applied.

(8) FIG. 53 shows an inverter circuit to which this invention is applied. In FIG. 53, a numeral 501 designates an input terminal; a numeral 502 designates an output terminal; a numeral 503 designates a power supply terminal; a numeral 504 designates a PMOS transistor having a source connected to the power supply terminal 503, a gate connected to the input terminal 501 and a drain connect to the output terminal 502, respectively; a numeral 505 designates an NMOS transistor having a drain connected to the output terminal 502, a gate connected to the input terminal 501 and a source connected to a ground terminal, respectively; a numeral 506 designates a PMOS transistor having a source connected to the power supply terminal 503, a gate connected to an input terminal 501 and a drain connected to the input of a differentiator circuit 510, respectively; and a numeral 507 designates an NMOS transistor having a drain connected to the input of the differentiator circuit 510, a gate connected to the input terminal 501 and a source connected to the ground terminal, respectively.

Further, the output of the differentiator circuit 510, composed of a capacitor 508 as a capacitive device and a resistor 509 as a resistance device, is connected to the output terminal 502 of the circuit device. More specifically, the CMOS transistor 504 and NMOS transistor 505 constitute a complementary first CMOS inverter circuit 511 which inverts a signal input from the input terminal 501 of the circuit device and outputs the same to the output terminal 502. Further, a second CMOS inverter circuit 512 composed of the PMOS transistor 506 and NMOS transistor 507 has an output connected to the differentiator circuit 510 in series and the thus arranged series circuit is connected in series to the input and output terminals of the CMOS inverter circuit 511 composed of the PMOS transistor 504 and NMOS transistor 505.

In the above arrangement, when the potential of the input terminal 501 is changed to a low level, the PMOS transistor 504 of the CMOS inverter circuit 511 is turned ON, the parasitic capacitor of the output terminal 502 is charged and thus the potential of the output terminal 502 rises to a high level. At the same time, the CMOS inverter circuit 512 also performs the same logic operation as that of the CMOS inverter circuit 511, the PMOS transistor 506 is turned ON and the output thereof is changed to the high level. The differentiator circuit 510 produces a positive differentiated pulse in response to the transition of state of the signal output from the CMOS inverter circuit 512 and the positive differentiated pulse is superimposed on the output signal of the output terminal 502 so that the charge of the load of the output terminal is accelerated.

On the other hand, when the potential of the input terminal 501 is changed to the high level, the NMOS transistor 505 of the CMOS inverter circuit 511 is turned ON, the charge stored in the parasitic capacitor of the output terminal 502 is discharged and thus the potential of the output terminal 502 is changed to the low level. At the same time, the CMOS inverter circuit 512 also performs the same logic operation, the NMOS transistor 507 is turned ON and the output thereof is changed to the low level. The differentiator circuit 510 produces a negative differentiated pulse in response to the transition of state of the signal output from the CMOS inverter circuit 512 and the negative differential pulse is superimposed on the output signal of the output terminal 502 so that the discharging of the load of the output terminal is accelerated.

When all the logic operations are intended to be performed at a low power supply voltage of 1 V and 1.5 V, the CMOS circuit composed of the PMOS transistor 504 and NMOS transistor 505 is superior to the logic circuit composed of bipolar transistors. However, the current drive capacity of the CMOS circuit composed of the PMOS transistor 504 and NMOS transistor 505 is inferior to that of the logic circuit composed of the bipolar transistors, and thus the delay time of an output signal strongly depends upon a load, which leads to the reduced speed of a signal transmission. Thus, according this invention, for the purpose of improving a driving capacity while maintaining a property operating at low voltage, the circuit composed of the CMOS inverter circuit 512 and differentiator circuit 510 connected in series therewith are connected in series between the input and output terminals of the CMOS inverter circuit 511 composed of the PMOS transistor 504 and NMOS transistor 505. Thus, the positive and negative pulses, which are produced at the output terminal 502 of the differentiator circuit 510 when the state of the signal input to the input terminal 501 is in the transition state condition, are superimposed on the output signal at the output terminal 502 so as to improve the driving capacity.

Figure 54:
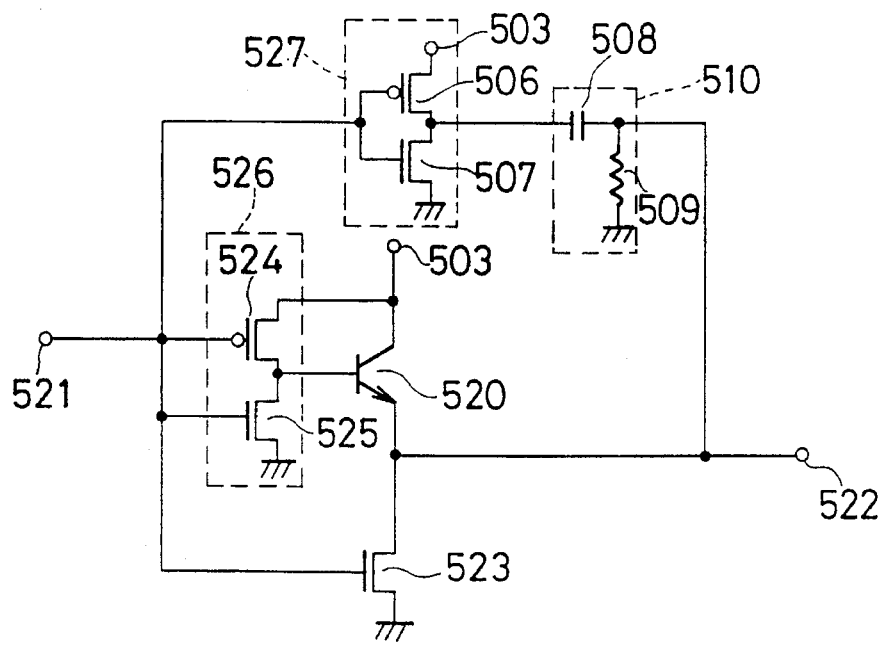
FIG. 54 is a circuit diagram showing another example of the inverter circuit to which this invention is applied.

FIG. 54 shows the arrangement of another example of the inverter circuit to which this invention is applied, wherein the same numerals as used in FIG. 53 are used to designate the elements having the same function and operation as those in FIG. 53. This example uses an inverter circuit similar to that shown in FIG. 53, but the inverter circuit of this embodiment is different from that shown in FIG. 53 as described below. That is, a CMOS inverter circuit 526, which corresponds to the first CMOS inverter circuit 511 in FIG. 53 and is composed of a PMOS transistor 524 and NMOS transistor 525 has an output stage to which a BiNMOS type inverter circuit is added, the BiNMOS type inverter circuit being composed of an NPN bipolar transistor 520 having a collector connected to a power supply terminal 503, a base connected to the output of a CMOS inverter circuit 526 and an emitter connected to an output terminal 522, respectively and an NMOS transistor 523 having a drain connected to an output terminal 522, a gate connected to an input terminal 521 and a source connected to a ground terminal, respectively. This BiNMOS type inverter circuit performs an inverter operation such that when the NPN bipolar transistor 520 is turned ON, the potential of the output terminal 522 goes to a high level and when the NMOS transistor 523 is turned ON, the potential of the output terminal goes to a low level.

Further, the effect of improving a driving capacity performed by the positive and negative differentiated pulses of a differentiator circuit 510 is the same as that of the above example.

Figure 55:
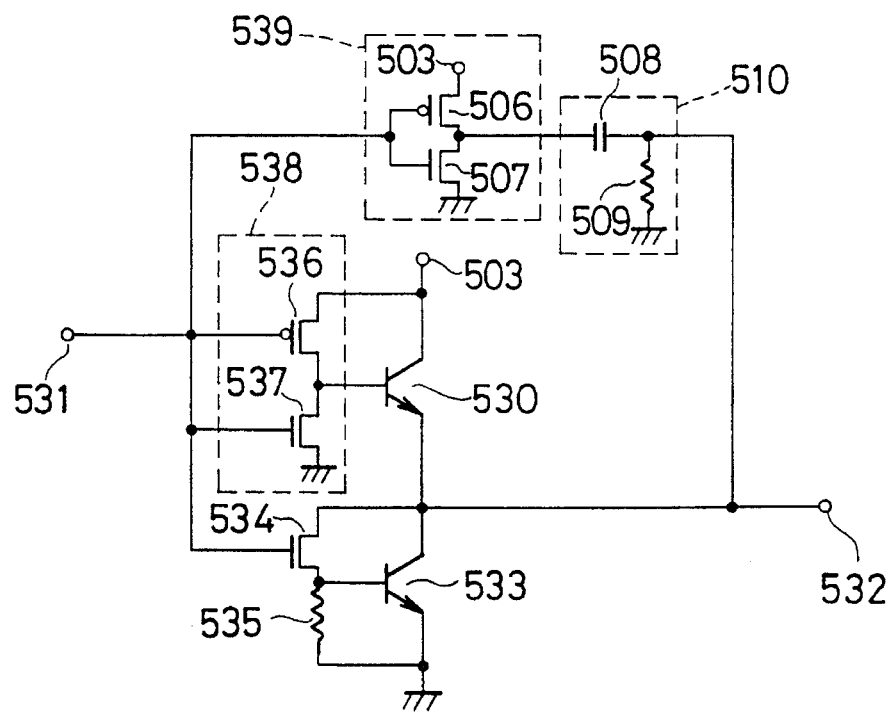
FIG. 55 is a circuit diagram showing a further example of the inverter circuit to which this invention is applied.

FIG. 55 shows the arrangement of a further example of the inverter circuit to which this invention is applied, wherein the same numerals as used in FIG. 53 are used to designate the elements having the same function and operation as those in FIG. 53. This example uses an inverter circuit similar to that shown in FIG. 53, but the inverter circuit of this embodiment is different from that shown in FIG. 53 as described below. That is, a CMOS inverter circuit 538, which corresponds to the CMOS inverter circuit 511 in FIG. 53 and is composed of a PMOS transistor 536 and NMOS transistor 537 has an output stage to which a BiCMOS type inverter circuit is added, the BiCMOS type inverter circuit being composed of an NPN bipolar transistor 530 having an emitter connected to an output terminal 532, an NPN bipolar transistor 533 having a collector connected to the output terminal 532, a base connected to the source of an NMOS transistor 534 and an emitter connected to a ground terminal, respectively and a device 535 for extracting the base charge of the NPN bipolar transistor 533.

In this example, the effect of improving a driving capacity performed by the positive and negative differentiated pulses of a differential circuit 510 also can be obtained in the same way.

Figure 56:
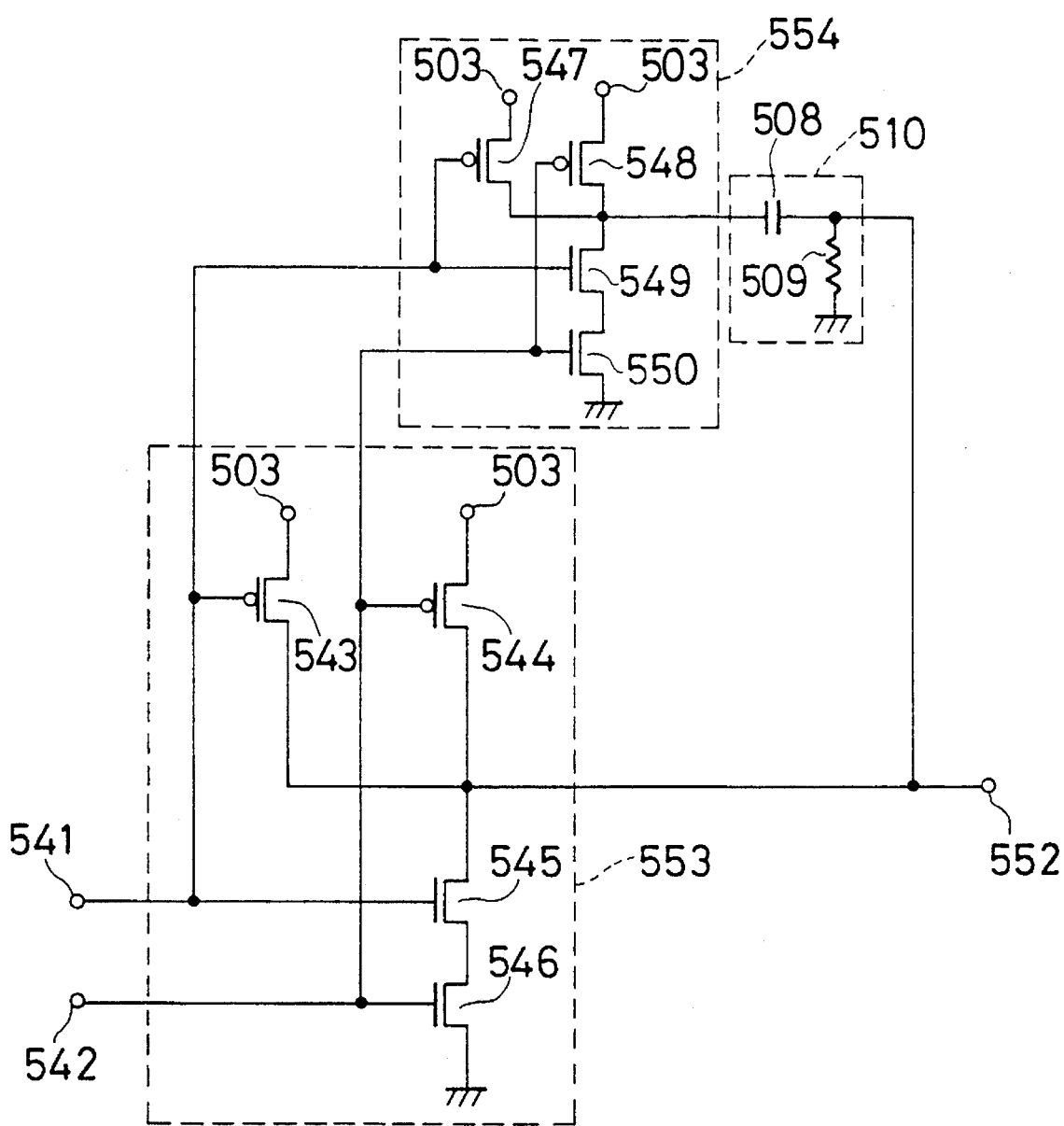
FIG. 56 is a circuit diagram showing the arrangement of a two-input NAND gate circuit to which this invention is applied.
Figure 57:
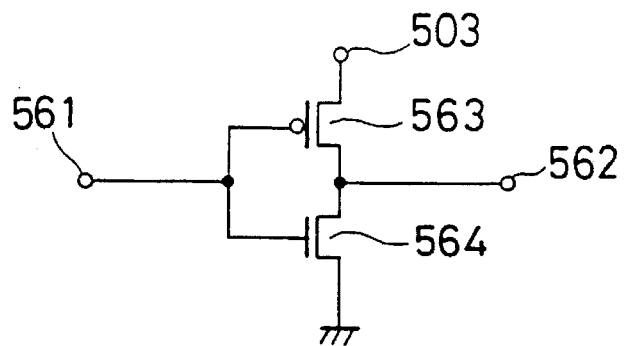
FIG. 57 is a circuit diagram showing the arrangement of a prior art inverter circuit.
Figure 58:
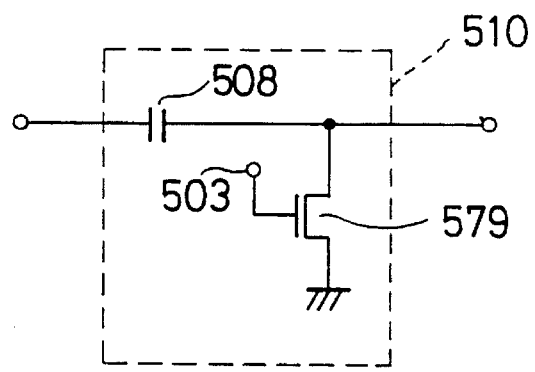
FIG. 58 is a circuit diagram showing the arrangement of another example of the differential circuit constituting a semiconductor integrated circuit device according to this invention.
Figure 59:
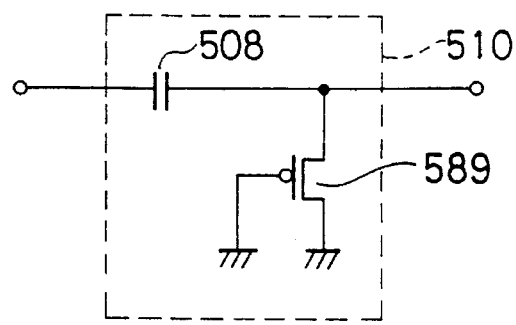
FIG. 59 is a circuit diagram showing the arrangement of a further example of the differential circuit constituting a semiconductor integrated circuit device according to this invention.

FIG. 56 shows the arrangement of an example of a two-input NAND gate circuit to which this invention is applied, wherein the same numerals as used in FIG. 53 are used to designate the elements having the same function and operation as those in FIG. 53. In FIG. 56, the CMOS type two-input NAND gate circuit 553 is composed of input terminals 541 and 542, output terminal 552, PMOS transistor 544 having a source connected to a power supply terminal 503, a gate connected to the input terminal 542, a drain connected to the output terminal 552, respectively, PMOS transistor 543 having a source connected to the power supply terminal 503, a gate connected to the input terminal 541 and a drain connected to the output terminal 552, respectively, NMOS transistor 545 having a drain connected to the output terminal 552, a gate connected to the input terminal 541 and a source connected to the drain of an NMOS transistor 546, respectively, and the NMOS transistor 546 having a gate connected to the input terminal 542 and a source connected to a ground terminal, respectively.

In the above arrangement, when the potentials of the input terminals 541 and 542 simultaneously go to a high level, the NMOS transistors 545 and 546 are turned ON and the potential of the output terminal 522 goes to a low level, and when the potential of any one of the input terminals 541 and 542 goes to the low level, the NMOS transistor 543 or 544 is turned ON and the potential of the output terminal 522 goes to the high level. A two-input NAND circuit 554 connected to a differentiator circuit 510 in series is arranged to perform the same logic operation as that of the two-input NAND circuit 553.

The effect of improving a driving capacity performed by the positive and negative differentiated pulses of the differentiator circuit 510 is also obtained in the aforesaid circuit arrangement in the same way.

Figure 60:
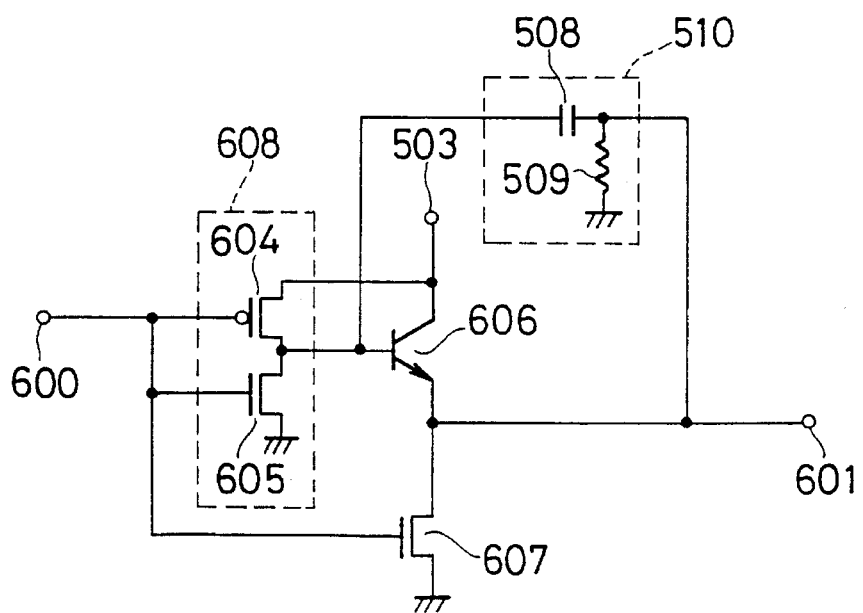
FIG. 60 is a circuit diagram showing a further example of the inverter circuit which this invention is applied.

FIG. 60 shows the arrangement of a still further example of the inverter circuit to which this invention is applied. This example has the arrangement omitting an circuit which corresponds to the CMOS inverter circuit 527 performing the same logic operation as that of the CMOS inverter circuit 526 of the inverter circuit shown in FIG. 54. More specifically, the example shown in FIG. 54 is arranged such that a pulse voltage is superimposed on a signal output from the main logic circuit (composed of the CMOS inverter circuit 526, NPN bipolar transistor 520 and NMOS transistor 523 in FIG. 54) by the differentiator circuit to transmit a signal at a high speed. Since the pulse voltage serves as an accelerating voltage, it must be a positive pulse when the signal output from the main logic circuit is at a high level and a negative pulse when the signal is at a low level. More specifically, since a positive pulse is output when a positive change occurs at the input of the differentiator circuit and a negative pulse is output when a negative change occurs thereat, a signal input to the differentiator circuit must be the same logic signal as that of the output signal of the main logic circuit. Thus, although the example shown in FIG. 54 is added with a circuit having a minimum arrangement with the same logic as that of the main logic circuit, the main logic circuit composed of the BiNMOS circuit, BiCMOS circuit and the like has the portion having the same logic as that of the output signal in the interior thereof. This portion is the base of the NPN bipolar transistor 520 in FIG. 54.

Thus, a logic circuit connected in series in front of the differentiator circuit can be omitted by employing such an arrangement that an input signal is supplied to the differentiator circuit from the base of the NPN bipolar transistor constituting the output stage in the main logic circuit.

This example is characterized in the omission of a logic circuit performing the same logic operation as that of the main logic circuit.

In FIG. 60, a numeral 600 designates an input terminal; a numeral 601 designates an input terminal; a numeral 608 designates a CMOS inverter circuit composed of a pair of PMOS transistor 604 and NMOS transistor 605 having input terminals connected to the input terminal 600; a numeral 606 designates an NPN bipolar transistor having a collector connected to the source of the PMOS transistor 604, a base connected to the drain of the PMOS transistor 604 and an emitter connected to the output terminal 601, respectively; a numeral 607 designates an NMOS transistor having a drain connected to the emitter of the NPN bipolar transistor 606, a gate connected to the input terminal of the CMOS inverter circuit and a source connected to a ground terminal, respectively; and a numeral 510 designates a differentiator circuit composed of a capacitor 508 and resistor 509 and having an input terminal connected to the base of the NPN bipolar transistor 606 and an output terminal connected to the output terminal 601.

In the above arrangement, when the potential of the input terminal 600 changes to a low level, the PMOS transistor 604 constituting the CMOS inverter circuit 608 is turned ON and a power supply voltage is applied to the base of the NPN bipolar transistor 606 from a power supply terminal 503. As a result, the NPN bipolar transistor 606 is turned ON and the potential of the output terminal 601 goes to a high level. At the same time, a signal output from the CMOS inverter circuit 608 is input to the differentiator circuit 510 to cause the differential circuit 510 to produce a positive pulse which is superimposed on the output signal of the output terminal 601.

On the other hand, when the potential of the input terminal 600 changes to a high level, the NMOS transistor 605 constituting the CMOS inverter circuit 608 is turned ON to make the base potential of the NPN bipolar transistor 606 the low level, further the NMOS transistor 607 is also turned ON and the potential of the output terminal 601 goes to the low level. At the same time, the differentiator circuit 510 receives a signal from the base of the NPN bipolar transistor 606 changing to the low level and produces a negative pulse which is superimposed on the output signal of the output terminal 601, and thus the speed of a signal transmission can be increased.

In this example, since the input signal to the differentiator circuit 510 is directly received from the output of the CMOS inverter circuit 608 constituting the main logic circuit, a logic circuit as that used in the above example, which is connected in series to the differentiator circuit 510 as an input unit for performing the same logic operation as that of the main logic circuit, is not necessary and can be omitted.

Figure 61:
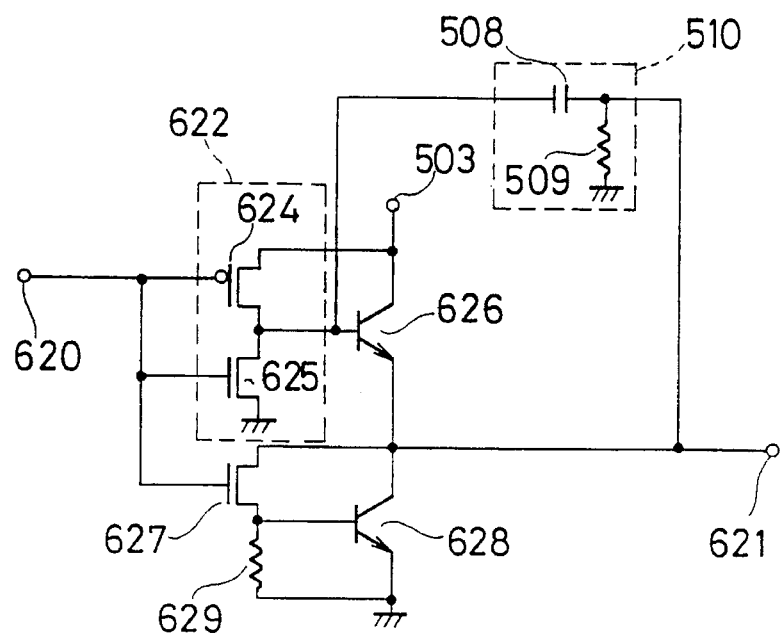
FIG. 61 is a circuit diagram showing a still further example of the inverter circuit to which this invention is applied.

Next, FIG. 61 shows the arrangement of a still further example of the inverter circuit to which the present invention is applied, wherein the same numerals as used in FIG. 60 are used to designate the elements having the same function and operation as those in FIG. 60. This example omits the CMOS inverter circuit 539 from the example shown in FIG. 55 and is different from the arrangement of the example shown in FIG. 60 as follows. That is, an NPN bipolar transistor 628, NMOS transistor 627 and resistor 629 for extracting the base charge of the NPN bipolar transistor 628 are provided in place of the NMOS transistor 607 for causing the potential of the output terminal of the circuit device to go to a low level. The collector of the NPN bipolar transistor 628 is connected to an output terminal 621 and the emitter thereof is connected to a ground terminal; the drain of the NMOS transistor 627 is connected to the output terminal 621, the source thereof is connected to the base of the NPN bipolar transistor 628 and an end of the resistor 629 and the gate thereof is connected to an input terminal; and the other end of the resistor 629 is connected to the ground terminal.

In the above arrangement, when the potential of the input terminal 620 goes to a high level, the NMOS transistor 627 is turned ON and the base potential of the NPN bipolar transistor 628 goes to the high level. As a result, the NPN bipolar transistor 628 is turned ON and the potential of the output terminal 621 goes to a low level.

In this example, the main logic circuit is changed from the BiNMOS circuit to the BiCMOS circuit, and thus the input signal to the differentiator circuit 510 can be extracted from the main logic circuit in the same way as the above example, and a series-connected logic circuit performing the same logic operation as that of the main logic circuit need not be provided as an input unit to the differential circuit 510 and this circuit can be omitted in the same way as the above example.

Figure 62:
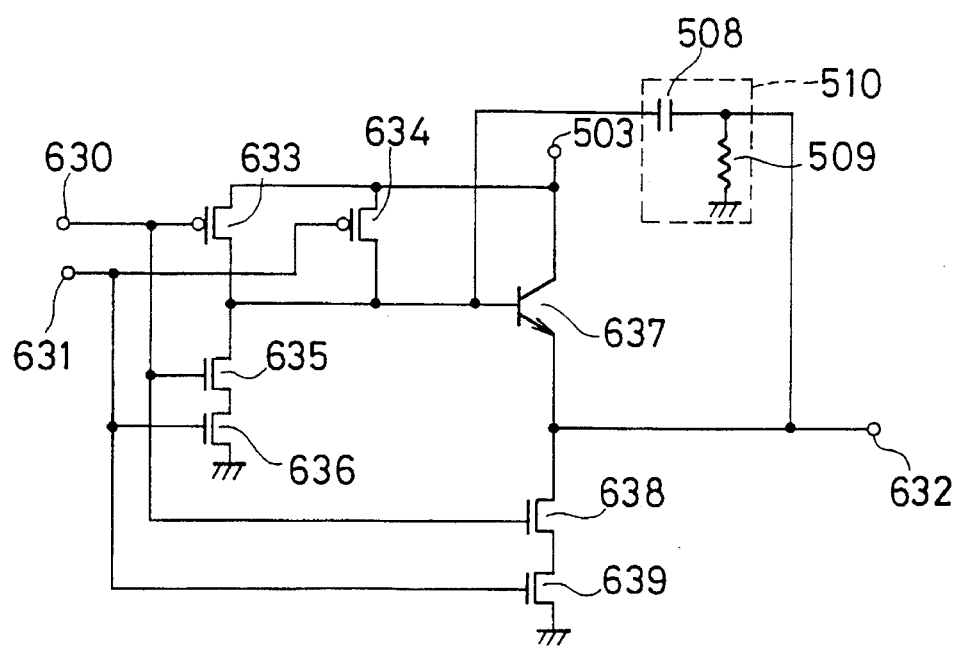
FIG. 62 is a circuit diagram showing the arrangement of another example of the two-input NAND gate circuit to which this invention is applied.

FIG. 62 shows a two-input NAND gate circuit of a still further example which is composed a b BiNMOS. In FIG. 62, numerals 630 and 631 designate input terminals; a numeral 632 designates an output terminal; and numerals 633 and 634 designate PMOS transistors having gates connected to the input terminals 630, 631, sources commonly connected and further connected to a power supply terminal 503, drains connected to the base of an NPN bipolar transistor 637. Further, a numeral 635 is an NMOS transistor having a drain connected to the drain of the PMOS transistor 633 and a gate connected to the input terminal 630; a numeral 636 is an NMOS transistor having a drain connected to the source of the NMOS transistor 635, a gate connected to the input terminal 631 and a source connected to a ground terminal, respectively, a numeral 637 is an NPN bipolar transistor having a collector connected to the power supply terminal 503, a base connected to the drain of the NMOS transistor 635 and an emitter connected to the output terminal 632; a numeral 638 is an NMOS transistor having a drain connected to the output terminal 632 and a gate connected to the input terminal 630, respectively; and a numeral 639 is an NMOS transistor having a drain connected to the source of the NMOS transistor 638, a gate connected to the input terminal 631 and the source connected to the ground terminal, respectively.

Further, a differentiator circuit 510 composed of a capacitor 508 and resistor 509 is connected between the base of the NPN bipolar transistor 637 and the output terminal 632.

The output signal of the output terminal 632 of the main logic circuit constituting the two-input NAND gate circuit goes to a low level only when both input signals of the input terminals 630 and 631 go to a high level, and goes to the high level when a signal other than the above is input. The same logic signal as the output signal of the main logic circuit is obtained at the base point of the NPN bipolar transistor 637, the input signal to the differentiator circuit 510 can be extracted from the interior of the main logic circuit in the same way as the above example, and a series-connected logic circuit performing the same logic operation as that of the main logic circuit need not be provided as an input unit to the differentiator circuit 510 and thus this circuit can be omitted in the same way as the above example.

Figure 63:
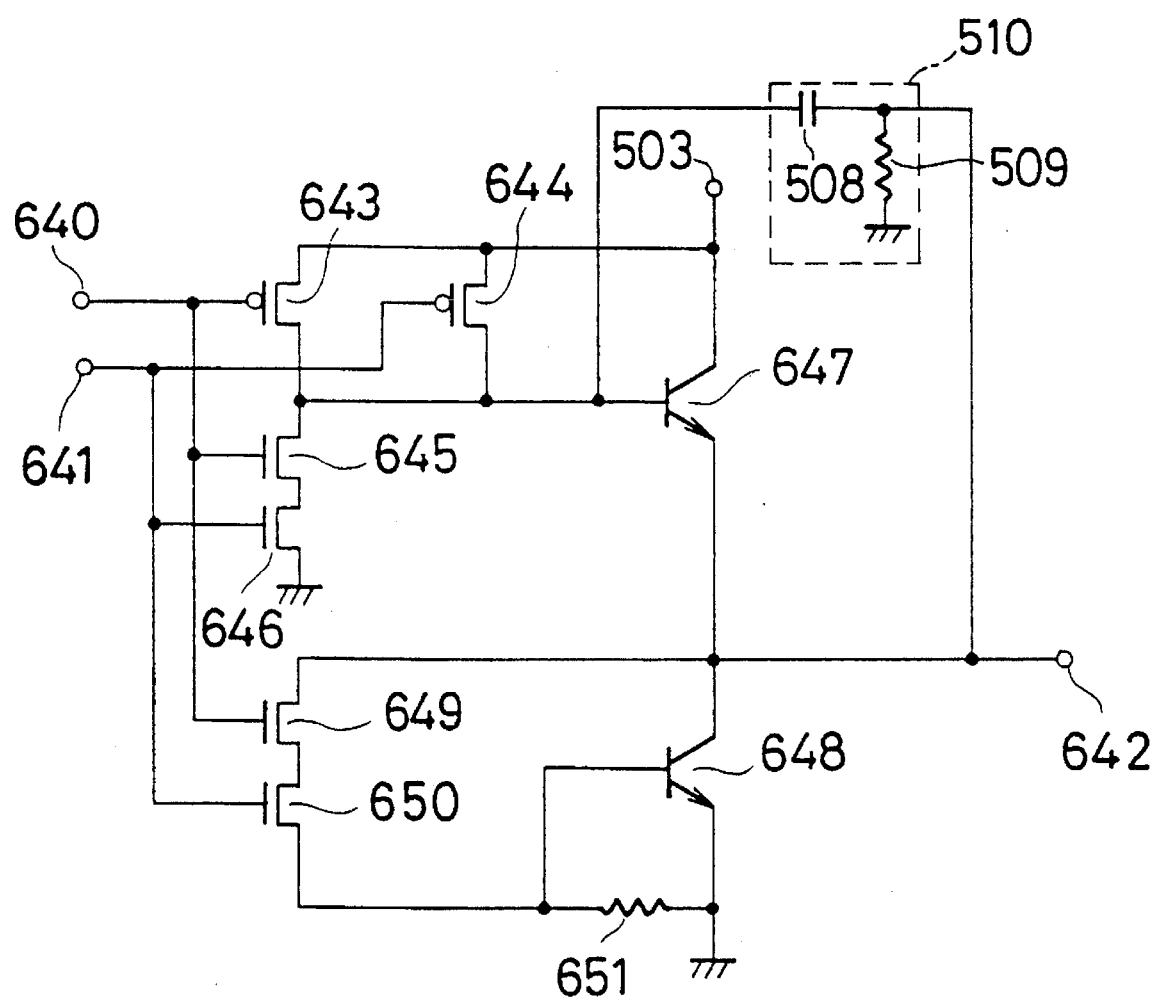
FIG. 63 is a circuit diagram showing the arrangement of a further example of the two-input NAND gate circuit to which this invention is applied.

FIG. 63 shows a still further example of this invention. In the figure, the arrangement of a two-input NAND gate circuit composed of BiCMOS is shown, wherein numerals 640 and 641 designate input terminals; a numeral 642 designates an output terminal; numerals 643 and 644 designate PMOS transistors having sources commonly connected and also connected to a power supply terminal 503, gates connected to the input terminals 640 and 641 and drains connected to the base of an NPN bipolar transistor 647, respectively; a numeral 645 designates an NMOS transistor having a drain connected to the drain of the PMOS transistor 643 and a gate connected to the input terminal 640; and a numeral 646 designates an NMOS transistor having a drain connected to the source of the NMOS transistor 645, a gate connected to the input terminal 641 and a source connected to a ground terminal, respectively.

Further, a numeral 647 designates an NPN bipolar transistor having a collector connected to the power supply terminal 503, a base connected to the drain of the NMOS transistor 645 and an emitter connected to the output terminal 642, respectively; and a numeral 648 designates an NPN bipolar transistor having a collector connected to the output terminal 642, a base connected to the source of an NMOS transistor 650 and an end of a resistor 651 and an emitter connected to the ground terminal, respectively, and the charge extracting resistor 651 is connected between the base and the emitter of the NPN bipolar transistor 648.

Further, a differentiator circuit 510 composed of a capacitor 508 and resistor 509 is connected between the base of the NPN bipolar transistor 647 and the output terminal 642.

In the above arrangement, the potential of the output terminal 642 of a main logic circuit constituting the 2-input NAND gate circuit goes to a low level only when both potentials of the input terminals 641 and 642 goes to a high level, and goes to the high level when a signal other than the above is input. The same logic signal as that of the output signal of the main logic circuit is obtained at the base point of the NPN bipolar transistor 647, the input signal to the differentiator circuit 510 can be extracted from the main logic circuit in the same way as the above example, a logic circuit connected in series as an input unit to the differentiator circuit 510 and performing the same logic operation as the main logic circuit need not be provided, and an effect of omitting the circuit can be obtained in the same way as the above example.

Figure 64:
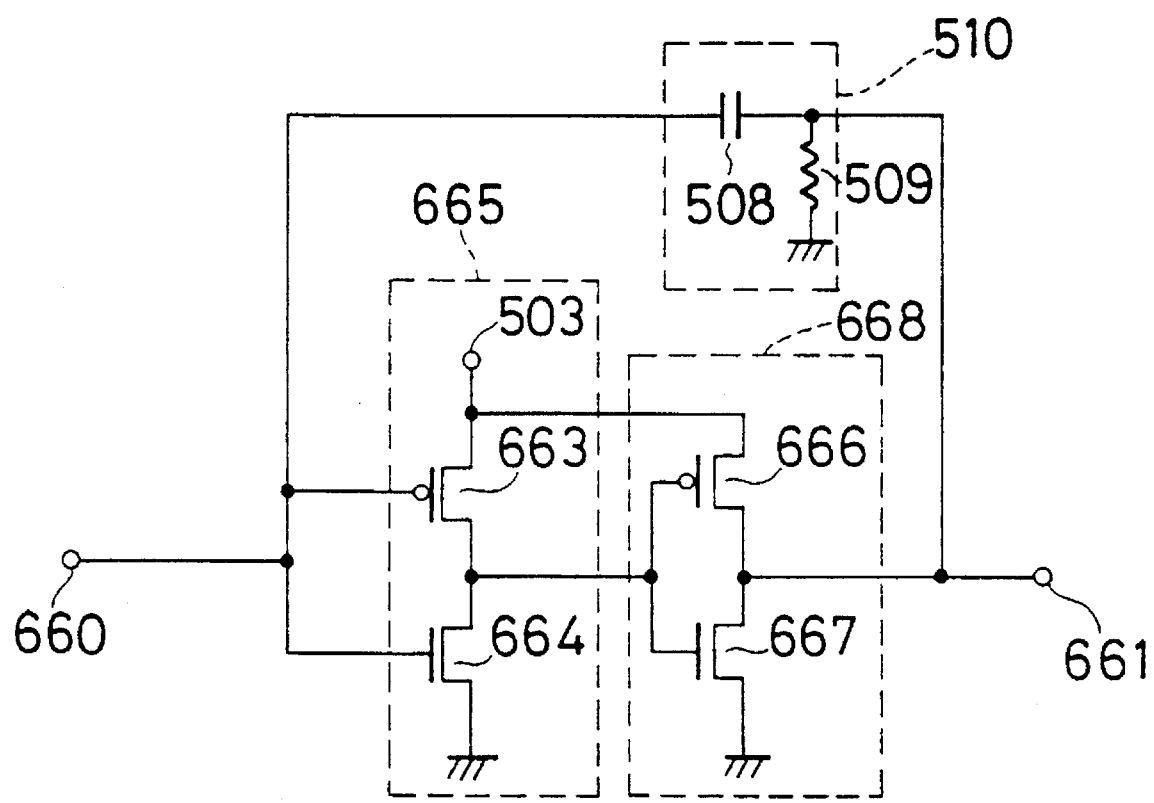
FIG. 64 is a circuit diagram showing the arrangement of an example of a non-inverter circuit to which this invention is applied.

FIG. 64 shows a still further example of this invention. The arrangement of a non-inverter gate is shown in the figure, wherein a numeral 660 designates an input terminal; and a numeral 661 designates an output terminal. A pair of a PMOS transistor 663 and NMOS transistor 664 are connected in series between a power supply terminal 503 and a ground terminal to thereby constitute a first CMOS inverter circuit 665.

Further, the input terminal of a second CMOS inverter circuit 668 performing the same logic operation as that of the first CMOS inverter circuit 665 is connected to the output terminal of the first CMOS inverter circuit 665. The second CMOS inverter circuit 668 is composed of a PMOS transistor 666 and NMOS transistor 667 and has an output terminal connected to the output terminal 661.

Further, a differentiator circuit 510 composed of a capacitor 508 and resistor 509 is connected between the input terminal 660 and the output terminal 661.

In the above arrangement, the potential of the output terminal 661 of a main logic circuit as a buffer gate goes to a high level when the potential of the input terminal 660 is at the high level, and goes to a low level when the potential of the input terminal 660 is at the low level. As a result, the input side of the differentiator circuit 510 can be connected to the input terminal 660 as it is, and thus a logic circuit performing the same logic operation as that of the main logic circuit need not be provided and an effect of omitting the circuit can be obtained in the same way as the above example.

Figure 65:
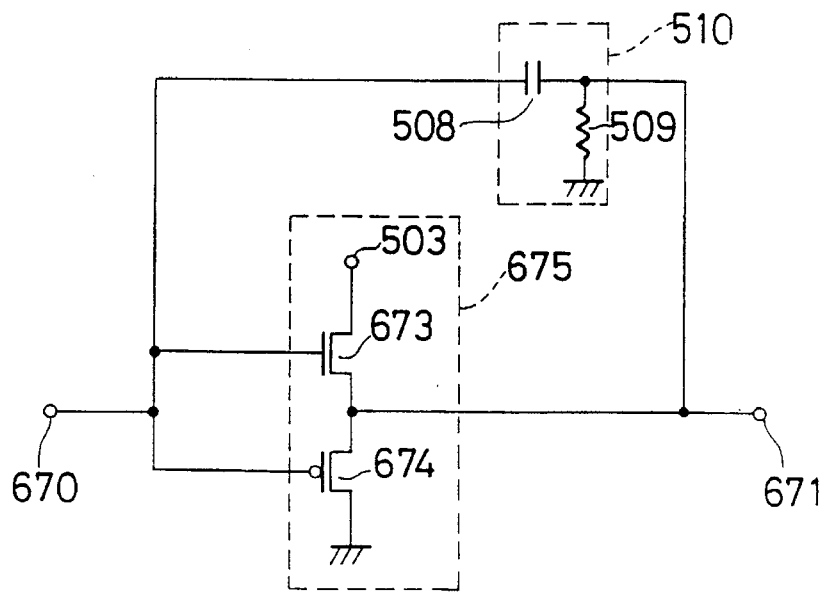
FIG. 65 is a circuit diagram showing the arrangement of another example of the non-inverter circuit to which this invention is applied.

Next, FIG. 65 shows a still further example of this invention. A non-inverter gate arranged as a CMOS circuit is shown in the figure.

In FIG. 65, a numeral 670 designates an input terminal; a numeral 671 designates an output terminal; and a numeral 675 designates a CMOS circuit composed of an NMOS transistor 673 and PMOS transistor 674. Further, a differentiator circuit 510 composed of a capacitor 508 and resistor 509 is connected between the input terminal 670 and the output terminal 671. This example is a buffer gate arranged as the CMOS circuit.

In the above arrangement, the potential of the output terminal 671 of a main logic circuit goes to a high level when the potential of the input terminal 670 is at the high level, and goes to a low level when the potential of the input terminal 670 is at the low level. As a result, the input side of the differentiator circuit 510 can be connected to the input terminal 670 as it is, and thus a logic circuit performing the same logic operation as that of the main logic circuit need not be provided, and an effect of omitting the circuit can be obtained in the same way as the above example.

Figure 66:
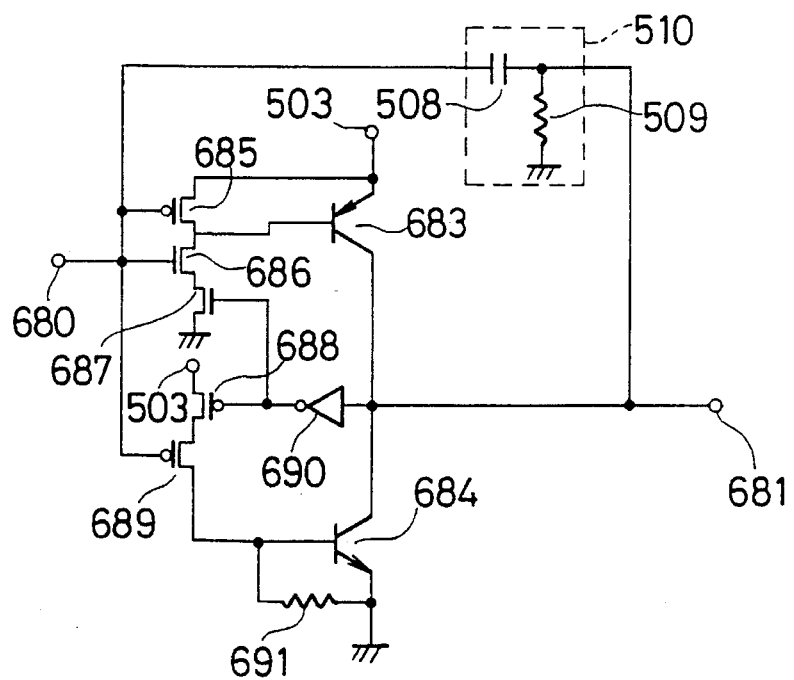
FIG. 66 is a circuit diagram showing the arrangement of a further example of the non-inverter circuit to which this invention is applied.

FIG. 66 shows a still further example of this invention. A non-inverter gate arranged as a BiCMOS type is shown in the figure, wherein a numeral 680 designates an input terminal; a numeral 681 designates an output terminal; a numeral 683 designates a PNP transistor having an emitter connected to a power supply terminal 503 and a collector connected to the output terminal 681; a numeral 684 designates an NPN transistor having a collector connected to the output terminal 681 and an emitter connected to an ground terminal; a numeral 691 designates a base charge extracting resistor connected between the base and the emitter of the NPN transistor 684; a numeral 685 designates a PMOS transistor having a source connected to the power supply terminal 503, a gate connected to the input terminal 680, and a drain connected to the base of the PNP transistor 683, respectively; a numeral 686 designates an NMOS transistor having a drain connected to the drain of the PMOS transistor 685 and a gate connected to the input terminal 680; and a numeral 687 designates and NMOS transistor having a drain connected to the source of the NMOS transistor 686, a gate connected to the output side of an inverter 690 and a source connected to the ground terminal, respectively.

Further, a numeral 688 designates a PMOS transistor having a source connected to a power supply terminal 503 and a gate connected to the output of an inverter 690; a numeral 688 designates a PMOS transistor having a source connected to the drain of the PMOS transistor 688, a gate connected to the input terminal 680, and drain connected to the base of the NPN transistor 684, respectively; and a numeral 681 designates is the inverter.

Further, a differentiator circuit 510 composed of a capacitor 508 and resistor 509 is connected between the input terminal 680 and the output terminal 681.

In the above arrangement, the NMOS transistor 686 is turned ON and the drain potential thereof goes to a low level when the potential of the input terminal 680 is at a high level. As a result, the PNP transistor 683 is turned ON and the potential of the output terminal 681 goes to the high level. At the same time, the signal of the high level is inverted by the inverter 690 and output to the gate of the NMOS transistor 687. As a result, the operating point of the transistor 683 moves from a saturated region to an active region and thus the PNP transistor 683 is prevented from being saturated.

Further, when the potential of the input terminal 680 is at a low level, the PMOS transistor 689 is turned ON and a power supply voltage is applied from the power supply terminal 503 to the base of the NPN transistor 684. As a result, the NPN transistor 684 is turned ON and the potential of the output terminal 681 goes to the low level. At the same time, the signal of the low level is inverted by the inverter 690 and the inverted high level signal is output to the gate of the PMOS transistor 688, and the PMOS transistor 688 is tuned OFF, and thus the NPN transistor 684 is prevented from being saturated.

In this example, the PNP transistor 683 and NPN transistor 684 on the output side are transiently saturated to perform a fully swung operation to operate at a low power supply.

As described above, when the potential of the input terminal 680 is at the high level, the potential of the output terminal 681 of a main logic circuit as buffer gate goes to the high level and it goes to the low level when the potential of the input terminal 680 is at the low level, and thus the input side of the differentiator circuit 510 can be connected to the input terminal 680 as it is, and thus a logic circuit performing the same logic operation as that of the main logic circuit need not be provided and an effect of omitting the circuit can be obtained in the same way as the above example.

Next, an applied example of this invention will be described with reference to FIGS. 67 to 69. FIG. 67 shows the general arrangement of a data processing apparatus, wherein a central processing unit (hereinafter, referred to as CPU) 701, memory 702 for storing data input to the CPU 701 or output therefrom, memory controller 703 and I/O processor 704 are interconnected through a bus line 700. In this data processing apparatus, the CPU 701 taken as an example requires the high speed responsiveness of the respective elements in an integrated circuit device constituting the CPU 701 to perform a calculation at a high speed.

On the other hand, the CPU 701 is divided to several LSI chips, a time for transmitting a signal between the respective LSI chips is greatly delayed and thus the performance of the system is not improved. Further, when the scale of the LSI chip is increased, a power consumption is also required, and thus a low power consumption is also required. Therefore, when the semiconductor integrated circuit devices (logic circuits) according to this invention described with reference to FIGS. 53 to 56 and FIGS. 60 to 66 are applied to a data processing apparatus such as a processor and the like, the data processing apparatus can be arranged by using logic circuits capable of operating at a high speed with a low power supply voltage, whereby a system of high performance can be build.

Figure 68:
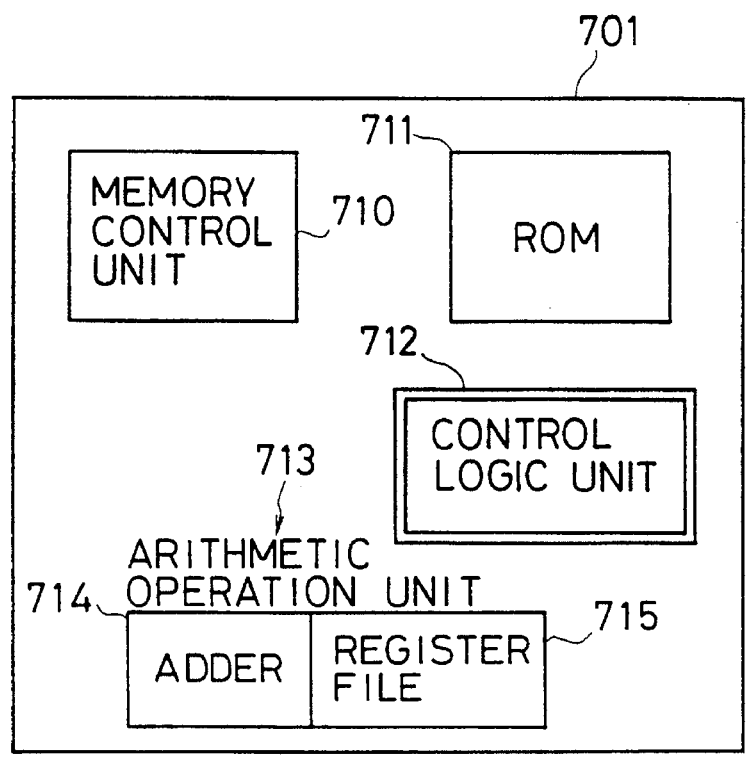
FIG. 68 is a block diagram showing the arrangement of the CPU in FIG. 67.

Next, FIG. 68 shows the specific arrangement of a CPU 701 in FIG. 67. The CPU 701 has a memory control unit 710; read only memory (ROM) 711; control logic unit 712; and arithmetic operation unit 713. The arithmetic operation unit 713 is composed of an adder 714 and register file 715.

The control logic circuit 712 controls the arithmetic operation unit 713 and the memory control unit 710 for controlling an external memory based on an instruction word read from the ROM 711.

Figure 69:
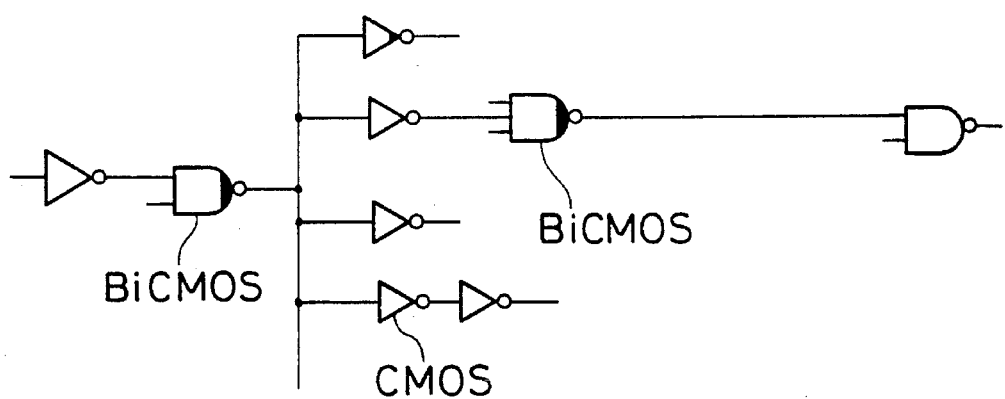
FIG. 69 is a diagram explaining the arrangement example of the control logic unit in FIG. 68.

Next, FIG. 69 shows the arrangement of the control logic unit 712 in FIG. 68. As shown in the figure, the memory control unit 710 and the control logic unit 712 for controlling the arithmetic operation unit 713 are composed of a logic gate circuit such as an inverter circuit, two-input NAND gate circuit and the like. A highly integrated control logic unit operating at a high speed and low power supply voltage with a low power consumption, and a CPU, in turn, can be realized in such a manner that a bus having many fan-outs as heavy load portions and a bus with a long wiring of the logic gate are composed of a BiCMOS gate circuit and the portion thereof with a light load is composed of a CMOS circuit.

Ninth Embodiment (FIG. 70–FIG. 75, FIG. 67– FIG. 69)

Figure 70:
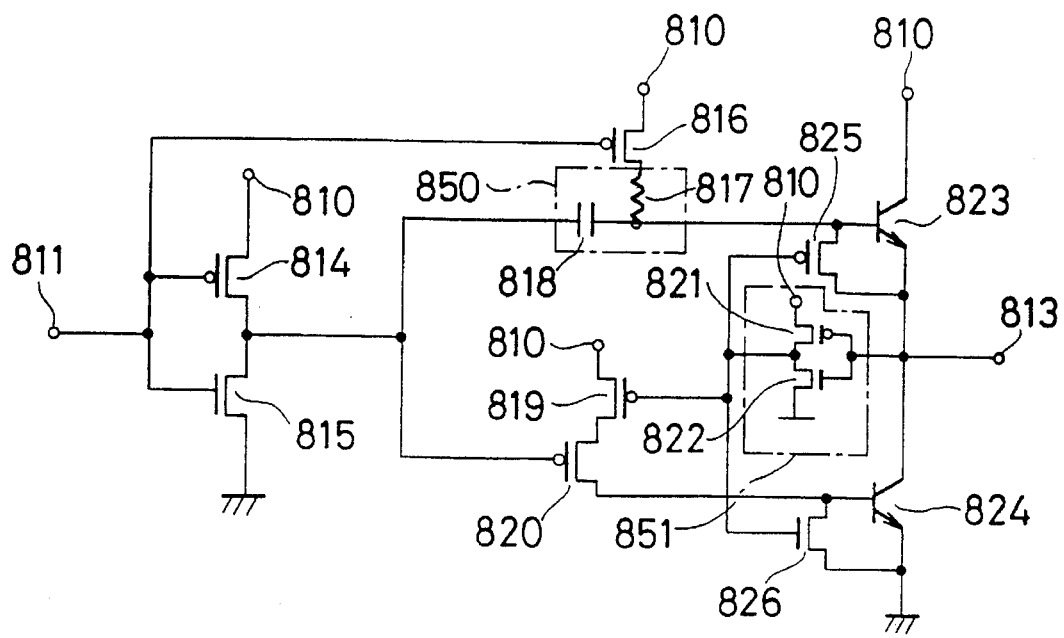
FIG. 70 is a circuit diagram showing the arrangement of an example of an inverter circuit to which this invention is applied.

(9) FIG. 70 shows the arrangement of an inverter circuit to which this invention is applied. In the figure, a numeral 810 designates a power supply terminal; a numeral 811 designates an input terminal; a numeral 813 designates an output terminal; a numeral 814 designates a PMOS transistor having source connected to the power supply terminal 810 and a gate connected to the input terminal 811; a numeral 815 designates an NMOS transistor having a gate connected to the input terminal 811, a source connected to a fixed potential terminal (ground terminal) and a drain connected to the drain of the PMOS transistor 814; a numeral 818 designates a capacitor connected between the drains of the PMOS transistor 814 and NMOS transistor 815 and a resistor 817; a numeral 816 designates a PMOS transistor having a source connected to the power supply terminal 810, a gate connected to the input terminal 811 and a drain connected to the resistor 817; a numeral 823 designates an NPN transistor having a collector connected to the power supply terminal 810, a base connected to the resistor 817 and an emitter connected to the output terminal 813; a numeral 821 designates a PMOS transistor having a source connected to the power supply terminal 810 and a gate connected to output terminal 813; a numeral 822 designates an NMOS transistor having a drain connected to the drain of the PMOS transistor 821, a gate connected to the output terminal 813 and a source to the fixed potential terminal; a numeral 825 designates a PMOS transistor having a source connected to the base of the NPN transistor 823, a gate connected to the drains of the PMOS transistor 821 and NMOS transistor 822 and a drain connected to the emitter of the NPN transistor 823; a numeral 819 designates a PMOS transistor having a source connected to the power supply terminal 810 and a gate connected to the drains of the PMOS transistor 821 and NMOS 822; a numeral 820 designates a PMOS transistor having a source connected to the drain of the PMOS transistor 819 and a gate connected to the drains of the PMOS transistor 814 and NMOS transistor 815; a numeral 824 designates an NPN transistor having a collector connected to the output terminal 813, a base connected to the drain of the PMOS transistor 820 and an emitter connected to the fixed potential terminal; a numeral 826 designates an NMOS transistor having a drain connected to the base of the NPN transistor 824, a gate connected to the drains of the PMOS transistor 821 and NMOS transistor 822 and a source connected to the emitter of the NPN transistor 824.

Next, operation will be described. When the potential of the input terminal 811 changes to an "L" level, the PMOS transistor 814 is turned ON and rises to an "H" level, and the drain potential thereof goes to the voltage of the power supply terminal 810. On receiving the risen input signal, a voltage signal is applied to the base of the NPN transistor 823, the voltage signal being obtained by superimposing a signal output from a differentiator circuit 850 composed of the capacitor 818 and resistor 817 on the potential of the power supply terminal 810 and higher than a power supply voltage. More specifically, an end of the resistor 817 constituting the differentiator circuit 850 is connected to the power supply terminal 810 through the PMOS transistor 816 which is turned ON because the input terminal 811 is at the "L" level, and thus a differentiated signal (or high-pass filtered signal) applied to the base of the NPN transistor 823 has a voltage higher than the potential of the power supply terminal 810 because the differentiated signal is produced and changed based on the potential of the power supply terminal 810.

The NPN transistor 823 is current driven by receiving the differentiated signal and quickly turned ON, and further biased forward because its base potential is higher than its collector potential and advances to a saturated region and can increase the potential of the output terminal 813 to the power supply voltage of the power supply terminal 810 without being lowered by the voltage $V_{BE}$ between the base and the emitter of the bipolar transistor.

Since the differentiated signal applied to the base of the NPN transistor 823 is a pulse determined by the time constant of the capacitor 818 and resistor 817, the base potential higher than the collector potential is returned to the potential of the power supply terminal 810 at once. Further, an inverted delay signal obtained by the inverter 851 composed of the PMOS transistor 821 and NMOS transistor 822, to which the "H" level signal of the output terminal 813 is input, is input to the gate of the PMOS 825, and thus the same potential can be obtained between the base and emitter of the NPN transistor 823. As a result, the NPN transistor 823 is prevented from advancing to the saturated region, no saturation recovery time is required in the level transition in the output terminal 813 and a high speed operation can be achieved.

On the other hand, when the above input terminal 811 is at the "L" level, the PMOS transistor 820 is turned OFF because the PMOS transistor 814 is turned ON and an "H" level signal is applied to its gate. As a result, the NPN transistor 824 is turned OFF. Further, the "H" level signal in the output terminal 813 goes to an "L" level inverted delay signal through the inverter 851 composed of the PMOS transistor 821 and NMOS transistor 822, and thus the PMOS transistor 819 is turned ON and the NMOS transistor 826 is turned OFF. Although the PMOS transistor 819 is turned ON here, since the PMOS transistor 820 connected in series to the PMOS transistor 819 is turned OFF, a power supply voltage is not supplied from the power supply terminal 810 to the base of the NPN transistor 824.

Next, when the input terminal 811 changes to the "H" level, the NMOS transistor 815 is turned ON and the drain thereof goes to the "L" level, and thus the PMOS transistor 820 is turned ON. At this time, the output terminal 813 is still at the "H" level, the "L" level inverted delay signal obtained though the inverter 851 composed of the PMOS transistor 821 and NMOS transistor 822 is input to the gate of the PMOS transistor 819, to thereby turn ON the same. Therefore, the power supply voltage is applied to the base of the NPN transistor 824 from the power supply terminal 810 through the PMOS transistors 819 and 820 so that the NPN transistor 824 is turned ON and the potential of the output terminal 813 is made to the "L" level. As the collector of the NPN transistor 824 approaches to the "L" level, a base potential is higher than a collector potential because a base is at the potential of the power supply terminal 810 and the region between the collector and the base is biased forward and made to a saturated region, and thus the output terminal 813 is completely dropped to the potential of the fixed terminal (ground level).

As the potential of the output terminal 813 approaches to the "L" level from the "H" level, the PMOS transistor 819 is turned OFF by the "H" level inverted delay signal obtained though the inverter 851 composed of the PMOS transistor 821 and NMOS transistor 822 and a drive voltage to be supplied to the base of the NPN transistor 824 is shut off. At the same time, the NMOS transistor 826 is turned ON by the "H" level inverted delay signal and the region between the base and the collector of the NPN transistor 824 leaves from the forward bias state and thus the NPN transistor 824 is prevented from advancing to a saturated region, and thus a time necessary for recovering from the saturated region to an active region can be reduced.

On the other hand, when the input terminal 811 changes to the "H" level, the NMOS transistor 815 is turned ON, the drain of the NMOS transistor 815 changes to the "L" level which is input to the differentiator circuit 850, and a negative differentiated signal is output from the differentiator circuit 850 to the base of the NPN transistor 823 based on the same potential as the power supply voltage of the power supply terminal 810. As a result, the base potential of the NPN transistor 823 is dropped. Since the output terminal 813 is not yet at the "L" level and at the "H" level at this time, the PMOS transistor 825 is turned ON by the inverted delay signal "L" through the PMOS transistor 821 and NMOS transistor 822 and the base of the NPN transistor 823 continues to drop but settles down to the potential higher than the fixed potential by $V_{thp}$. This is effective to enable the base potential of the NPN transistor 823 to obtain a voltage higher than the potential of the power supply terminal 810 though the differentiator circuit when the output terminal 813 changes to the "H" level.

When the output terminal 813 is at the "H" level, the NPN transistor 823 is turned OFF due the short circuit between a base and an emitter, and when the output terminal 813 is at the "L" level, the NPN transistor 824 is turned OFF due the short circuit between a base and an emitter. To obtain a more linear stability, a resistor may be inserted between the drains of the PMOS transistor 814 and NMOS transistor 815 and the output terminal 813.

Further, the resistor of the differentiator circuit may be formed by using the ON resistor of a MOS transistor. Furthermore, the PMOS transistor 825 and NMOS transistor 826 connected between the bases and the emitters of the NPN transistors 823 and 824 may be omitted. These can be applied to the following other examples of this invention.

A logic circuit with a fully swinging output can be realized by the aforesaid and thus a BiCMOS circuit operating even at a low power supply voltage of 1.5 V can be provided.

Figure 71:
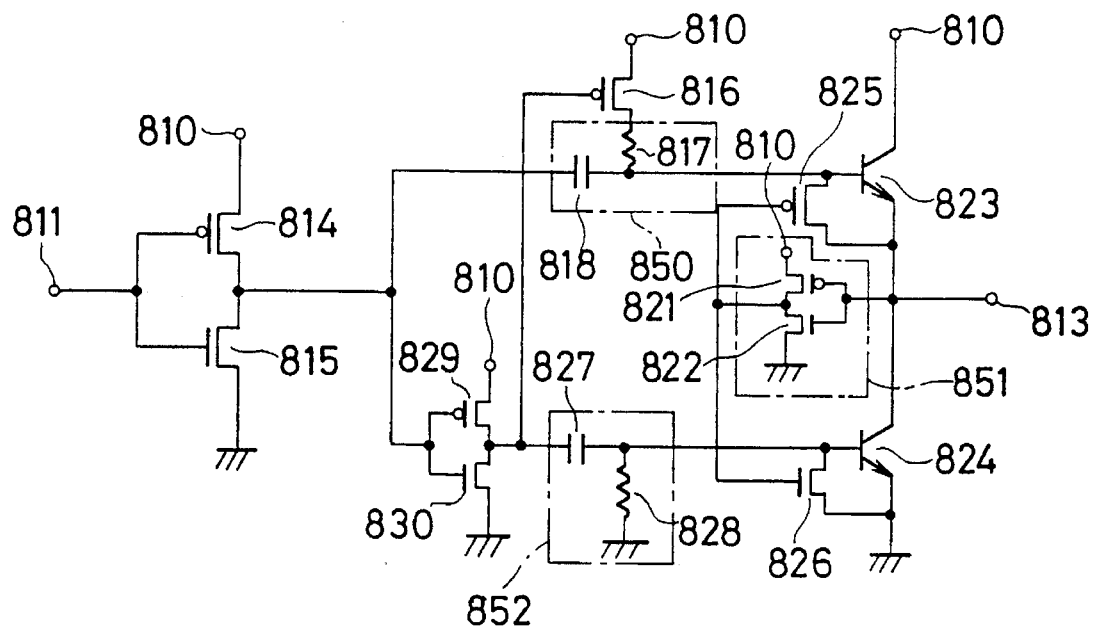
FIG. 71 is a circuit diagram showing the arrangement of another example of an inverter circuit to which this invention is applied.

FIG. 71 shows another example of the inverter circuit to which this invention is applied, wherein the same numerals as used in FIG. 70 are used to designate devices having the same function and operation. The arrangement of the inverter circuit of this example is different from that shown in FIG. 70 in that a base current supply means for the VPN bipolar transistor 824 of an output stage which is turned ON when the output terminal 813 goes to an "L" level is composed of a differentiator circuit in the same way as a base current supply means for the bipolar transistor 823 of an output stage which is turned ON when an output terminal 813 goes to a "H" level, and the gate of a PMOS transistor 816 is connected to a terminal to which a signal having the same phase as that of an input terminal 811 is output, instead of the input terminal 811.

A numeral 829 designates a PMOS transistor having a source connected to a power supply terminal 810 and a gate is connected the drain of a PMOS transistor 814; a numeral 830 designates an NMOS transistor having a drain connected to the drain of a PMOS transistor 829, a gate is connected the gate of the PMOS transistor 829 and a source is connected a fixed potential terminal; a numeral 827 designates a capacitor connected between the drain of the PMOS transistor 829 and a resistor 828; and a numeral 828 designates a resistor connected between the capacitor 827 and the fixed potential terminal. A differentiator circuit 852 is composed of the capacitor 827 and resistor 828.

When the input terminal 811 changes to an "H" level, an NMOS transistor 815 is turned ON and the drain thereof falls to an "L" level and the drain of the PMOS transistor 829 and the drain of an NMOS transistor 830 rise to the "H" level. On receiving the rising signal, the differentiator circuit 852 outputs a quickly rising signal based on a fixed potential to the base of the NPN transistor 824. As a result, the NPN transistor 824 is turned ON and the output terminal 813 transits to the "L" level. At this time, the potential of the output terminal 813 quickly falls down. That is, the base potential of the NPN transistor 824 is quickly risen in response to the pulse signal output from the differentiator circuit 852, and thus the region between the base and the collector of the NPN transistor 824 is in a forward bias state at a moment so that the operating condition of the NPN transistor 824 advances to a saturated region and the output terminal 813 can be completely dropped to the fixed potential (ground level).

Further, when the input terminal 813 changes to the "L" level, the PMOS transistor 814 is turned ON, the drain of the PMOS transistor 814 goes to the "H" level. As a result, the NMOS transistor 830 is turned ON and the drain thereof falls down to the "L" level.

When the differentiator circuit 852 receives this fall-down signal, the output thereof tries to fall down to a value more negative than the fixed potential. Since, however, the "L" level signal before the output terminal 813 goes to the "H" level is inverted by the inverter 851 composed of the PMOS transistor 821 and NMOS transistor 822 and the NMOS transistor 826 is turned ON by receiving the inverted signal by its gate, the negative signal is also absorbed thereby.

On the other hand, when the NMOS transistor 830 is turned ON, the "L" level signal is input to the gate of the PMOS transistor 816. As a result, the PMOS transistor 816 is turned ON and an end of the resistor 817 is at the potential of the power supply terminal 810, and thus a differentiator circuit 850 composed of a capacitor 818 and resistor 817 produces a quickly rising pulse signal.

Note, even if a signal input to the gate of the PMOS transistor 816 is supplied from the drain of the NMOS transistor 830 having the same phase as that of the input terminal 811 as in this example, the differentiator circuit 850 operates to cause its output to rise quickly in the same way as the example shown in FIG. 70.

Figure 72:
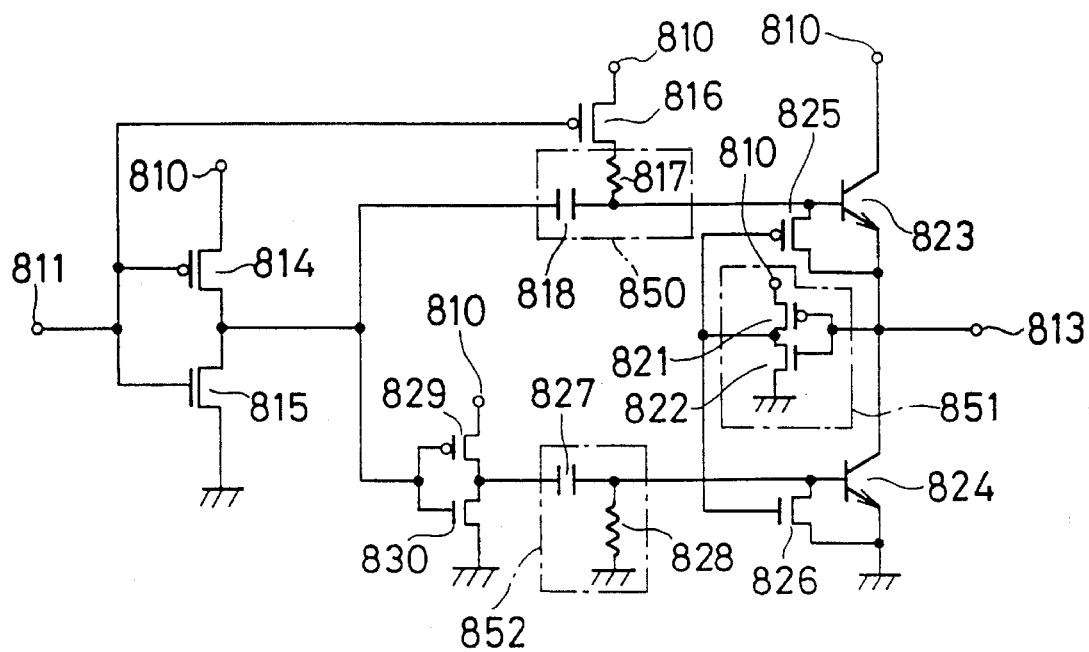
FIG. 72 is a circuit diagram showing the arrangement of a further example of an inverter circuit to which this invention is applied.

FIG. 72 shows a further example of the inverter circuit to which this invention is applied, wherein the same numerals as used in FIG. 71 are used to designate devices having the same function and operation. The arrangement of the inverter circuit of this example is different from that shown in FIG. 71 in that a gate input to a PMOS transistor 816 is supplied from an input terminal 811.

Figure 73:
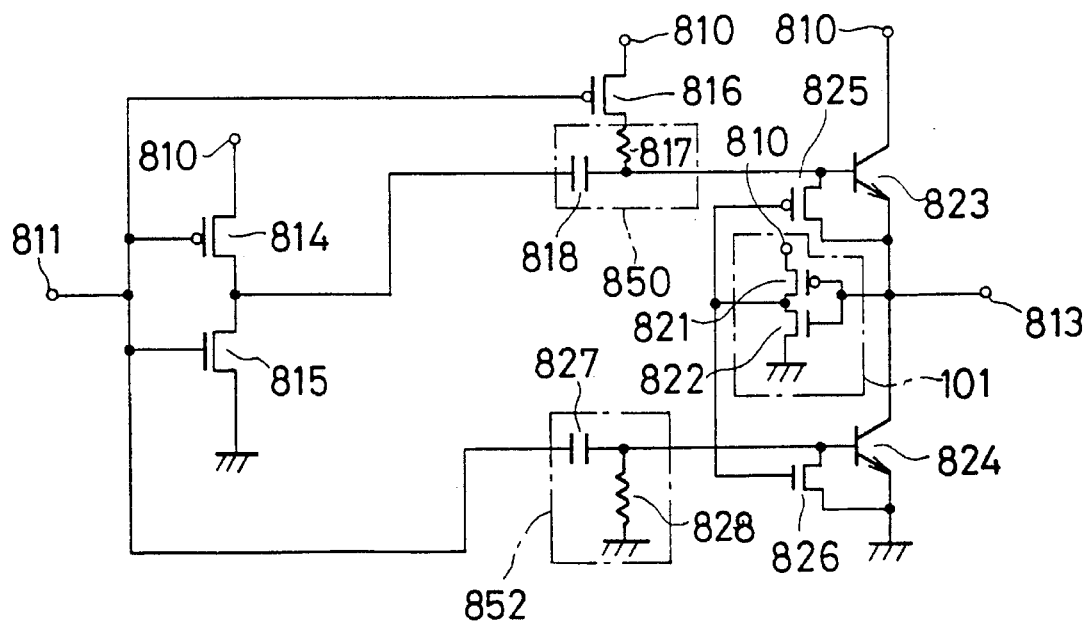
FIG. 73 is a circuit diagram showing the arrangement of a still further example of an inverter circuit to which this invention is applied.

FIG. 73 shows a still further example of the inverter circuit to which this invention is applied, wherein the same numerals as used in FIG. 71 are used to designate devices having the same function and operation. The arrangement of the inverter circuit of this example is different from that shown in FIG. 71 in that a base input to a PMOS transistor 816 is supplied from an input terminal 811 and the PMOS transistor 829 and NMOS transistor 830 used in FIG. 71 are omitted. The inverter circuit of this example can be applied to an inverter logic circuit which is not a multi-input logic.

Even if a differential circuit composed of a capacitor 827 and resistor 828 receives an input from the input terminal 811, it performs the same operation. More specifically, this is because that when the output terminal 813 goes to an "L" level, an "H" level rising signal input to the input terminal 811 goes to the same phase as that of the input signal to the differentiator circuit 852 shown in FIG. 72, and thus an operating speed is rather increased as compared with the example shown in FIG. 72 because the PMOS transistor 829 and NMOS transistor 830 are not used.

Figure 74:
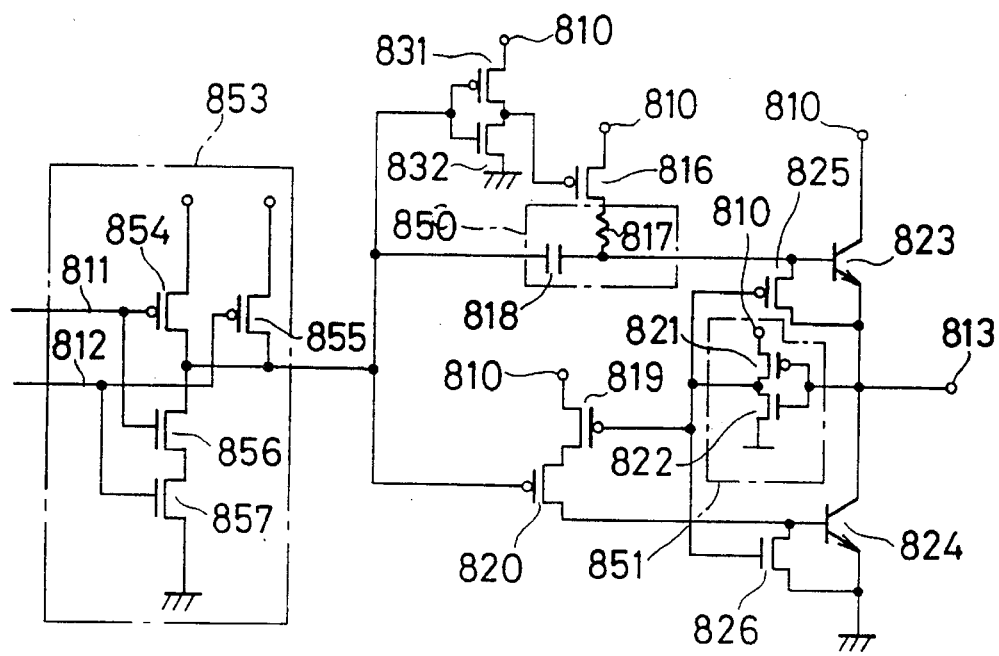
FIG. 74 is a circuit diagram showing the arrangement of an example of an inverter circuit using the two-input NAND gate circuit to which this invention is applied as an input unit.

FIG. 74 shows the circuit arrangement of a still further example of this invention. The arrangement of an inverter circuit using a two-input NAND circuit as an input unit is shown in FIG. 74, wherein the same numerals as used in FIG. 70 are used to designate devices having the same function and operation. The inverter circuit of this example is different from that shown in FIG. 70 in that the two-input NAND circuit composed of a CMOS transistor is used for an inverter input serving as a multi-input, and the gate input to a PMOS transistor 816 is not supplied from an input terminal 811 but from the output of an inverter composed of a PMOS transistor 831 and NMOS transistor 832 from which a signal having the same phase as that of the input terminal 811.

A numeral 854 designates a PMOS transistor having a source connected to a power supply terminal 810 and a gate connected to the input terminal 811; a numeral 855 designates a PMOS transistor having a source connected to the power supply terminal 810 and a gate connected to an input terminal 812; a numeral 856 designates an NMOS transistor having a drain connected to the drain of the PMOS transistor 854 and a gate connected to the input terminal 811; a numeral 857 designates an NMOS transistor having a drain connected to the source of the PMOS transistor 856, a gate connected to the input terminal 812 and a source connected to a fixed potential terminal; a numeral 831 designates a PMOS transistor having a source connected to the power supply terminal 810 and a gate connected to the drain of the PMOS transistor 855; and a numeral 832 designates an NMOS transistor having a drain connected to the drain of the PMOS transistor 831, a gate connected to the drain of the PMOS transistor 855 and a source connected to the fixed potential terminal.

In the above arrangement, when one or both of the input terminals 811 and 812 are at an "L" level, the PMOS transistors 845 or 855 is turned ON, and the output from the two-input NAND circuit 853 composed of the PMOS transistors 854 and 855 and NMOS transistors 856 and 857 goes to an "H" level.

Further, when the input terminals 811 and 812 go to the "H" level at the same time, the NMOS transistors 856 and 857 are turned ON and the output from the two-input NAND circuit 853 goes to the "L" level.

On the other hand, when the output terminal 813 goes to the "H" level, that is, when a rising signal is input to the input terminal of a differentiator circuit 850 from the two-input NAND circuit 853, the PMOS transistor 816 must be turned ON. The "H" level input signal of the differentiator circuit 850 is inverted by the inverter composed of the PMOS transistor 831 and NMOS transistor 832 and the inverted "L" level signal is input to the gate of the PMOS transistor 816. As a result, the PMOS transistor 816 is turned ON. Hereinafter, operation is performed in the same way as that of the inverter circuit shown in FIG. 70.

Figure 75:
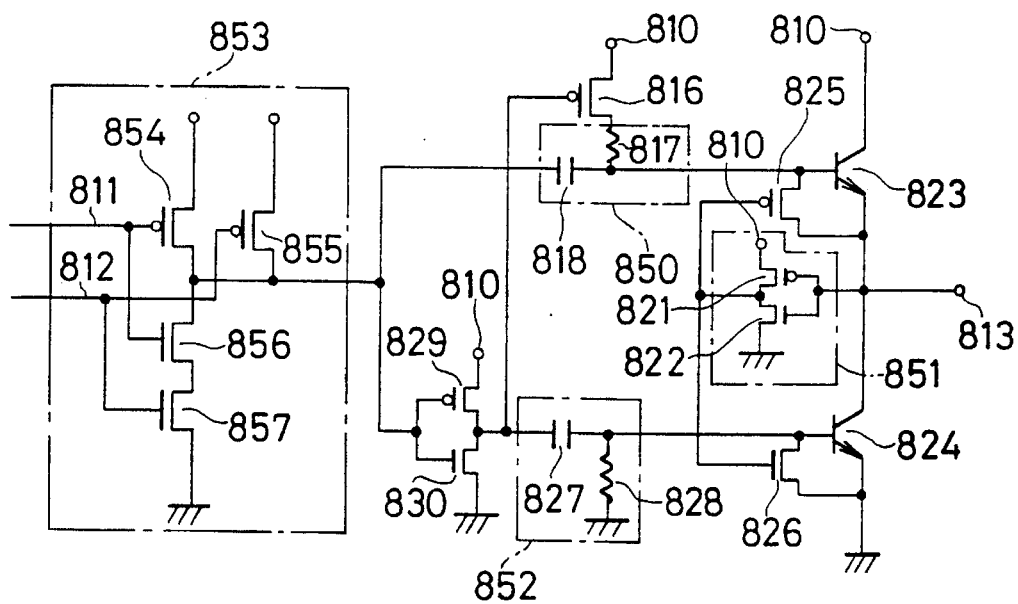
FIG. 75 is a circuit diagram showing the arrangement of another example of an inverter circuit using the two-input NAND gate circuit to which this invention is applied as an input unit.
Figure 76:
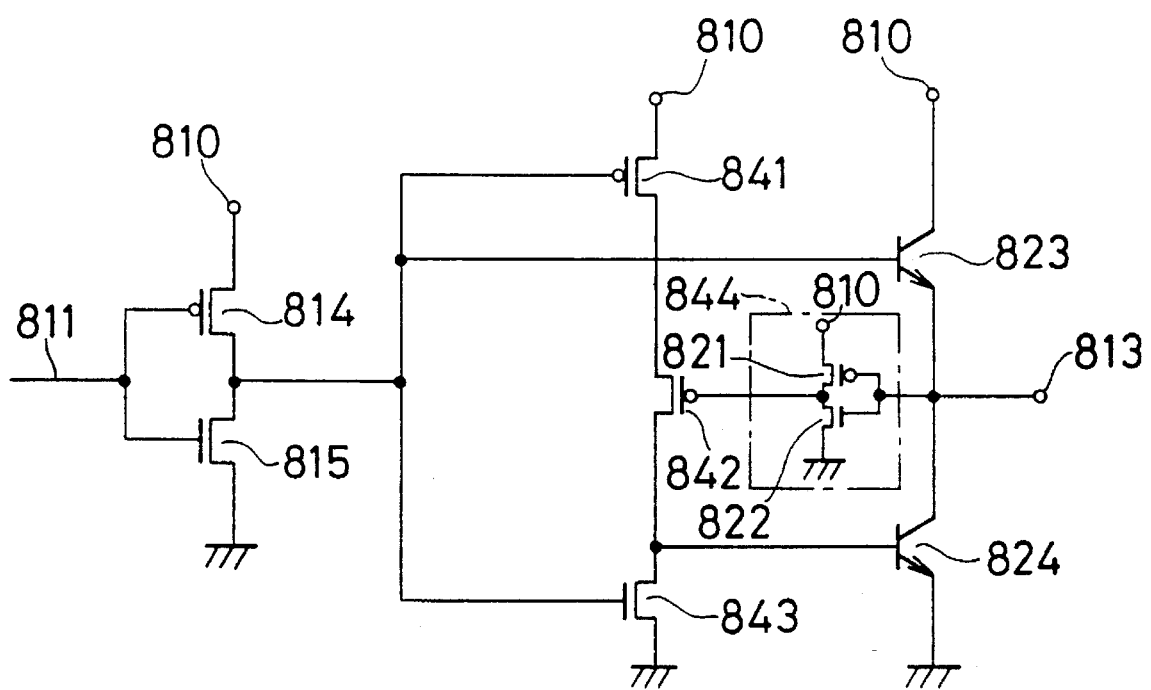
FIG. 76 is a circuit diagram showing the arrangement of a prior art inverter circuit.

Next. FIG. 75 shows the circuit arrangement of a still further example of this invention. The arrangement of an inverter circuit using a two-input NAND circuit as an input unit is shown in FIG. 75, wherein the same numerals as used in FIG. 71 are used to designate devices having the same function and operation. The inverter circuit of this example is different from that shown in FIG. 71 in that the two-input NAND circuit composed of a CMOS transistor is used for an inverter input serving as a multi-input. The operation of the two-input NAND circuit composed of the CMOS transistor serving as the input unit is completely the same as that of the example shown in FIG. 74, and thus the description thereof is omitted.

As described above, a multi-input NAND circuit and multi-input NOR circuit composed of a BiCMOS logic circuit capable of operating at a low power supply voltage according to this invention can be realized only by changing the arrangement of the input unit of the inverter circuit to the arrangement shown in FIGS. 74 and 75.

Next, FIGS. 67 to 69 shows an applied example of this invention. FIG. 67 shows the general arrangement of a computer system, wherein, a memory 702 for storing data input to a central processing unit (hereinafter, referred to as CPU) 701 or output therefrom, memory controller 703 and I/O processor 704 are interconnected through a bus line 700.

In this computer system arranged as described above, the CPU 701 taken as an example requires a high operation speed to perform a calculation at a high speed. Further, when the CPU 701 is arranged by being divided to several LSI chips, a time for transmitting and receiving a signal between the respective LSI chips is greatly delayed and thus the performance of the system is not improved.

When, however, the scale of the LSI chip is increased, a power consumption is also increased, and thus a low power consumption is also required to a semiconductor integrated circuit device. Therefore, when the logic circuits according to the examples described with reference to FIGS. 70 to 75 are applied to a data processing apparatus such as a processor and the like, a system of high performance can be built by using logic circuits capable of operating at a high speed with a low power supply voltage.

FIG. 68 shows the arrangement of the CPU 701 in the applied example of this invention shown in FIG. 67, wherein the CPU 701 is composed of a memory control unit 710, ROM 711, control logic unit 712, and arithmetic operation unit 713.

Further, the arithmetic operation unit 713 includes an adder 714 and register file 715. In the above arrangement, the control logic unit 712 controls the arithmetic control unit 713 and the memory control unit 710 for controlling an external memory in accordance with an instruction word read from the ROM 711.

Next, the arrangement of the control logic unit 712 will be described with reference to FIG. 69, wherein the memory control unit 710 and the control logic unit 712 for controlling the arithmetic operation unit 713 are composed of a logic gate circuit such as an inverter circuit, two-input NAND circuit and the like. A highly integrated control logic unit operating at a high speed and low power supply voltage with a low power consumption, and a CPU in its turn can be realized in such a manner that a bus having many fan-outs as buses for heavy load portions and a bus with a long wiring of the logic gate are composed of a BiCMOS gate circuit and the portion thereof with a light load is composed of a CMOS circuit.

Tenth Embodiment (FIG. 77–FIG. 80 and FIG. 67)

Figure 77:
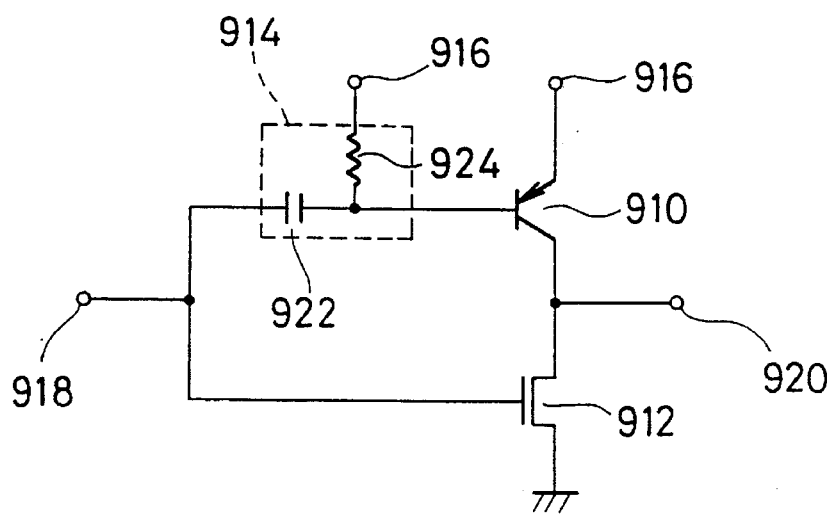
FIG. 77 is a circuit diagram showing the arrangement of an example of a logic circuit according to this invention.

(10) FIG. 77 shows an example in which a BiCMOS circuit is used as an inverter circuit which is composed of a PNP bipolar transistor 910, NMOS transistor 912 and differentiator circuit 914. The PNP bipolar transistor 910 has an emitter connected to a power supply terminal 916, a base connected to an input terminal 918 through the differentiator circuit 914 and a collector connected to an output terminal 920. The NMOS transistor 912 has a gate connected to the input terminal 918, a drain connected to the output terminal 920 and a source connected to a ground as a fixed power supply terminal. Then, a voltage 1.5 V is applied between the power supply terminal 916 and the ground.

The differentiator circuit 914 is composed of a capacitor 922 and resistor 924. An end of the capacitor 922 is connected to the input terminal 918, and end of the resistor 924 is connected to the power supply terminal 916 and the node where the capacitor 922 is connected to the resistor 924 is connected to the base of the transistor 910. The differentiator circuit 914 is arranged as a current supply means such that when a low level signal is input to the input terminal 918, the differentiator circuit 914 produces a negative pulse having a level lower than the potential of the power supply terminal 916 in response to the signal and the negative pulse signal is applied to the base of the transistor 910. More specifically, when a signal changing to a low level is input, the differentiator circuit 914 supplies a base current to the base of the transistor 910 so that the transistor 910 is in a forward bias state between the base and the emitter thereof, and continues the supply of the base current until the transistor 910 changes from a reverse bias state to the forward bias state between the base and the collector thereof, and stops the supply of the base current in response to the disappearance of the negative pulse after the transistor 910 has been saturated.

In the above arrangement, when the high level signal is input to the input terminal 918, the NMOS transistor 912 is turned ON in response to the signal and the output terminal is kept at a low level.

Next, when the signal of the input terminal 918 is inverted from the high level to the low level, the differentiator circuit 914 outputs a negative pulse signal in response to the signal, and thus the base potential of the PNP bipolar transistor 910 drops and the transistor 910 is turned ON, by which the level of the output terminal 920 shifts from the low level to the high level. When the base potential of the transistor 910 drops in this state, the transistor 910 changes from the reverse bias state to the forward bias state between the base and the collector thereof. More specifically, the collector potential of the transistor 910 is higher than the base potential thereof and the transistor 910 is saturated. Then, since the transistor 910 is saturated and the base potential of the transistor 910 is returned to the level of the power supply terminal 916, the transistor 910 leaves the saturated state and thus a high speed can be achieved by omitting a saturation recovery time in transition. That is, the transistor 910 performs a temporarily saturated operation in which it is temporarily in a saturated state in response to the negative pulse signal from the differentiator circuit 914. When the transistor 910 temporarily performs the saturated operation, a collector potential is higher than a base potential and the collector potential is equal to an emitter potential, and thus the level of the output terminal 920 can be risen up to the level of the power supply terminal 916. That is, the output terminal 920 can output a signal fully swung to a power supply voltage.

As described above, according to this example, since the bipolar transistor 910 is temporarily saturated, an inverter circuit capable of being operated by a low power supply voltage (1.5 V) can be realized by a simple circuit arrangement.

Figure 78:
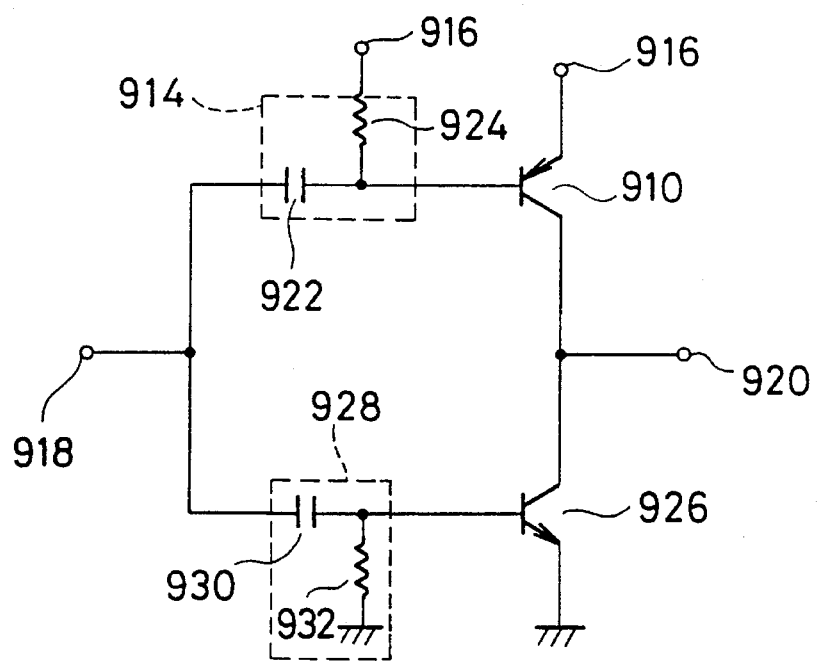
FIG. 78 is a circuit diagram showing the arrangement of another example of a logic circuit according to this invention.

Next, another example of this invention will be described with reference to FIG. 78.

This example uses only bipolar transistors as a transistor, an NPN bipolar transistor 926 in stead of the NMOS transistor 912 used in FIG. 77 and inserts a differentiator circuit 928 between the base of the transistor 926 and an input terminal 918. Since the arrangement of this example other than the above is the same as that shown in FIG. 77, the same devices are designated by the same numerals and the description thereof is omitted.

The differentiator circuit 928 is composed of a capacitor 930 and resistor 932. The differentiator circuit 928 is arranged as a current supply means such that the differentiator circuit 928 produces a positive pulse signal having a potential higher than a fixed potential (the level of a fixed power supply terminal) in response to the high level pulse signal (positive pulse signal) applied to the input terminal 918 and applies this positive pulse signal to the base of the transistor 926. More specifically, when a high level signal is input to the input terminal 918, the differentiator circuit 928 supplies a base current to the base of the transistor 926 so that the transistor 926 is in a forward bias state between the base and the emitter thereof and continues the supply of the base current until the transistor 910 changes from a reverse bias state to the forward bias state between the base and the collector thereof. Then, the differentiator circuit 928 stops the supply of the base current after the transistor 926 has been saturated. With this arrangement, the transistor 926 can temporarily performs a saturated operation in response to the signal from the differentiator circuit 928.

In the above arrangement, when a high level pulse signal is input to the input terminal 918, the differentiator circuit 928 outputs a positive pulse in response to the pulse signal to cause the transistor 926 to be turned ON. With this arrangement, the level of the output terminal 920 changes to a low level. In this process, when the base potential of the transistor 926 is higher than the collector potential thereof, the transistor 926 is saturated, by which the collector of the transistor 926 has the same potential as that of the emitter and the potential of the output terminal 920 is kept at a fixed potential. Then, when the level of the positive pulse drops after the transistor 926 has been saturated, the transistor 926 leaves the saturated state and thus a high speed can be achieved by omitting a saturation recovery time in transition.

Next, when the signal input to the input terminal 918 is inverted from a high level to a low level, the differentiator circuit 914 outputs a negative pulse and the transistor 910 is turned ON, by which the level of the output terminal 920 shifts from the low level to the high level. Then, when the collector potential of the transistor 910 is higher than the base potential thereof in response to the negative pulse, the transistor 910 is saturated and the emitter of the transistor 910 and the collector thereof has the same potential, and the level of the output terminal 920 is kept at the high level. Then, the negative pulse is returned to the level of the power supply terminal 916 after transistor 910 has been saturated, the transistor 910 leaves the saturated state and thus a high speed can be achieved by omitting a saturation recovery time in transition.

According to this example, since the bipolar transistors 910 and 926 are temporarily saturated together, an inverter circuit having active devices composed only of bipolar transistors can be operated by a low power supply voltage and the inverter circuit can be realized by a simple circuit arrangement.

Figure 79:
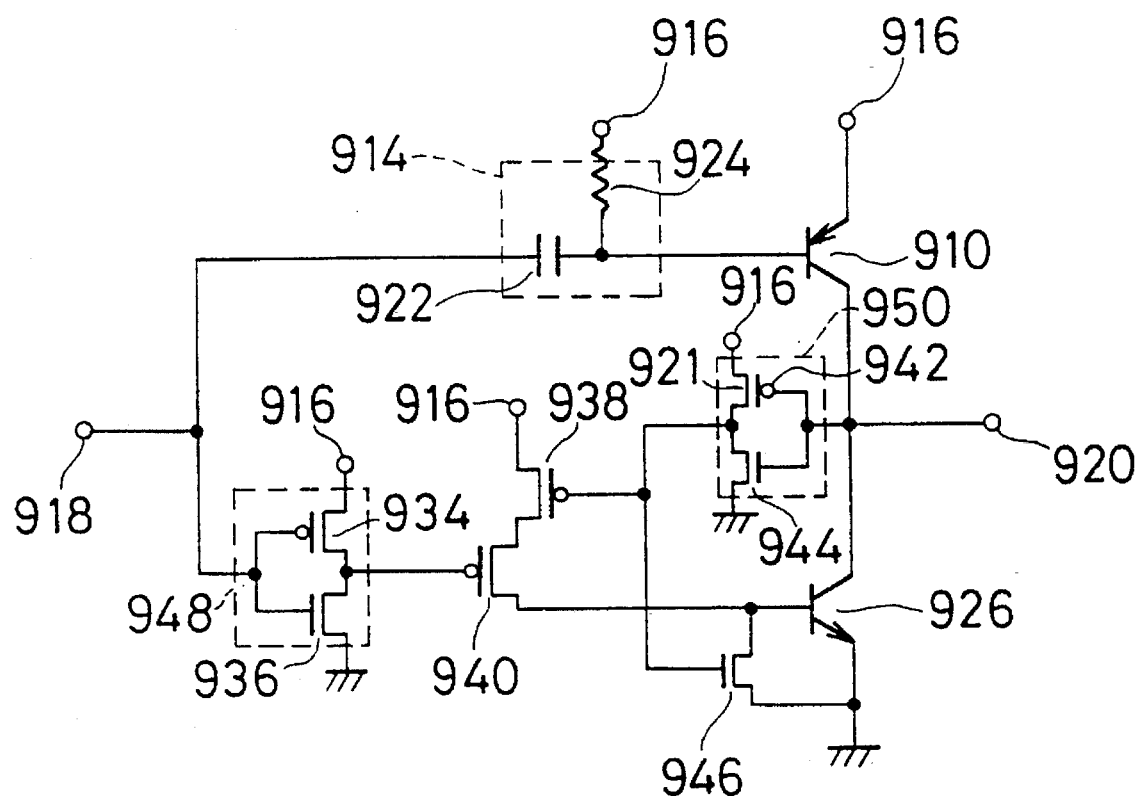
FIG. 79 is a circuit diagram showing the arrangement of a further example of a logic circuit according to this invention.

A further example of this invention will be described with reference to FIG. 79.

This example is composed of a PNP bipolar transistor 910 and NPN bipolar transistor 926 as the transistors operating as an inverter, a negative pulse response differentiator circuit 914 disposed between the transistor 910 and an input terminal 918, and a circuit device for controlling the transistor 926 including a PMOS transistor 934, NMOS transistor 936, PMOS transistors 938 and 940, PMOS transistor 942, NMOS transistor 944, and feedback NMOS transistor 946. The PMOS transistor 934 and NMOS transistor 936 arranged as an inverter circuit 948 has an input connected to the input terminal 918 and an output connected to the gate of the PMOS transistor 940. The PMOS transistor 940 has a drain connected to the base of the transistor 926, the PMOS transistor 938 has a source connected to a power supply terminal 916 and a gate connected to the gate of the NMOS transistor 946, the source of the PMOS transistor 942 and the drain of NMOS transistor 944. The PMOS transistor 942 and NMOS transistor 944 arranged as an inverter circuit 950 has an output connected to the output terminal 920.

In the above arrangement, when a high level signal is input to the input terminal 918, the NMOS transistor 936 and the PMOS transistor 940 are turned ON. When the PMOS transistor 940 is turned ON, the output terminal 920 is at a high level, the output of the inverter circuit 850 is at a low level and the PMOS transistor 938 is turned ON, and thus a voltage is applied from the power supply terminal 916 to the base of the transistor 926 to cause the same to be turned ON, by which the output terminal 920 is inverted from a high level to a low level. Then, when the base potential of the transistor 926 is higher than the collector potential thereof, the transistor 926 is saturated and the level of the output terminal 920 is kept at a fixed potential. Then, when the output terminal 920 is kept at the low level, the inverter circuit 950 is inverted from the low level to the high level to cause the NMOS transistor 946 to be turned ON and the transistor 926 is short circuited between the base and the emitter thereof, by which the base potential of the transistor 926 drops and the transistor 926 leaves the saturated state and thus a high speed can be achieved by omitting a saturation recovery time in transition.

Next, when the signal applied to the input terminal 918 is inverted from the high level to the low level, the differential circuit 914 outputs a negative pulse signal in response to the negative pulse to cause the transistor 910 to be turned ON. When the transistor 910 is turned ON, the output terminal 920 is inverted from the low level to the high level. When the transistor 910 is saturated by the drop of a base potential, the emitter of the transistor 910 has the same potential as that of the collector thereof and the output terminal 920 is kept at the level of the power terminal 916. Then, when the base potential of the transistor 910 returns to the level of power supply terminal 916, the transistor 910 leaves the saturated state.

As described above, according to this example, since the bipolar transistors 910 and 926 are temporarily saturated, an inverter circuit capable of being operated by a low power supply voltage can be realized by a simple circuit arrangement.

Figure 80:
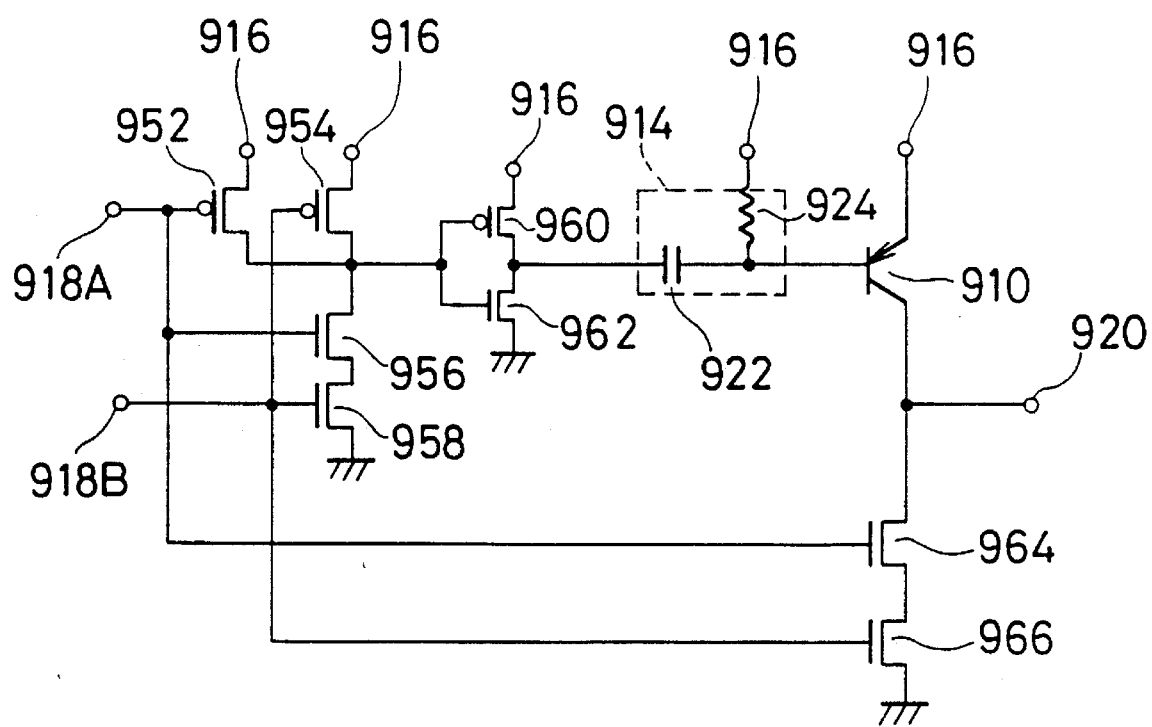
FIG. 80 is a circuit diagram showing the arrangement of a still further example of a logic circuit according to this invention.

Next, a still further example of this invention will be described with reference to FIG. 80.

According to this example, a two-input NAND circuit is composed of a BiCMOS circuit. There are provided a PNP transistor 910 and NMOS transistors 964 and 966 as the transistors operating as an inverter. To control the operation of these transistors, there are provided PMOS transistors 952 and 954, NMOS transistors 956 and 958, PMOS transistor 960, NMOS transistor 962, and negative pulse response differentiator circuit 914.

The PMOS transistors 952 and 954 have gates connected to input terminals 918A and 918B, respectively, sources connected to a power supply terminal 916, respectively, and drains connected to the inputs of the PMOS transistor 960 and NMOS transistor 962 constituting an inverter circuit. The NMOS transistor 956 and 958 have gates connected to the input terminals 918A and 918B, respectively, and the drain of the NMOS transistor 956 is connected to the input of the inverter circuit, and the source of the NMOS transistor 958 is connected to a fixed power supply terminal. Further, the NMOS transistor 964 is connected in series to the NMOS transistor 966 and the gates thereof are connected to the input terminals 918A and 918B, respectively, the drain of the transistor 964 is connected to an output terminal 920, the source of the transistor 966 is connected to the fixed power supply terminal.

The two-input NAND circuit according to this invention is arranged such that when a high level pulse signal is input to both input terminals 918A and 918B, the NMOS transistors 964 and 966 are turned ON and the output terminal 920 goes to a low level. When a low level signal is input to one of the input terminals 918A and 918B and a high level signal is input to the other thereof or the low level pulse signal is input to the respective input terminals 918A and 918B, at least one of the PMOS transistors 952 and 954 is turned ON and the input of the inverter circuit goes to a high level. When the input of the inverter circuit goes to the high level, the output thereof goes to the low level, the differentiator circuit 914 outputs a negative pulse to cause the transistor 910 to be turned ON and the output terminal 920 is inverted to the high level. At this time, the transistor 910 is temporarily operated to be in a saturated state in the same way as the above examples and the output terminal 920 is kept at the level of the fixed terminal.

As described above, according to this example, since the transistor 910 is temporarily operated to be in a saturated state, a two-input NAND gate operated by a low power supply voltage can be arranged and further this circuit can be realized by a simple circuit arrangement.

Next, an applied example of this invention will be described.

This example is a computer system having a CPU 701, memory controller 703, I/O processor 704 and memory 702 and the respective units are interconnected through a bus line 700. The logic circuits used in the respective units are composed of the inverter circuits and the two-input NAND circuits used in the above examples. When the CPU 701 requiring a high speed is divided into several LSI chips in the computer system, a time for transmitting a signal between the respective LSIs is greatly delayed and thus the performance of the system is lowered. Further, when the scale of the LSI is increased, a power consumption is increased, and thus a low power consuming performance is also required. Thus, when the logic circuits of the respective units such as the CPU 701 are composed of the inverter circuit and two-input NAND circuit in the above examples, a system of high performance can be built which can operate at a high speed and a low power supply voltage with a low power consumption.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A semiconductor integrated circuit device including one or more circuits comprising a PNP bipolar transistor, an NPN bipolar transistor, negative pulse response current supply means, a pair of inverter circuits each including a PMOS transistor and an NMOS transistor, a pair of PMOS transistors connected in series to each other, and a feedback NMOS transistor, wherein:

said PNP bipolar transistor has an emitter connected to a power supply terminal, a collector connected to an output terminal and a base connected to an input terminal through said negative pulse response current supply means;

said NPN bipolar transistor has a collector connected to said output terminal, an emitter connected to a fixed power supply terminal having a potential lower than that of said power supply terminal and a base connected to the drain of the PMOS transistor on the low potential side of said pair of PMOS transistors;

one of said pair of the inverter circuits has an input side connected to said input terminal and an output side connected to the gate of said PMOS transistor on the low potential side and the other of said pair of the inverter circuits has an input side connected to said output terminal and an output side connected to the gate of said PMOS transistor on a high potential side and the gate of said feedback NMOS transistor;

said PMOS transistor on the high potential side has a source connected to said power supply terminal;

said feedback NMOS transistor has a drain connected to the base of said NPN bipolar transistor and a source connected to the emitter of said NPN bipolar transistor; and said negative pulse response current supply means includes a circuit element for supplying a base current to the base of said PNP bipolar transistor in response to a negative pulse input signal so that the region between the base and the emitter thereof goes to a forward bias state, continues the supply of the base current until the region between the base and the collector of said PNP bipolar transistor changes from a reverse bias state to the forward bias state, and thereafter stops the supply of the base current.

2. A semiconductor integrated circuit device including one or more circuits comprising a PNP bipolar transistor, negative pulse response current supply means, an inverter circuit including a PMOS transistor and an NMOS transistor, a pair of input NMOS transistors totem-pole series connected with each other, a pair of output NMOS transistors totem-pole series connected with each other, and a pair of input PMOS transistors, wherein:

said PNP bipolar transistor has an emitter connected to a power supply terminal, a collector connected to an output terminal and a base connected to an output side of said inverter circuit through said negative pulse response current supply means;

said inverter circuit has an input side connected to the drains of the respective PMOS transistors;

said respective PMOS transistors have sources connected to said power supply terminal, and gates connected to one of a pair of input terminals, respectively;

the drain of one of said pair of input NMOS transistors is connected to the input side of said inverter circuit and the gate thereof is connected to one of said input terminals, and the source of the other one of said pair of input NMOS transistors is connected to a fixed power supply terminal and the gate thereof is connected to the other input terminal;

the drain of one of said pair of output NMOS transistors is connected to said output terminal and the gate thereof is connected to said one input terminal, and the source of the other one of said pair of output NMOS transistors is connected to said fixed power supply terminal and the gate thereof is connected to said other input terminal; and said negative pulse response current supply means includes a circuit element for supplying a base current to the base of said PNP bipolar transistor in response to a negative pulse input signal so that the region between the base and the emitter thereof goes to a forward bias state, continues the supply of the base current until the region between the base and the collector of said PNP bipolar transistor changes from a reverse bias state to the forward bias state, and thereafter stops the supply of the base current.

* * * * *